(12) United States Patent
Fujii et al.

(10) Patent No.: US 8,642,245 B2
(45) Date of Patent: Feb. 4, 2014

(54) ACTINIC-RAY- OR RADIATION-SENSITIVE RESIN COMPOSITION AND METHOD OF FORMING A PATTERN USING THE SAME

(75) Inventors: Kana Fujii, Shizuoka (JP); Tomotaka Tsuchimura, Shizuoka (JP); Toru Fujimori, Shizuoka (JP); Hidenori Takahashi, Shizuoka (JP); Takayuki Ito, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/421,684

(22) Filed: Mar. 15, 2012

(65) Prior Publication Data

US 2012/0231393 A1 Sep. 13, 2012

Related U.S. Application Data

(63) Continuation of application No. PCT/JP2010/066623, filed on Sep. 16, 2010.

(30) Foreign Application Priority Data

Sep. 16, 2009 (JP) .................. 2009-214948

(51) Int. Cl.
*G03F 7/004* (2006.01)
*G03F 7/30* (2006.01)
*G03F 7/039* (2006.01)

(52) U.S. Cl.
CPC ............ *G03F 7/0392* (2013.01); *G03F 7/0397* (2013.01); *G03F 7/30* (2013.01); *Y10S 430/106* (2013.01); *Y10S 430/111* (2013.01); *Y10S 430/12* (2013.01)
USPC ........ 430/270.1; 430/326; 430/905; 430/910; 430/919

(58) Field of Classification Search
CPC ........ G03F 7/0397; G03F 7/30; G03F 7/0392
USPC ....................... 430/270.1, 326, 910, 919, 905
See application file for complete search history.

(56) References Cited

U.S. PATENT DOCUMENTS

| | | | |
|---|---|---|---|
| 5,916,728 A | 6/1999 | Fukui et al. | |
| 6,274,286 B1 | 8/2001 | Hatakeyama et al. | |
| 6,927,009 B2 * | 8/2005 | Kodama et al. | 430/270.1 |
| 2003/0077540 A1* | 4/2003 | Kodama et al. | 430/270.1 |
| 2005/0227174 A1* | 10/2005 | Hatakeyama et al. | 430/270.1 |
| 2007/0224539 A1 | 9/2007 | Mizutani et al. | |
| 2008/0187860 A1 | 8/2008 | Tsubaki et al. | |
| 2008/0220371 A1 | 9/2008 | Kodama | |
| 2008/0248419 A1 | 10/2008 | Hirano | |

FOREIGN PATENT DOCUMENTS

| | | |
|---|---|---|
| JP | 10-177250 A | 6/1998 |
| JP | 11-084639 A | 3/1999 |
| JP | 2004-361577 A | 12/2004 |
| JP | 2008-065296 A | 3/2008 |
| JP | 2008-203452 A | 9/2008 |
| JP | 2008-257198 A | 10/2008 |
| JP | 2008-268875 A | 11/2008 |
| JP | 2008-292975 A | 12/2008 |

* cited by examiner

*Primary Examiner* — John Chu
(74) *Attorney, Agent, or Firm* — Sughrue Mion, PLLC

(57) ABSTRACT

According to one embodiment, an actinic-ray- or radiation-sensitive resin composition includes a resin that is decomposed when acted on by an acid to thereby increase its solubility in an alkali developer, a compound that generates an acid when exposed to actinic rays or radiation, and any of basic compounds of general formula (1) below.

(1)

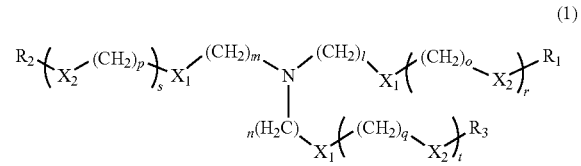

18 Claims, No Drawings

ACTINIC-RAY- OR RADIATION-SENSITIVE RESIN COMPOSITION AND METHOD OF FORMING A PATTERN USING THE SAME

CROSS REFERENCE TO RELATED APPLICATIONS

This application is a Continuation Application of PCT Application No. PCT/JP2010/066623, filed Sep. 16, 2010 and based upon and claiming the benefit of priority from prior Japanese Patent Application No. 2009-214948, filed Sep. 16, 2009, the entire contents of all of which are incorporated herein by reference.

BACKGROUND OF THE INVENTION

1. Field of the Invention

The present invention relates to an actinic-ray- or radiation-sensitive resin composition and a method of forming a pattern using the same. More particularly, the present invention relates to a composition that is suitable for use in an ultramicrolithography process applicable to a process for manufacturing a super-LSI or a high-capacity microchip, a process for fabricating a nanoimprint mold, a process for producing a high-density information recording medium, etc. and other photofabrication processes, and relates to a method of forming a pattern using the same.

In the present invention, the terms "actinic rays" and "radiation" mean, for example, a mercury lamp bright line spectrum, far ultraviolet rays represented by an excimer laser, extreme ultraviolet rays, X-rays, electron beams and the like. In the present invention, the term "light" means actinic rays or radiation.

The expression "exposure" used herein, unless otherwise noted, means not only light irradiation using a mercury lamp, far ultraviolet, X-rays, EUV light, etc. but also lithography using particle beams, such as an electron beam and an ion beam.

2. Description of the Related Art

The photosensitive composition for pattern formation in its typical form contains a compound that generates an acid when exposed to light, and a resin that changes its solubility in a developer when acted on by an acid. When this constitution is employed, the solubility of the composition in a developer can be changed between exposed areas and unexposed areas. That is, in this way, a fine pattern corresponding to the configuration of exposed areas or unexposed areas can be formed with relative easiness.

A basic compound may further be incorporated in this photosensitive composition. For example, patent reference 1 describes using a tertiary amine containing an aliphatic hydroxyl group as such a basic compound. Further, patent reference 2 describes using a tertiary or secondary amine with a specified structure containing an ether group as such a basic compound.

PRIOR ART LITERATURE

Patent Reference

[Patent reference 1] Jpn. Pat. Appln. KOKAI Publication No. (hereinafter referred to as JP-A-) H10-177250, and
[Patent reference 2] JP-A-H11-084639.

BRIEF SUMMARY OF THE INVENTION

It is an object of the present invention to provide an actinic-ray- or radiation-sensitive resin composition excelling in resolving power and iso/dense bias characteristic with which a pattern of desirable configuration can be formed, and further provide a method of forming a pattern using the composition.

Some aspects of the present invention are as follows.

(1) An actinic-ray- or radiation-sensitive resin composition comprising: a resin that is decomposed when acted on by an acid to thereby increase its solubility in an alkali developer, a compound that generates an acid when exposed to actinic rays or radiation, and any of basic compounds of general formula (1) below,

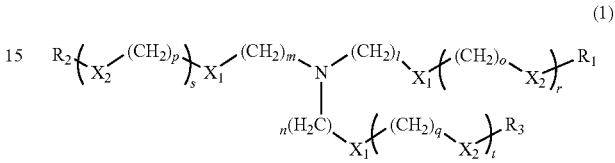

(1)

in which
each of l, m, o, p and q independently is an integer of 1 or greater,
n is an integer of 2 or greater,
each of r and s independently is an integer of 1 or greater,
t is an integer of 0 or greater,
each of $-X_1-$ and $-X_2-$ independently represents $-O-$, $-S-$ or $-CO-$,
each of $R_1$ and $R_2$ independently represents a hydrogen atom, an alkyl group, an aryl group or an aralkyl group, and
$R_3$ represents a hydrogen atom, an alkyl group, an aryl group or an aralkyl group when n is 3 or greater and t is 1 or greater; represents an alkyl group, an aryl group or an aralkyl group when t is 0; and represents an aryl group or an aralkyl group when n is 2.

(2) The composition according to (1), wherein $R_1$ and $R_2$ are hydrogen atoms.

(3) The composition according to (2), wherein $-X_1-$ is $-O-$.

(4) The composition according to (3), wherein $-X_2-$ is $-O-$.

(5) The composition according to any of (1) to (4), wherein the acid generated by the compound is sulfonic acid.

(6) The composition according to (5), wherein the compound that generates the acid is at least one of a diazosulfone compound and a sulfonium salt.

(7) The composition according to any of (1) to (6), wherein the resin contains a repeating unit containing hydroxystyrene.

(8) A resist film formed by the composition according to any of (1) to (7).

(9) A method of forming a pattern, comprising: forming the composition according to any of (1) to (7) into a film, exposing the film, and developing the exposed film.

The present invention has made it feasible to provide an actinic-ray- or radiation-sensitive resin composition excelling in resolving power and iso/dense bias characteristic with which a pattern of desirable configuration can be formed, and further provide a method of forming a pattern using the composition.

DETAILED DESCRIPTION OF THE INVENTION

The present invention will be described below.
Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

The actinic-ray- or radiation-sensitive resin composition according to the present invention comprises [1] a basic compound, [2] a resin that is decomposed to thereby increase its solubility in an alkali developer when acted on by an acid (hereinafter also referred to as an acid-decomposable resin), and [3] a compound that generates an acid when exposed to actinic rays or radiation (hereinafter also referred to as a photoacid generator). These components will be described in order.

[1] Basic Compound

The composition according to the present invention contains any of the basic compounds of general formula (1) below. For example, not only can the resolving power and iso/dense bias characteristic of the composition be enhanced but also a pattern of desirable configuration can be formed by containing the basic compound.

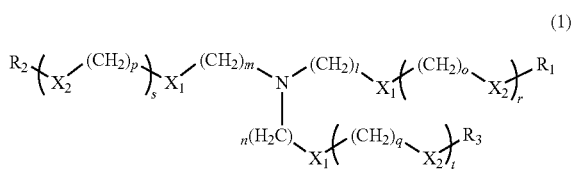

(1)

In the formula, each of l, m, o, p and q independently is an integer of 1 or greater, n is an integer of 2 or greater, each of r and s independently is an integer of 1 or greater, t is an integer of 0 or greater, each of —$X_1$— and —$X_2$— independently represents —O—, —S— or —CO—, each of $R_1$ and $R_2$ independently represents a hydrogen atom, an alkyl group, an aryl group or an aralkyl group, and $R_3$ represents a hydrogen atom, an alkyl group, an aryl group or an aralkyl group when n is 3 or greater and t is 1 or greater; represents an alkyl group, an aryl group or an aralkyl group when t is 0; and represents an aryl group or an aralkyl group when n is 2.

As mentioned above, each of l, m, o, p and q independently is an integer of 1 or greater.

Each of l and m independently is an integer of preferably 1 to 5, more preferably 2 or 3 and most preferably 2.

Each of o, p and q independently is an integer of preferably 1 to 5, more preferably 2 or 3 and most preferably 2.

As mentioned above, n is an integer of 2 or greater. It is preferred for n to be an integer of 2 to 10, especially 2 to 6 and further especially 2 or 3. Most preferably, n is 3.

When n is 0 or 1, the basic compound has low boiling point and low hydrophobicity, and the iso/dense bias characteristic of the composition becomes poor. When n is excessively large, the boiling point and hydrophobicity of the basic compound may become excessively high. Further, when n is excessively large, the steric hindrance around amine nitrogen may increase to such an extent that the nucleophilicity of the basic compound is lowered. Consequently, if so, the iso/dense bias characteristic of the composition may be deteriorated.

As mentioned above, each of r and s independently is an integer of 1 or greater. Each of r and s independently is an integer of preferably 1 to 5, more preferably 1 or 2.

As mentioned above, t is an integer of 0 or greater. It is preferred for t to be an integer of 0 to 5, especially 0 to 2.

As mentioned above, each of —$X_1$— and —$X_2$— independently represents —O—, —S— or —CO—. It is preferred for each of —$X_1$— and —$X_2$— to independently represent —O— or —S—, especially —O—.

As mentioned above, each of $R_1$ and $R_2$ independently represents a hydrogen atom, an alkyl group, an aryl group or an aralkyl group. Preferably, each of $R_1$ and $R_2$ independently represents a hydrogen atom or an alkyl group. A hydrogen atom or a methyl group is more preferred, and a hydrogen atom is most preferred. One or more substituents may further be introduced in these alkyl group, aryl group and aralkyl group.

The alkyl groups represented by $R_1$ and $R_2$ are, for example, a methyl group, an ethyl group, a propyl group, an isopropyl group, an n-butyl group, a sec-butyl group, a hexyl group, a 2-ethylhexyl group, an octyl group or a dodecyl group. Each of the alkyl groups represented by $R_1$ and $R_2$ preferably has 1 to 5 carbon atoms, more preferably 1 to 3 carbon atoms. A methyl group is most preferred.

The aryl groups represented by $R_1$ and $R_2$ are, for example, a phenyl group, a tolyl group, a naphthyl group or an anthryl group. Each of the aryl groups represented by $R_1$ and $R_2$ preferably has 6 to 15 carbon atoms.

The aralkyl groups represented by $R_1$ and $R_2$ are, for example, a benzyl group or a phenethyl group. Each of the aralkyl groups represented by $R_1$ and $R_2$ preferably has 6 to 20 carbon atoms.

As one or more substituents that can be introduced in these alkyl group, aryl group and aralkyl group, there can be mentioned, for example, a hydroxyl group; a halogen atom such as a fluorine, chlorine, bromine or iodine atom; a nitro group; a cyano group; an amido group; a sulfonamido group; an alkyl group, such as a methyl group, an ethyl group, a propyl group, an isopropyl group, an n-butyl group, a sec-butyl group, a hexyl group, a 2-ethylhexyl group, an octyl group or a dodecyl group; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; or a carboxyl group.

When n is 3 or greater and t is 1 or greater, $R_3$ represents a hydrogen atom, an alkyl group, an aryl group or an aralkyl group. This $R_3$ is preferably a hydrogen atom or an alkyl group, more preferably a hydrogen atom or a methyl group. One or more substituents can further be introduced in these alkyl group, aryl group and aralkyl group. As particular examples of the alkyl group, aryl group and aralkyl group represented by $R_3$ and substituents that can further be introduced therein, there can be mentioned, for example, those set forth above in connection with $R_1$ and $R_2$.

When t is 0, $R_3$ represents an alkyl group, an aryl group or an aralkyl group. This $R_3$ is preferably an alkyl group, more preferably a methyl group. One or more substituents can further be introduced in these alkyl group, aryl group and aralkyl group. As particular examples of the alkyl group, aryl group and aralkyl group represented by $R_3$ and substituents that can further be introduced therein, there can be mentioned, for example, those set forth above in connection with $R_1$ and $R_2$.

When n is 2, $R_3$ represents an aryl group or an aralkyl group. One or more substituents can further be introduced in these groups. Namely, in this instance, the basic compound is any of the compounds of general formula (1-Ar) below. When n is 2, if $R_3$ were a hydrogen atom or an alkyl group, the boiling point and hydrophilicity of the basic compound would be low and the iso/dense bias characteristic of the composition would be poor.

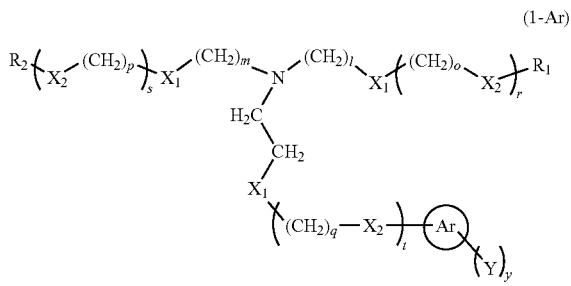

(1-Ar)

In the formula, Ar represents an aryl group or an aralkyl group.

Y represents a monovalent substituent. When y is 2 or greater, two or more Ys may be identical to or different from each other. At least two of these two or more Ys may be bonded to each other to thereby form a ring.

In the formula, y is an integer of 0 to 5.

The definition of each of l, m, o, p, q, r, s, t, $-X_1-$, $-X_2-$, $R_1$ and $R_2$ is the same as mentioned above in connection with general formula (1).

The aryl group represented by Ar preferably has 6 to 30 carbon atoms. As such, there can be mentioned, for example, a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group or an ovalenyl group.

The aralkyl group represented by Ar preferably has 6 to 20 carbon atoms. As such, there can be mentioned, for example, a benzyl group and a phenethyl group.

Ar is preferably an aryl group, more preferably a phenyl group.

Y can be, for example, any of a hydroxyl group; a halogen atom such as a fluorine, chlorine, bromine or iodine atom; a nitro group; a cyano group; an amido group; a sulfonamido group; an alkyl group, such as a methyl group, an ethyl group, a propyl group, an isopropyl group, an n-butyl group, a sec-butyl group, a hexyl group, a 2-ethylhexyl group, an octyl group or a dodecyl group; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group.

Y is preferably an alkoxy group, more preferably a methoxy group. When Ar is a phenyl group, it is preferred for the substitution with Y to take place at the ortho position (namely, 2- and/or 5-position) of the phenyl group.

In the formula, y is preferably 0 to 3, more preferably 1 to 3, and most preferably 2.

Preferred examples of l, m, o, p, q, r, s, t, $-X_1-$, $-X_2-$, $R_1$ and $R_2$ are the same as mentioned above in connection with general formula (1).

When n is 2, namely, when the basic compound is any of those of general formula (1-Ar), it is especially preferred for t to be 2.

Each of the basic compounds of general formula (1) is a tertiary amine in which a group containing $R_1$, a group containing $R_2$ and a group containing $R_3$ are bonded to a nitrogen atom.

The group containing $R_3$ is typically different from the group containing $R_1$ and group containing $R_2$. For example, t is typically smaller than r and s. When n is 3 or greater, n is typically larger than l and m. When n is 2, $R_3$ is typically different from $R_1$ and $R_2$. When this arrangement is employed, for example, the resolving power, iso/dense bias characteristic and pattern configuration can further be enhanced.

In contrast, the group containing $R_1$ and the group containing $R_2$ are typically identical to each other.

As mentioned above, it is preferred for each of $R_1$ and $R_2$ to be a hydrogen atom. It is especially preferred for $R_1$ and $R_2$ to be simultaneously hydrogen atoms. Namely, it is preferred for the basic compound to be any of the compounds of general formula (2) below. General formula (2) includes the structure of general formula (1-Ar) above in which $R_1$ and $R_2$ are simultaneously hydrogen atoms.

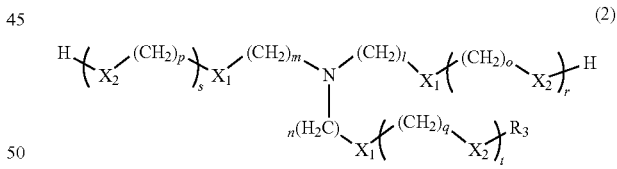

(2)

In the formula, the definition of each of l, m, n, o, p, q, r, s, t, $-X_1-$, $-X_2-$ and $R_3$ is the same as mentioned above in connection with general formula (1). Further, preferred examples thereof are also the same as mentioned above in connection with general formula (1).

For example, the pattern configuration can be enhanced by the employment of this structure.

As mentioned above, it is preferred for $-X_1-$ to be $-O-$. Further preferably, $R_1$ and $R_2$ are simultaneously hydrogen atoms, and $-X_1-$ is $-O-$. Namely, it is further preferred for the basic compound to be any of the compounds of general formula (3) below. General formula (3) includes the structure of above general formula (1-Ar) in which $R_1$ and $R_2$ are simultaneously hydrogen atoms and $-X_1-$ is $-O-$.

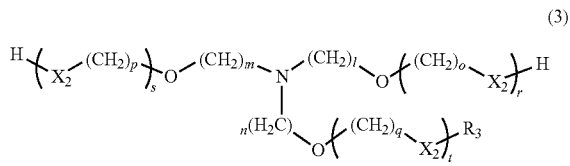

(3)

In the formula, the definition of each of l, m, n, o, p, q, r, s, t, —X$_2$— and R$_3$ is the same as mentioned above in connection with general formula (1). Further, preferred examples thereof are also the same as mentioned above in connection with general formula (1).

For example, the pattern configuration and focus latitude can be enhanced by the employment of this structure.

As mentioned above, it is preferred for —X$_2$— to be —O—. Further preferably, R$_1$ and R$_2$ are simultaneously hydrogen atoms, —X$_1$— is —O—, and —X$_2$— is —O—. Namely, it is further preferred for the basic compound to be any of the compounds of general formula (4) below. General formula (4) includes the structure of above general formula (1-Ar) in which R$_1$ and R$_2$ are simultaneously hydrogen atoms and both of —X$_1$— and —X$_2$— are —O—.

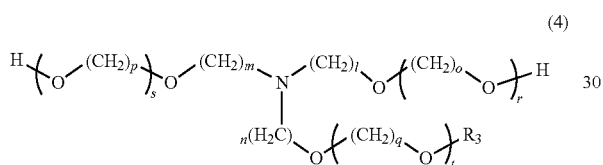

(4)

In the formula, the definition of each of l, m, n, o, p, q, r, s, t and R$_3$ is the same as mentioned above in connection with general formula (1). Further, preferred examples thereof are also the same as mentioned above in connection with general formula (1).

For example, the iso/dense bias characteristic can be enhanced by the employment of this structure.

Nonlimiting examples of the basic compounds of general formula (1) are as follows.

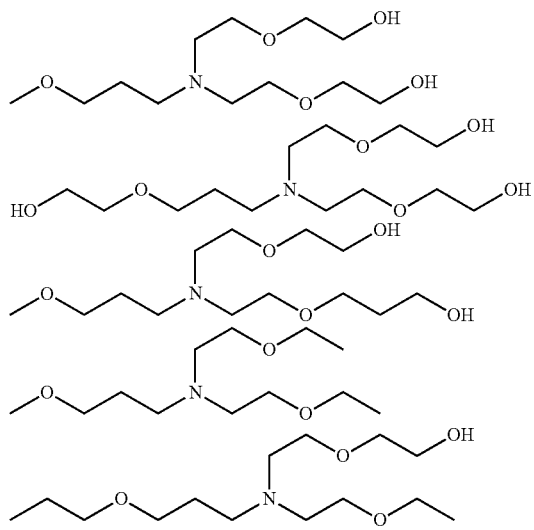

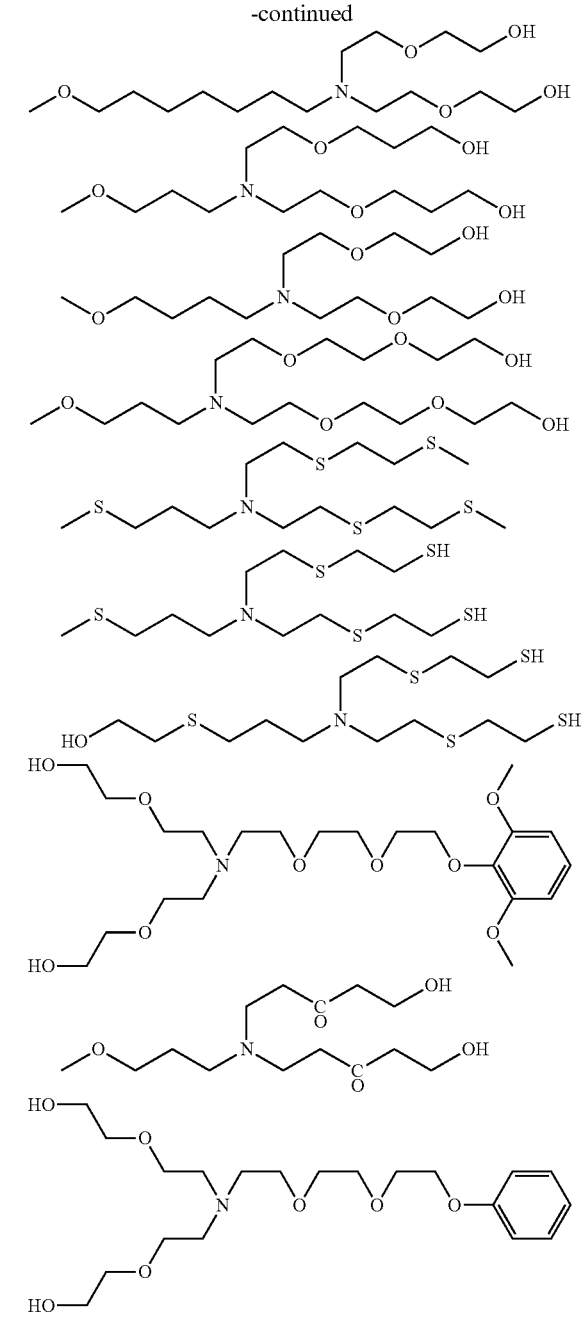

The above-described basic compounds may be used alone or in combination.

The content of basic compounds of general formula (1) based on the total solids of the composition is preferably in the range of 0.01 to 8.0 mass %, more preferably 0.1 to 5.0 mass % and most preferably 0.1 to 4.0 mass %.

The basic compounds of general formula (1) are synthesized in, for example, the following manner.

First, a monoamine containing a R$_3$-bearing group is provided. Subsequently, this monoamine is allowed to react with halides corresponding to a R$_1$-bearing group and a R$_2$-bearing group in an organic solvent in the presence of a base. Thereafter, the obtained salt is separated and purified, thereby obtaining a desired basic compound.

The composition according to the present invention may further contain another basic compound besides the basic compounds of general formula (1). Namely, this composition may further contain a basic compound other than the compounds of general formula (1).

It is preferred for this other basic compound to be a nitrogenous organic compound. The usable basic compounds are not particularly limited. Use can be made of, for example, compounds of categories (1) to (4) below.

(1) Compounds of General Formula (BS-1) Below

(BS-1)

In the general formula (BS-1), each of Rs independently represents a hydrogen atom or an organic group, provided that at least one of three Rs represents an organic group. This organic group is an linear or branched alkyl group, a monocyclic or polycyclic cycloalkyl group, an aryl group, or an aralkyl group. Note that the structure which coincides with the general formula (1) is excluded from the general formula (BS-1).

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

In the compounds represented by the general formula (BS-1), preferably, at least two of Rs are organic groups.

Specific examples of the compounds of the general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline and the like.

In the general formula (BS-1), any of the compounds in which at least one of the Rs is a hydroxylated alkyl group can be mentioned as a preferred form of the compounds. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —CH$_2$CH$_2$O—. As particular examples thereof, there can be mentioned tris(methoxyethoxyethyl)amine, compounds shown by way of example in column 3 line 60 et seq. of U.S. Pat. No. 6,040,112 and the like.

(2) Compound with Nitrogenous Heterocyclic Structure

The heterocyclic structure may optionally have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl)sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]undec-7-ene and the like.

(3) Ammonium Salt

Ammonium salts can also appropriately be used. The ammonium salts are preferably in the form of a hydroxide or carboxylate. In particular, preferred use is made of a tetraalkylammonium hydroxide, such as tetrabutylammonium hydroxide.

(4) As other compounds usable in the composition according to the present invention, there can be mentioned, for example, the compounds synthesized in Examples of JP-A-2002-363146, the compounds (C1-1) to (C3-3) set forth as examples in Paragraph [0066] of US 2007/0224539 A1 and the compounds described in Paragraph 0108 of JP-A-2007-298569.

Further, photosensitive basic compounds may be used as other basic compounds. As photosensitive basic compounds, use can be made of, for example, the compounds described in Jpn. PCT National Publication No. 2003-524799, J. Photopolym. Sci & Tech. Vol. 8, p. 543-553 (1995), etc.

The molecular weight of each of these other basic compounds is preferably in the range of 250 to 2000, more preferably 400 to 1000.

When other basic compounds are further contained, the total amount of basic compounds of general formula (1) and other basic compounds, based on the total solids of the composition, is preferably in the range of 0.01 to 5.0 mass %, more preferably 0.1 to 2.5 mass %.

Further, in this instance, the molar ratio of basic compounds of general formula (1) to other basic compounds is preferably in the range of 90:10 to 20:80, more preferably 90:10 to 50:50.

[2] Acid-Decomposable Resin

The composition according to the present invention contains an acid-decomposable resin. The acid-decomposable resin is a resin that is decomposed when acted on by an acid to thereby increase its solubility in an alkali aqueous solution.

The acid-decomposable resin typically contains a group that is decomposed by the action of an acid to thereby generate an alkali soluble group (hereinafter also referred to as an acid-decomposable group). This resin may contain the acid-decomposable group at either its principal chain or side chain, or both thereof. The resin containing the acid-decomposable group at its side chain is preferred.

The acid-decomposable resin can be obtained by, for example, either allowing a precursor of a group which when acted on by an acid, is cleaved to react with a resin, or copolymerizing an alkali-soluble resin monomer having, bonded thereto, a group which when acted on by an acid, is cleaved with any of various monomers, as disclosed in, for example, European Patent No. 254853 and JP-A's 2-25850, 3-223860 and 4-251259.

The acid-decomposable group is preferably a group as obtained by substituting the hydrogen atom of any of these alkali soluble groups with a group that is cleaved by the action of an acid.

As the group that is cleaved by the action of an acid, there can be mentioned, for example, $-C(R_{36})(R_{37})(R_{38})$, $-C(=O)-O-C(R_{36})(R_{37})(R_{38})$, $-C(R_{01})(R_{02})(OR_{39})$, $-C(R_{01})(R_{02})-C(=O)-O-C(R_{36})(R_{37})(R_{38})$, $-CH(R_{36})(Ar)$ or the like.

In the formulae, each of $R_{36}$ to $R_{39}$ independently represents an alkyl group, a cycloalkyl group, an aryl group, an aralkyl group, or an alkenyl group. $R_{36}$ and $R_{37}$ may be bonded to each other to form a ring. Each of $R_{01}$ and $R_{02}$ independently represents a hydrogen atom, an alkyl group, a cycloalkyl group, an aryl group, an aralkyl group, or an alkenyl group. Ar represents an aryl group.

Each of the alkyl groups represented by $R_{36}$ to $R_{39}$, $R_{01}$ and $R_{02}$ preferably has a carbon number of 1 to 8. For example, there can be mentioned a methyl group, an ethyl group, a propyl group, an n-butyl group, a sec-butyl group, a hexyl group, an octyl group or the like.

The cycloalkyl groups represented by $R_{36}$ to $R_{39}$, $R_{01}$ and $R_{02}$ may be monocyclic or polycyclic. When the cycloalkyl group is monocyclic, it is preferably a cycloalkyl group having 3 to 8 carbon atoms. As such, there can be mentioned, for example, a cyclopropyl group, a cyclobutyl group, a cyclopentyl group, a cyclohexyl group, a cyclooctyl group or the like. When the cycloalkyl group is polycyclic, it is preferably a cycloalkyl groups having 6 to 20 carbon atoms. As such, there can be mentioned, for example, an adamantyl group, a norbornyl group, an isobornyl group, a camphonyl group, a dicyclopentyl group, an α-pinel group, a tricyclodecanyl group, a tetracyclododecyl group, an androstanyl group or the like. With respect to these, the carbon atoms of each of the cycloalkyl groups may be partially substituted with a heteroatom, such as an oxygen atom.

The aryl groups represented by $R_{36}$ to $R_{39}$, $R_{01}$ and $R_{02}$, and Ar each preferably have 6 to 10 carbon atoms. For example, there can be mentioned a phenyl group, a naphthyl group, an anthryl group and the like.

The aralkyl groups represented by $R_{36}$ to $R_{39}$, $R_{01}$ and $R_{02}$ each preferably have 7 to 12 carbon atoms. For example, there can be mentioned a benzyl group, phenethyl group, a naphthylmethyl group and the like.

The alkenyl groups represented by $R_{36}$ to $R_{39}$, $R_{01}$ and $R_{02}$ each preferably have 2 to 8 carbon atoms. For example, there can be mentioned a vinyl group, an allyl group, a butenyl group, a cyclohexenyl group and the like.

The ring formed by mutual bonding of $R_{36}$ and $R_{37}$ may be monocyclic or polycyclic. The monocyclic structure is preferably a cycloalkane structure having 3 to 8 carbon atoms. As such, there can be mentioned, for example, a cyclopropane structure, a cyclobutane structure, a cyclopentane structure, a cyclohexane structure, a cycloheptane structure, a cyclooctane structure or the like. The polycyclic structure is preferably a cycloalkane structure having 6 to 20 carbon atoms. As such, there can be mentioned, for example, an adamantane structure, a norbornane structure, a dicyclopentane structure, a tricyclodecane structure, a tetracyclododecane structure or the like. With respect to these, the carbon atoms of each of the cycloalkane structure may be partially substituted with a heteroatom, such as an oxygen atom.

Each of the groups may have one or more substituents. As the substituent, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group or the like. Preferably, the number of carbon atoms of each of the substituents is up to 8.

The acid-decomposable resin comprises, for example, any of the repeating units of general formula (IA) below.

(IA)

In the formula, each of $R_{01}$ and $R_{02}$ independently represents a hydrogen atom, an alkyl group, a cycloalkyl group, a halogen atom, a cyano group or an alkoxycarbonyl group. $R_{03}$ either represents a hydrogen atom, an alkyl group, a cycloalkyl group, a halogen atom, a cyano group or an alkoxycarbonyl group, or is bonded to the following $Ar_1$ to thereby form a ring structure. $Ar_1$ represents an aromatic ring group. Each of n Y's independently represents a hydrogen atom or a group that is cleaved by the action of an acid, provided that at least one of Y's is a group that is cleaved by the action of an acid. In the formula, n is an integer of 1 to 4, preferably 1 or 2 and more preferably 1.

The alkyl groups represented by $R_{01}$ to $R_{03}$ are, for example, alkyl groups having up to 20 carbon atoms, such as a methyl group, an ethyl group, a propyl group, an isopropyl group, an n-butyl group, a sec-butyl group, a hexyl group, a 2-ethylhexyl group, an octyl group and a dodecyl group. Alkyl groups having up to 8 carbon atoms are preferred. One or more substituents may be introduced in these alkyl groups.

As the alkyl groups contained in the alkoxycarbonyl groups represented by $R_{01}$ to $R_{03}$, there can be mentioned, for example, those set forth above as examples of $R_{01}$ to $R_{03}$.

The cycloalkyl groups represented by $R_{01}$ to $R_{03}$ may be monocyclic or polycyclic. As preferred examples thereof, there can be mentioned monocycloalkyl groups each having 3 to 8 carbon atoms, such as a cyclopropyl group, a cyclopentyl group and a cyclohexyl group. Substituents may be introduced in these cycloalkyl groups.

As the halogen atom, there can be mentioned, for example, a fluorine atom, a chlorine atom, a bromine atom or an iodine atom. A fluorine atom is most preferred.

As the ring structure that can be formed by the mutual bonding of $R_{03}$ and $Ar_1$, there can be mentioned, for example, a 5-membered or 6-membered ring structure.

The aromatic ring group represented by $Ar_1$ preferably has 6 to 14 carbon atoms. In particular, there can be mentioned a benzene ring group, a naphthalene ring group or the like.

As mentioned above, at least one of n Y's is a group that is cleaved by the action of an acid. The group that is cleaved by the action of an acid is, for example, as described above.

The group that is cleaved by the action of an acid preferably has the structure of general formula (IIA) below.

(IIA)

In the formula, each of $L_1$ and $L_2$ independently represents a hydrogen atom, an alkyl group, a cycloalkyl group, an aryl group or an aralkyl group. M represents a single bond or a bivalent connecting group. Q represents an alkyl group, a cycloalkyl group, an alicyclic group, an aromatic ring group, an amino group, an ammonium group, a mercapto group, a cyano group or an aldehyde group. The above alicyclic group and aromatic ring group may contain heteroatoms. At least two of Q, M and $L_1$ may be bonded to each other to thereby form a 5-membered or 6-membered ring.

The alkyl groups represented by $L_1$ and $L_2$ are, for example, alkyl groups each having 1 to 8 carbon atoms. As particular examples thereof, there can be mentioned a methyl group, an ethyl group, a propyl group, an n-butyl group, a sec-butyl group, a hexyl group and an octyl group.

The cycloalkyl groups represented by $L_1$ and $L_2$ are, for example, cycloalkyl groups having 3 to 15 carbon atoms. As particular examples thereof, there can be mentioned a cyclopentyl group, a cyclohexyl group, a norbornyl group and an adamantyl group.

The aryl groups represented by $L_1$ and $L_2$ are, for example, aryl groups having 6 to 15 carbon atoms. As particular examples thereof, there can be mentioned a phenyl group, a tolyl group, a naphthyl group and an anthryl group.

The aralkyl groups represented by $L_1$ and $L_2$ are, for example, aralkyl groups having 6 to 20 carbon atoms. As particular examples thereof, there can be mentioned a benzyl group and a phenethyl group.

The bivalent connecting group represented by M is, for example, an alkylene group (preferably a methylene group, an ethylene group, a propylene group, a butylene group, a hexylene group or an octylene group), a cycloalkylene group (preferably a cyclopentylene group or a cyclohexylene group), an alkenylene group (preferably an ethylene group, a propenylene group or a butenylene group), an arylene group (preferably a phenylene group, a tolylene group or a naphthylene group), —S—, —O—, —CO—, —SO$_2$—, —N(R$_0$)— or a bivalent connecting group resulting from combination of two or more of these groups. $R_0$ represents a hydrogen atom or an alkyl group. The alkyl group represented by $R_0$ is, for example, an alkyl group having 1 to 8 carbon atoms. As particular examples thereof, there can be mentioned a methyl group, an ethyl group, a propyl group, an n-butyl group, a sec-butyl group, a hexyl group and an octyl group.

The alkyl group and cycloalkyl group represented by Q are, for example, the same as those mentioned above as $L_1$ and $L_2$.

As the alicyclic group and aromatic ring group represented by Q, there can be mentioned, for example, the cycloalkyl group and aryl group mentioned above as $L_1$ and $L_2$. Preferably, each of the cycloalkyl group and aryl group has 3 to 15 carbon atoms.

As the alicyclic group and aromatic ring group each containing a heteroatom represented by Q, there can be mentioned, for example, groups having a heterocyclic structure, such as thiirane, cyclothiorane, thiophene, furan, pyrrole, benzothiophene, benzofuran, benzopyrrole, triazine, imidazole, benzimidazole, triazole, thiadiazole, thiazole or pyrrolidone. However, the alicyclic groups and aromatic ring groups are not limited to these as long as the ring is formed by carbon and a heteroatom or by heteroatoms only.

As the ring structure that can be formed by the mutual bonding of at least two of Q, M and $L_1$, there can be mentioned, for example, a 5-membered or 6-membered ring structure resulting from the formation of a propylene group or a butylene group thereby.

Substituents may further be introduced in the atomic groups of general formulae (IA) and (IIA). As the substituents, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. Preferably, each of these substituents has 8 or less carbon atoms.

The groups of the formula -(M-Q) are preferably groups having 1 to 30 carbon atoms, more preferably groups having 5 to 20 carbon atoms.

Specific examples of the repeating units of general formula (IA) will be shown below, which are nonlimiting.

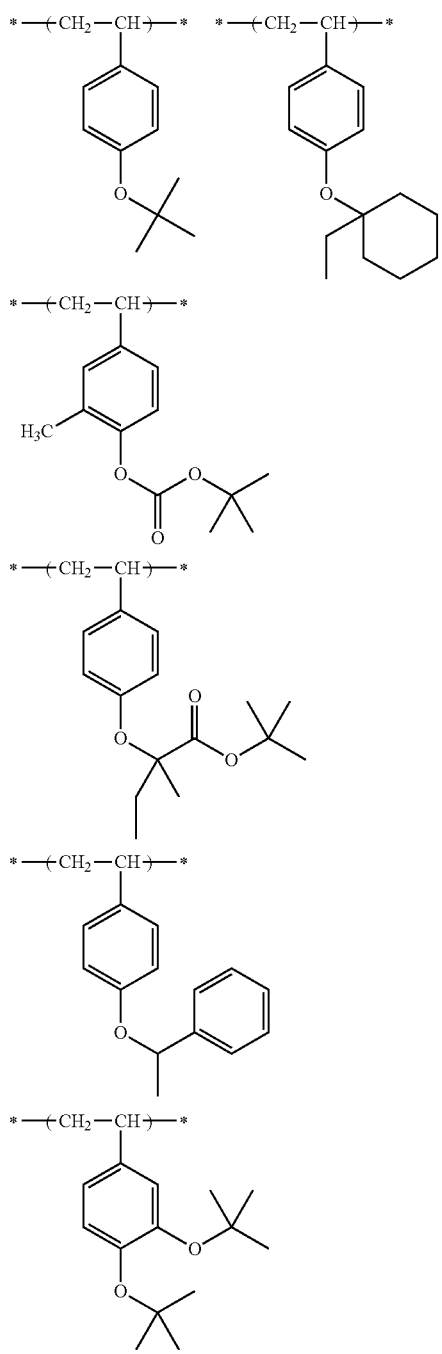

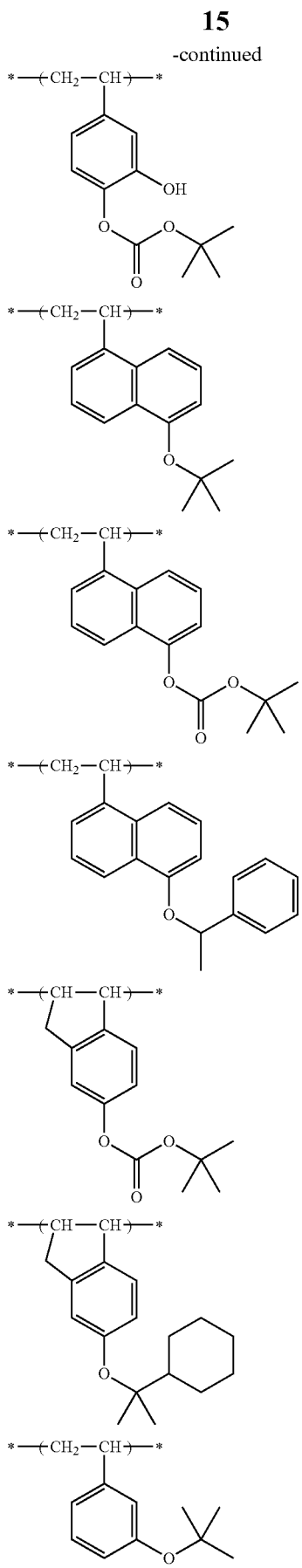
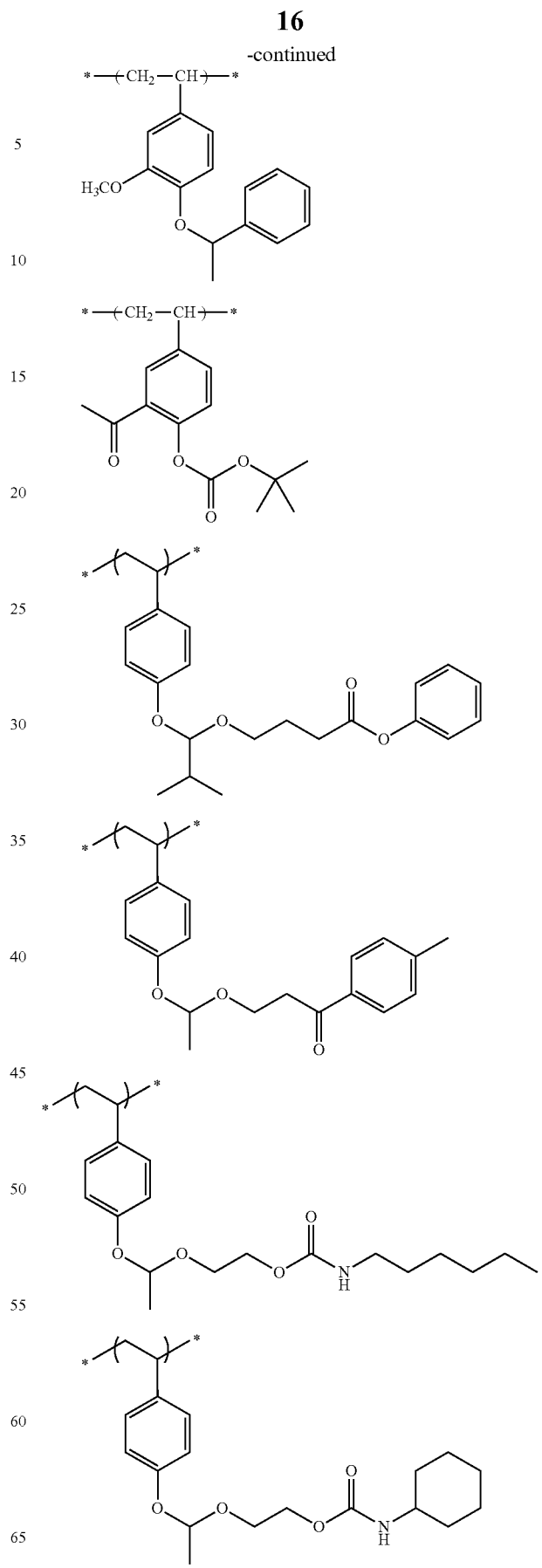

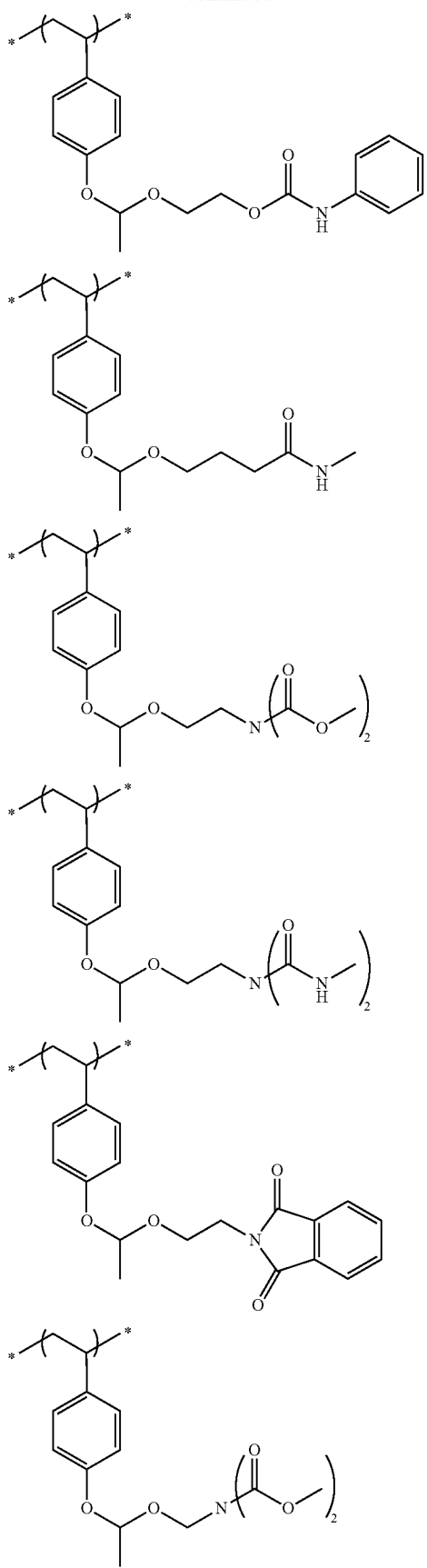
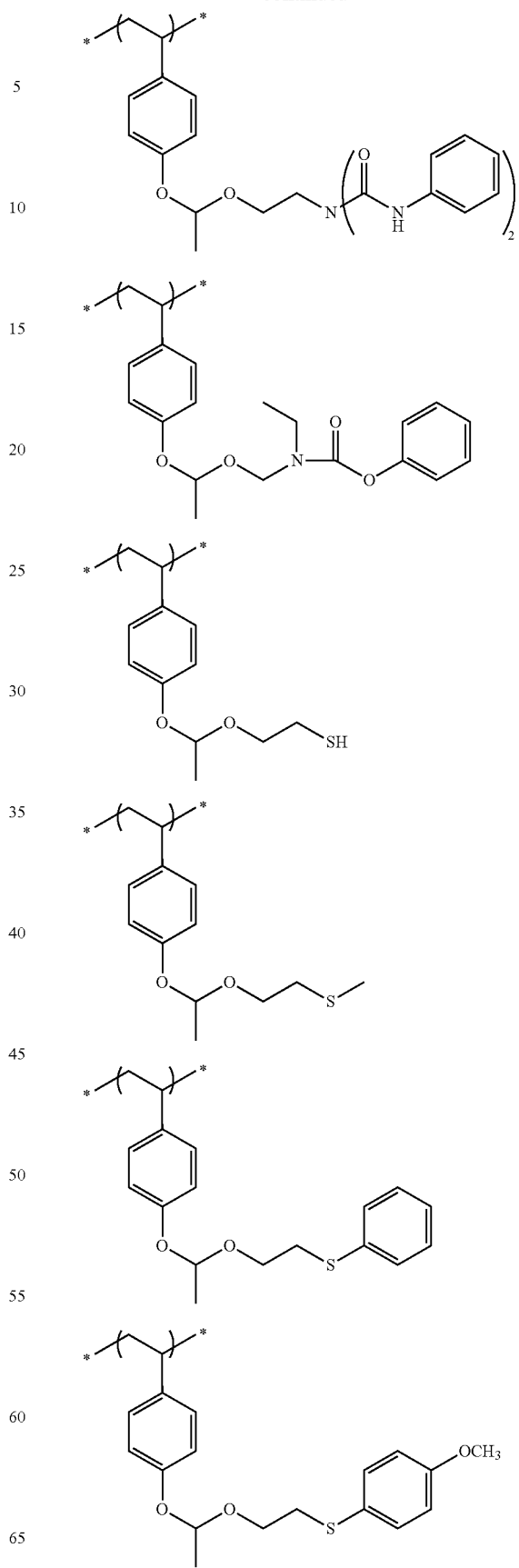

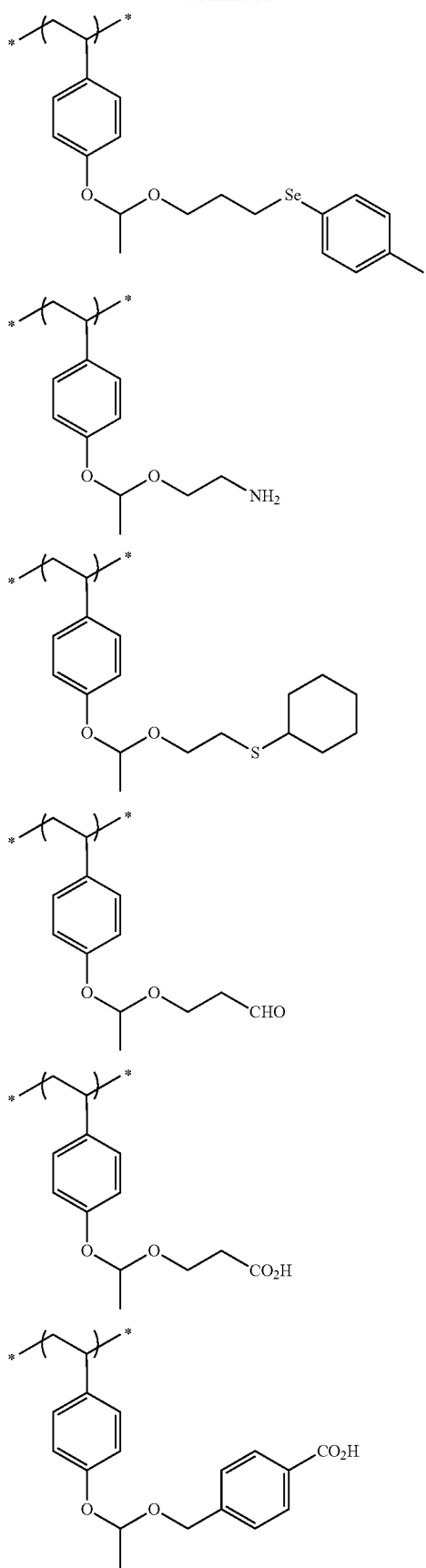
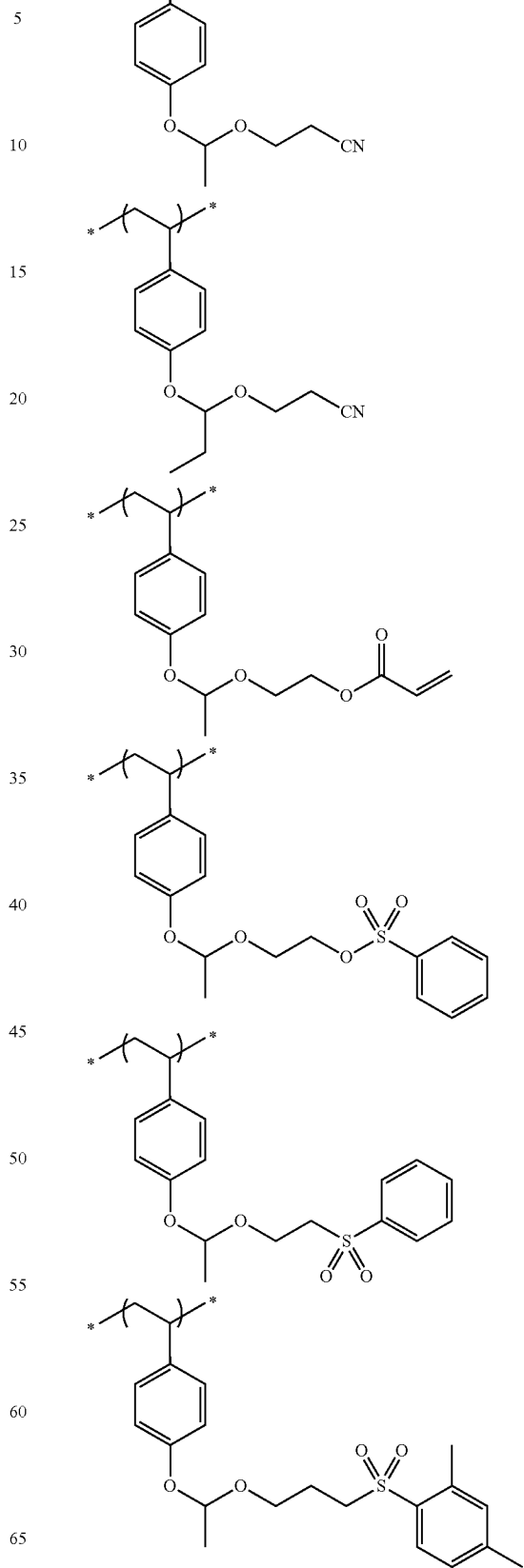

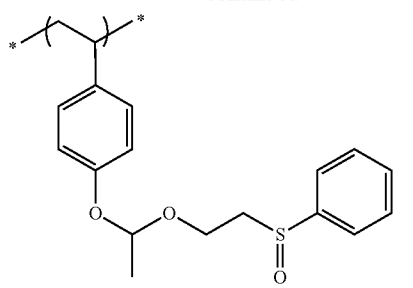
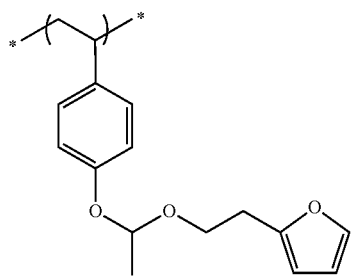
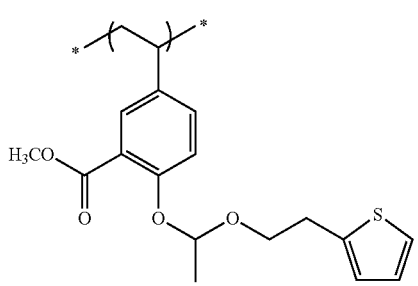
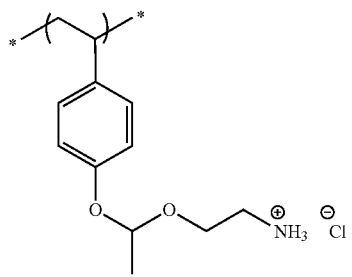
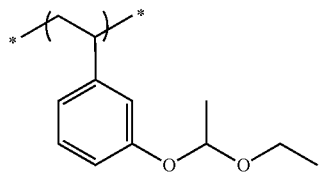
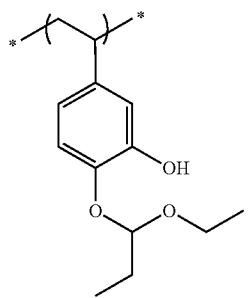
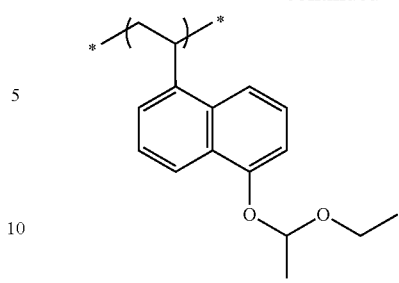
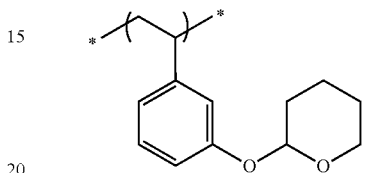
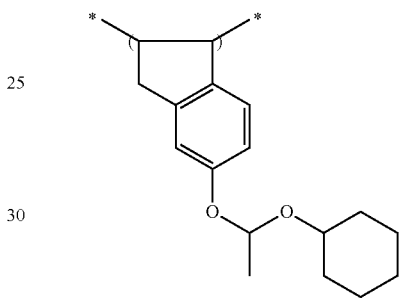
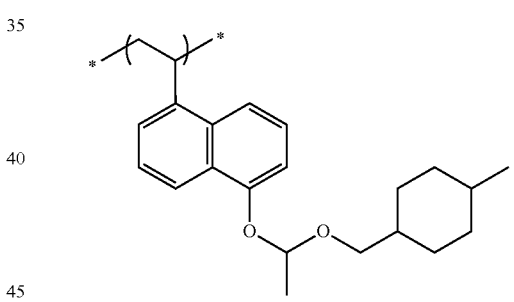
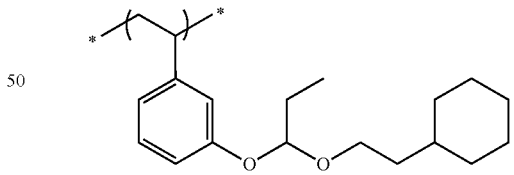
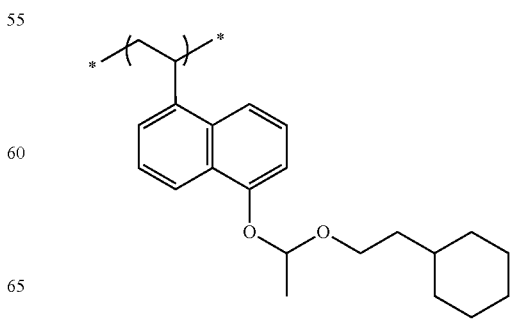

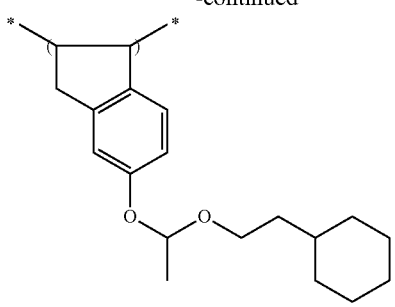
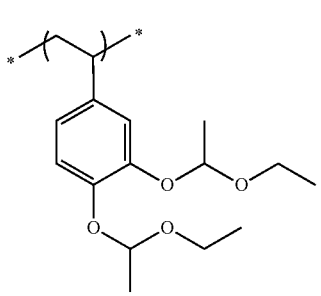
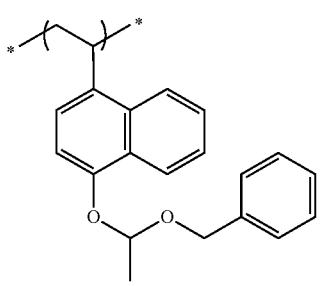
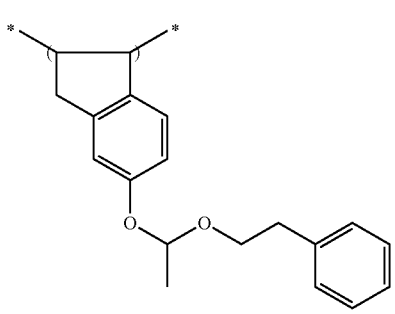
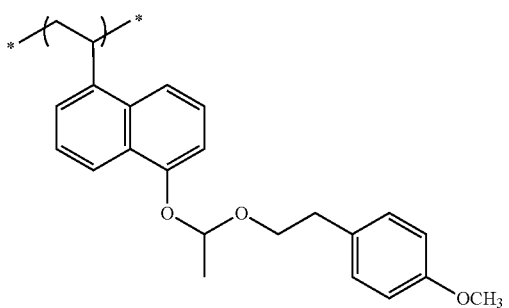
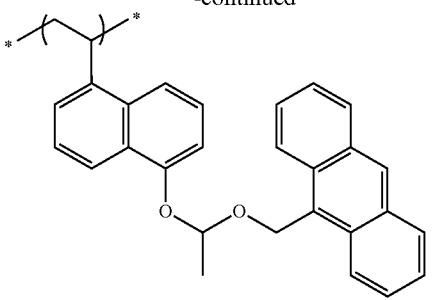
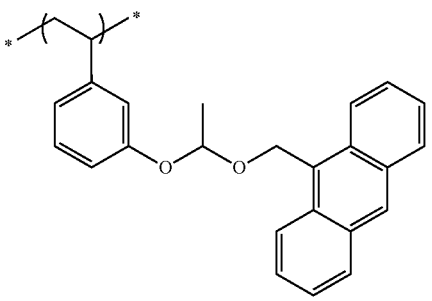
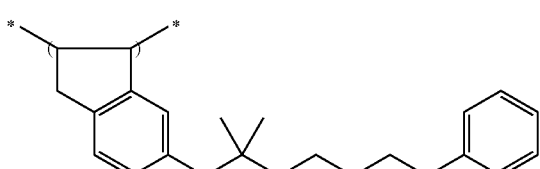
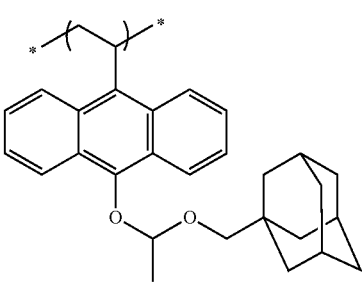
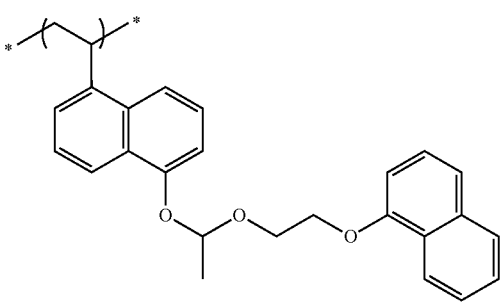
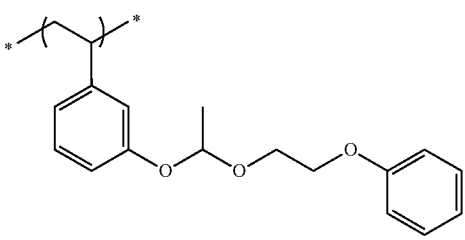

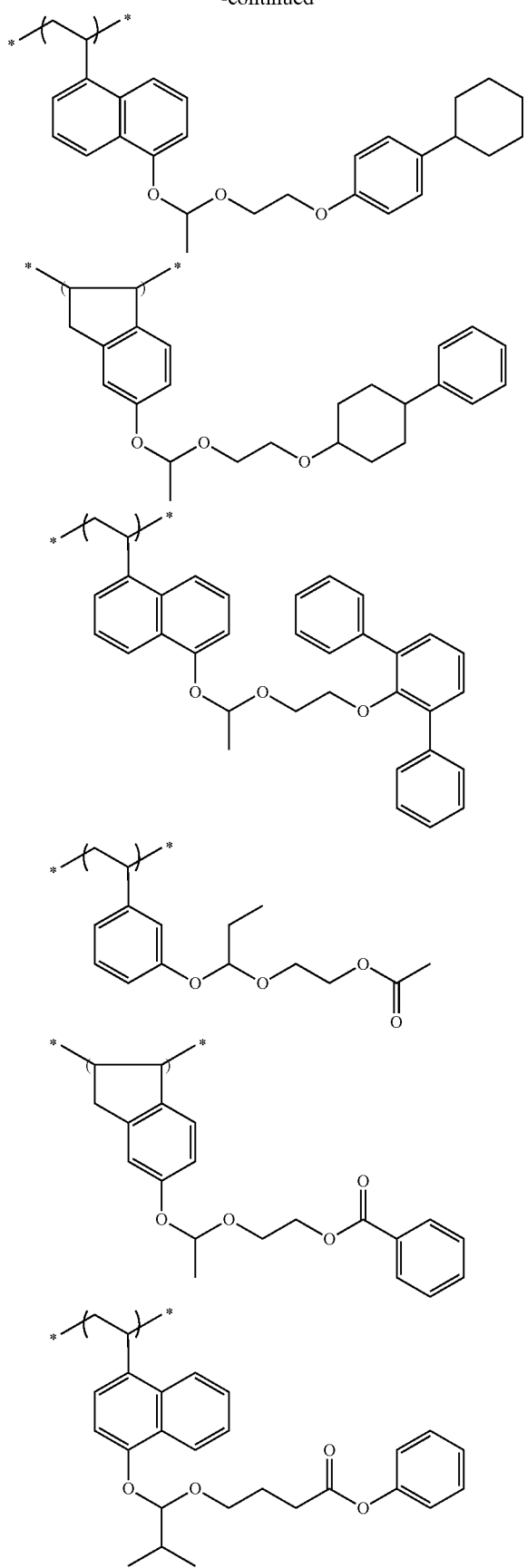
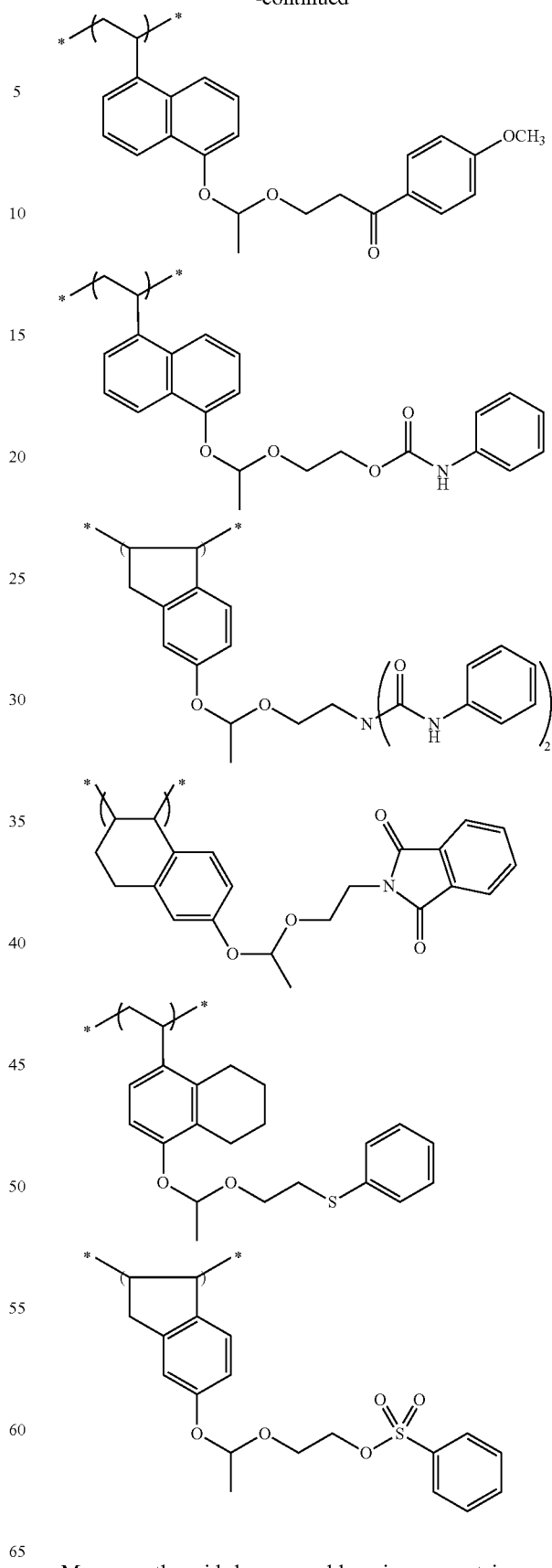
Moreover, the acid-decomposable resin may contain any of the repeating units of general formula (X) below.

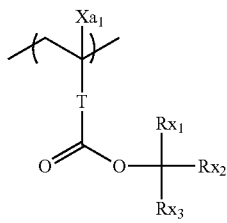
(X)

In the formula, $Xa_1$ represents a hydrogen atom, a methyl group, a trifluoromethyl group or a hydroxymethyl group. T represents a single bond or a bivalent connecting group. Each of $Rx_1$ to $Rx_3$ independently represents a linear or branched alkyl group or a mono- or polycycloalkyl group. At least two of $Rx_1$ to $Rx_3$ may be bonded to each other to thereby form a mono- or polycycloalkyl group.

As the bivalent connecting group represented by T, there can be mentioned, for example, an alkylene group, a group of the formula —(COO-Rt)- or a group of the formula —(O-Rt)-. In the formulae, Rt represents an alkylene group or a cycloalkylene group.

T is preferably a single bond or a group of the formula —(COO-Rt)-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

The cycloalkyl group formed by the mutual bonding of at least two of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

In an especially preferred mode, $Rx_1$ is a methyl group or an ethyl group, and $Rx_2$ and $Rx_3$ are bonded to each other to thereby form any of the above-mentioned cycloalkyl groups.

Specific examples of the repeating units of general formula (X) will be shown below, which in no way limit the scope of the present invention.

In the formulae, Rx represents H, $CH_3$, or $CH_2OH$. Each of Rxa and Rxb represents an alkyl group having 1 to 4 carbon atoms.

1
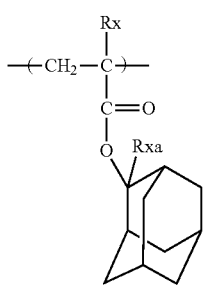

2
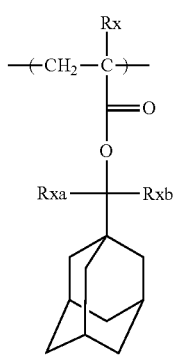

3
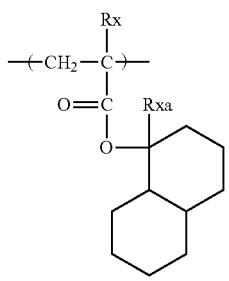

4
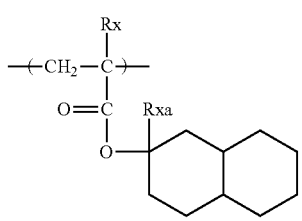

5
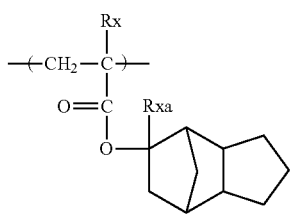

6
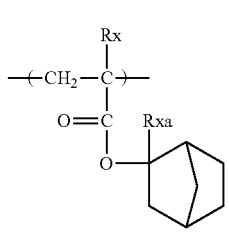

7
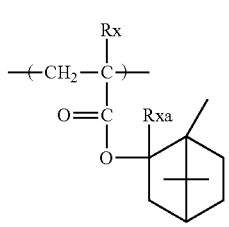

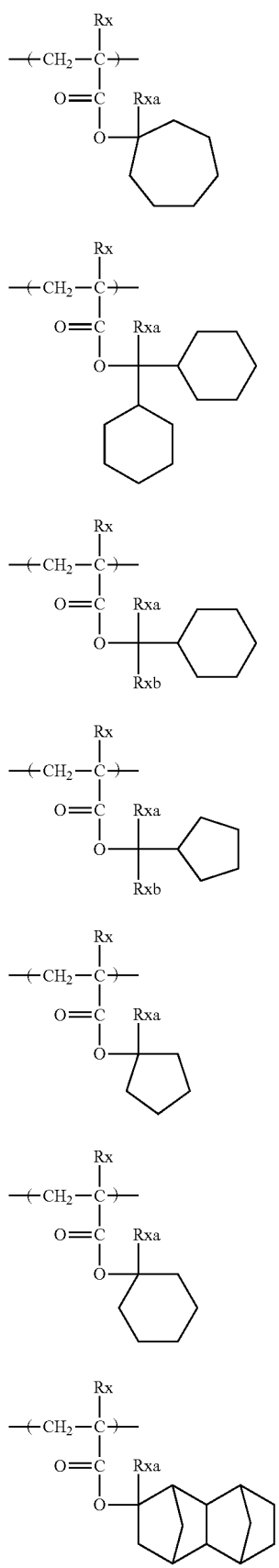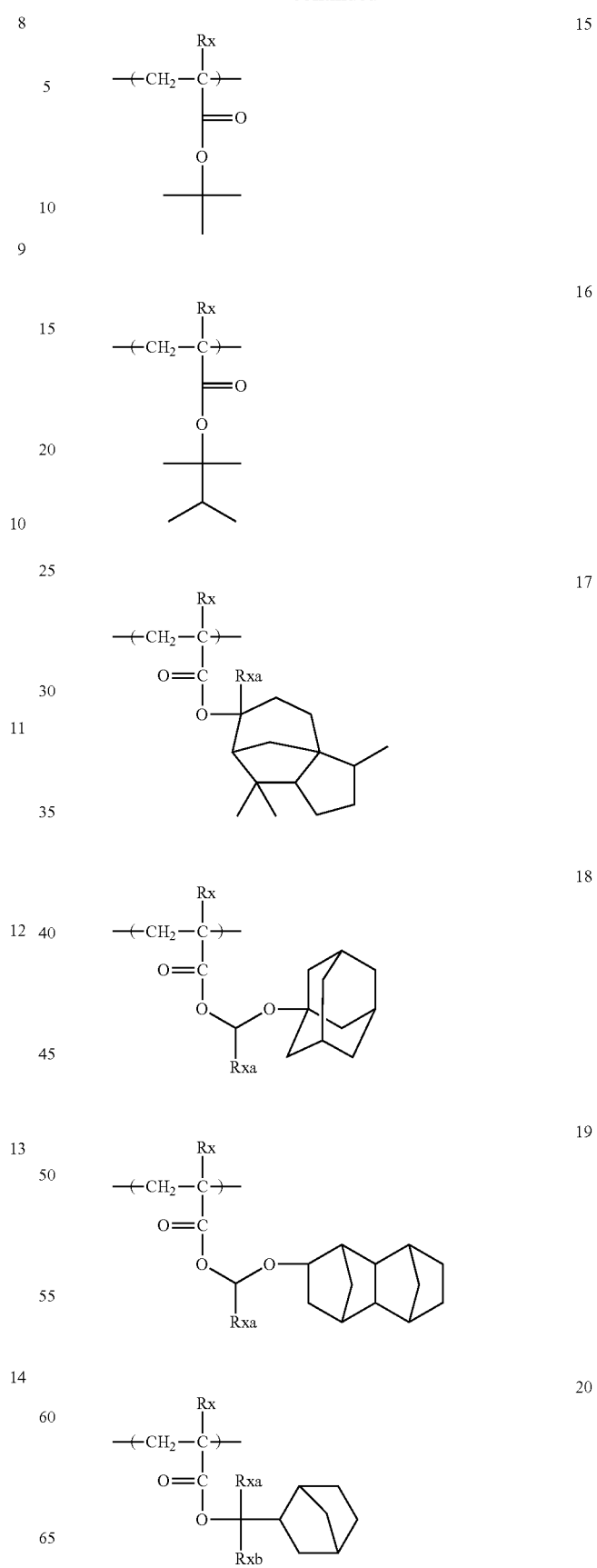

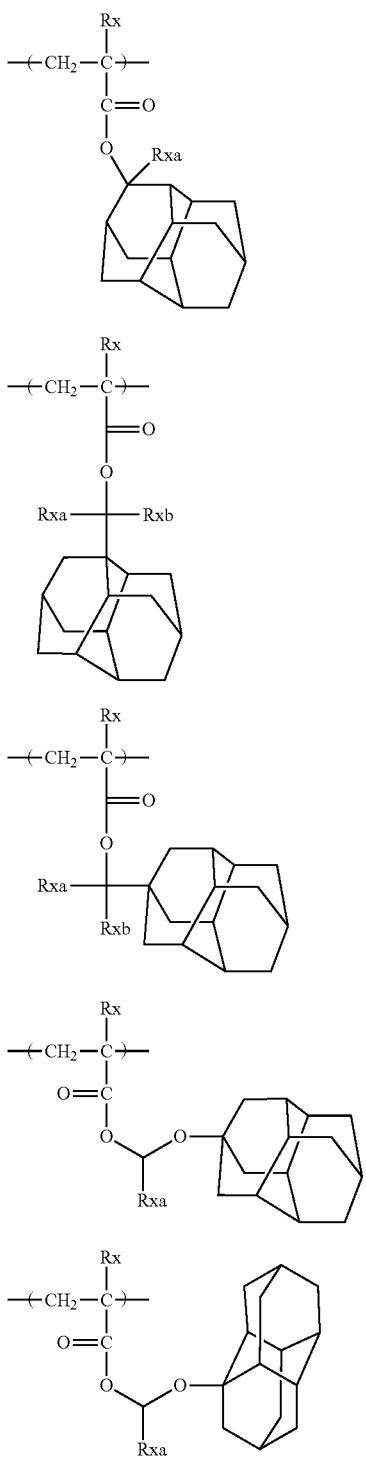

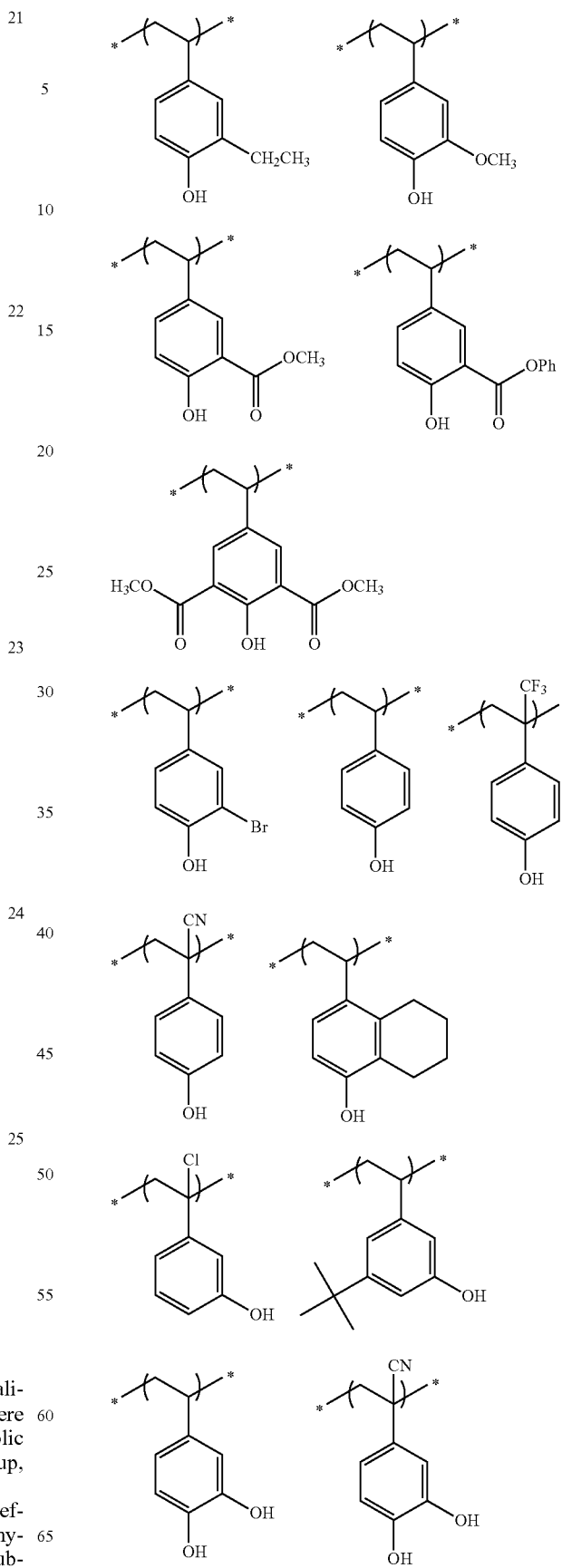

The above-mentioned repeating unit containing an alkali-soluble group is not particularly limited. For example, there can be mentioned a repeating unit containing a phenolic hydroxyl or a repeating unit containing a carboxyl group, such as (meth)acrylic acid or norbornenecarboxylic acid.

The repeating unit containing a phenolic hydroxyl is preferably one of o-hydroxystyrene, m-hydroxystyrene, p-hydroxystyrene or hydrogenated hydroxystyrene, or any of substituted hydroxystyrene units of the following structures.

-continued

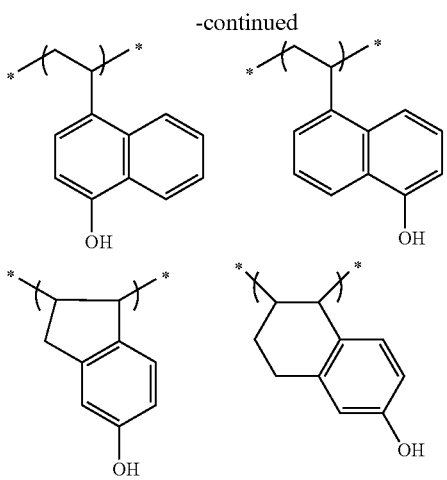

The content of acid-decomposable group is calculated by the formula B/(B+S) wherein B refers to the number of acid-decomposable groups contained in the resin and S refers to the number of alkali-soluble groups not protected by any acid-cleavable group. The content is preferably in the range of 0.01 to 0.7, more preferably 0.05 to 0.50 and further more preferably 0.05 to 0.40.

When the composition according to the present invention is exposed to a KrF excimer laser light, electron beams, X-rays or high-energy rays of wavelength 50 nm or shorter (for example, EUV), especially a KrF excimer laser light, it is preferred for the acid-decomposable resin to contain a repeating unit containing an aromatic group. It is especially preferred for the acid-decomposable resin to contain hydroxystyrene as a repeating unit. As this resin, there can be mentioned, for example, a copolymer from hydroxystyrene and hydroxystyrene protected by a group that is cleaved by the action of an acid, or a copolymer from hydroxystyrene and a tertiary-alkyl(meth)acrylate.

It is especially preferred for the acid-decomposable resin to be a resin containing both any of the repeating units of general formula (VI) and any of the repeating units of general formula (IA).

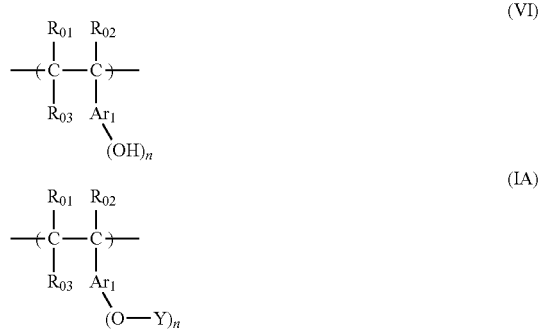

In the formulae, $R_{01}$, $R_{02}$, $R_{03}$, $Ar_1$, n and Y are as defined above in connection with general formula (IA).

The acid-decomposable resin may further contain a repeating unit that is stable against the action of an acid, other than the foregoing repeating units. Further containing a repeating unit that is stable against the action of an acid promises the attainment of contrast regulation, enhancement of etching resistance, etc. As such a repeating unit, there can be mentioned, for example, any of those of general formula (III) below.

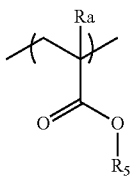

In the formula, Ra represents a hydrogen atom, an alkyl group or a cyano group. $R_5$ represents a hydrocarbon group.

One or more substituents may further be introduced in the alkyl group represented by Ra. As the substituent, there can be mentioned, for example, a halogen atom, such as a fluorine atom or a chlorine atom, or a hydroxyl group. As the alkyl group represented by Ra, there can be mentioned, for example, a methyl group, a chloromethyl group, a trifluoromethyl group or a hydroxymethyl group. Ra is preferably a hydrogen atom or a methyl group.

It is preferred for the hydrocarbon group represented by $R_5$ to contain a ring structure. As particular examples thereof, there can be mentioned a mono- or polycycloalkyl group (preferably 3 to 12 carbon atoms, more preferably 3 to 7 carbon atoms), a mono- or polycycloalkenyl group (preferably 3 to 12 carbon atoms), an aryl group (preferably 6 to 20 carbon atoms, more preferably 6 to 12 carbon atoms) and an aralkyl group (preferably 7 to 20 carbon atoms, more preferably 7 to 12 carbon atoms).

The above cycloalkyl groups include ring-assembly hydrocarbon groups and crosslinked-ring hydrocarbon groups. As the crosslinked-ring hydrocarbon groups, there can be mentioned, for example, bicyclic hydrocarbon groups, tricyclic hydrocarbon groups and tetracyclic hydrocarbon groups. Further, the crosslinked-ring hydrocarbon groups include condensed-ring groups, for example, those resulting from condensation of a plurality of 5- to 8-membered cycloalkane rings.

As preferred crosslinked-ring hydrocarbon groups, there can be mentioned, for example, a norbornyl group, an adamantyl group, a bicyclooctanyl group and a tricyclo[5,2,1,$0^{2,6}$]decanyl group. As more preferred crosslinked-ring hydrocarbon groups, there can be mentioned, for example, a norbornyl group and an adamantyl group.

As preferred examples of the aryl groups, there can be mentioned a phenyl group, a naphthyl group and a biphenyl group. As preferred examples of the aralkyl groups, there can be mentioned a phenylmethyl group, a phenylethyl group and a naphthylmethyl group.

One or more substituents may further be introduced in these hydrocarbon groups. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is preferably an alkoxycarbonyl group having 1 to 4 carbon atoms.

The content of repeating units of general formula (III) based on all the repeating units of the acid-decomposable resin is preferably in the range of 0 to 40 mol %, more preferably 0 to 20 mol % and further more preferably 1 to 15 mol %.

Specific examples of the repeating units of general formula (III) will be shown below, which in no way limit the scope of the present invention. In the formulae, Ra represents a hydrogen atom, an alkyl group or a cyano group.

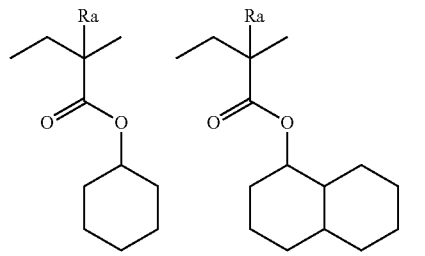
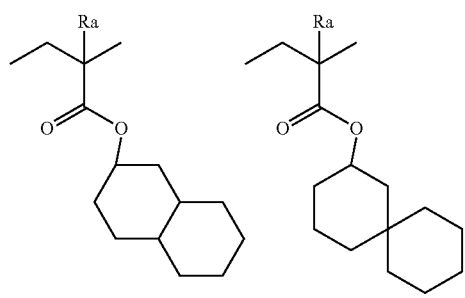
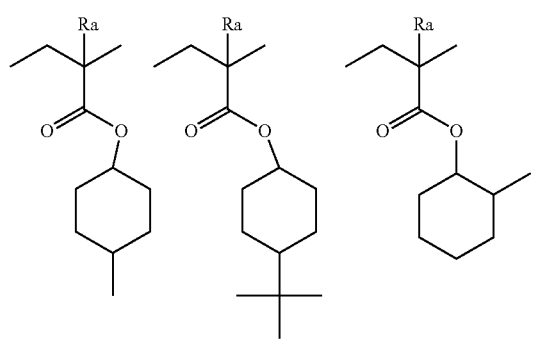
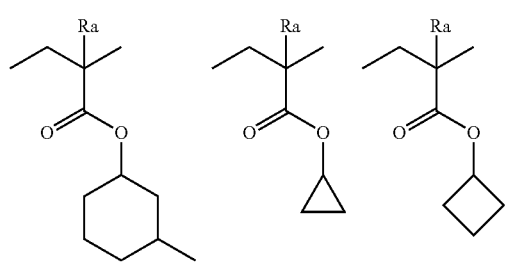
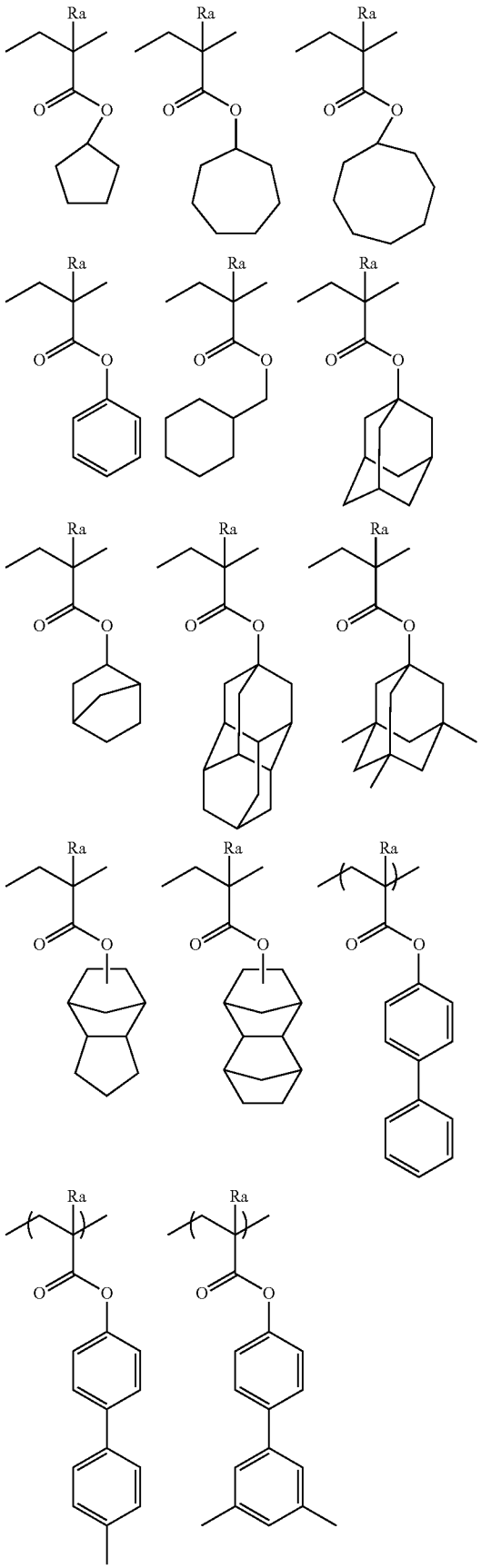

-continued

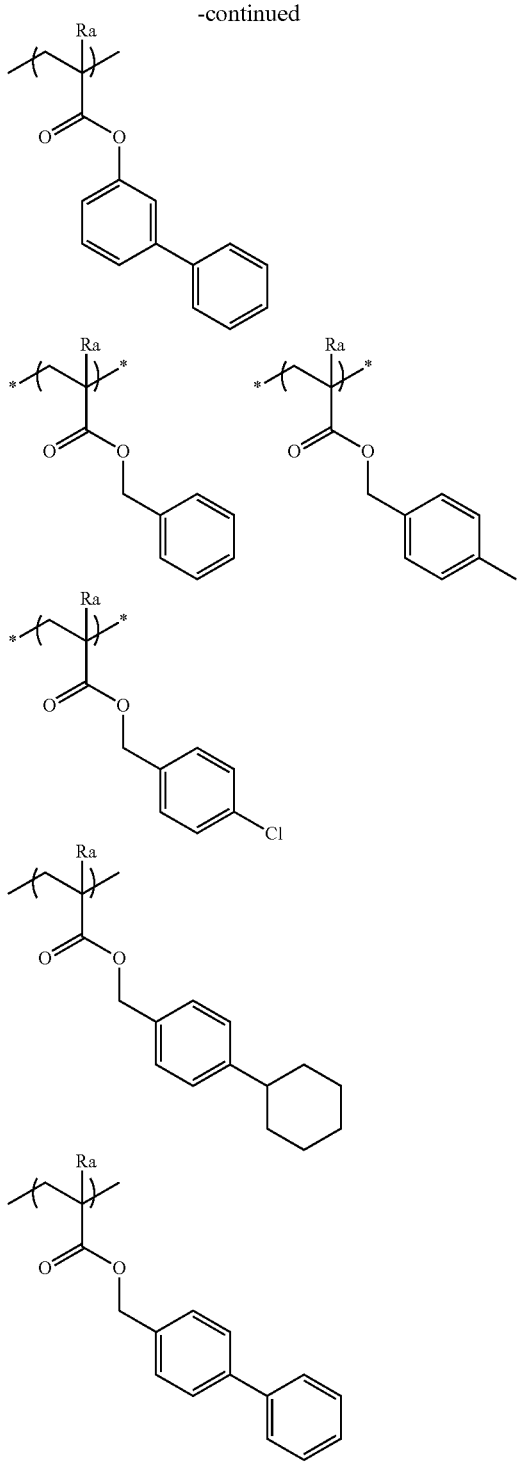

The acid-decomposable resin may further contain a repeating unit containing a development auxiliary group, namely, a group that is decomposed by the action of an alkali developer to thereby increase its rate of dissolution in the developer. If so, the development auxiliary group is decomposed at the time of alkali development, so that the rate of dissolution in the alkali developer is increased. It is especially preferred for this repeating unit to be contained in a resin containing substantially no aromatic ring for use in ArF laser exposure.

The development auxiliary group is, for example, a group that is decomposed in an alkali developer to thereby generate a hydrophilic functional group. As the hydrophilic functional group, there can be mentioned, for example, an alkali-soluble group, such as a carboxyl group or a hydroxyl group.

As the development auxiliary group, there can be mentioned, for example, a group with a lactone structure, a carboxylic ester group substituted with a polar group such as a halogen atom, a group with an acid anhydride structure, a group with a cycloamido structure, an acid amido group, a carboxylic thioester group, a carbonic ester group, a sulfuric ester group, a sulfonic ester group or the like. A group with at least one partial structure selected from among a lactone structure, a cycloamido structure and a cyclic acid anhydride structure is preferred. A lactone group is most preferred.

In this connection, a carboxylic ester group not substituted with a polar group such as a halogen atom (for example, an ester group directly bonded to the principal chain of a (meth) acrylate repeating unit, which is not substituted with a polar group such as a halogen atom) is low in the rate of decomposition reaction in an alkali developer. Therefore, this carboxylic ester group is not included in the category "development auxiliary group."

The group with a lactone structure is preferably a 5- to 7-membered ring lactone structure, more preferably one in which a 5- to 7-membered ring lactone structure is condensed with another cyclic structure in a fashion to form a bicyclo structure or spiro structure.

As preferred repeating units containing the development auxiliary group, there can be mentioned, for example, those with the lactone structures of any of general formulae (LC1-1) to (LC1-17) below. The groups with lactone structures may be directly bonded to the principal chain of the resin. Preferred lactone structures are those of formulae (LC1-1), (LC1-4), (LC1-5), (LC1-6), (LC1-13), (LC1-14) and (LC1-17). The use of these specified lactone structures enhances the line edge roughness and development defect reduction.

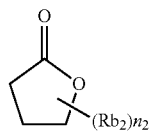

LC1-1

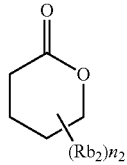

LC1-2

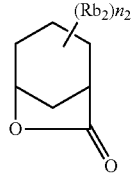

LC1-3

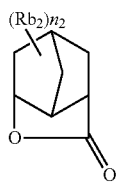
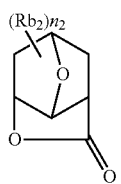
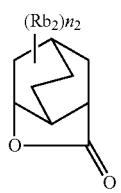
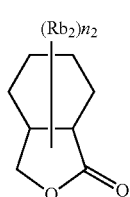
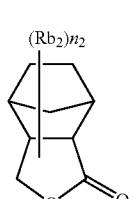
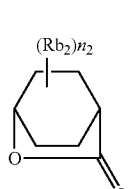
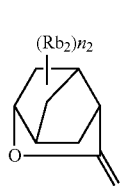
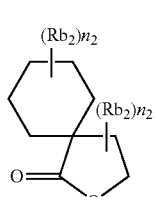

LC1-4
LC1-5
LC1-6
LC1-7
LC1-8
LC1-9
LC1-10
LC1-11

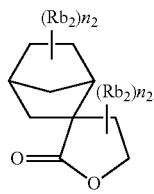
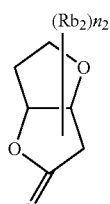
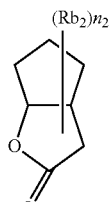
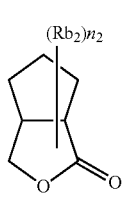
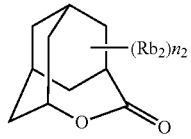
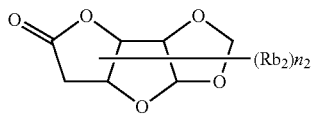

LC1-12
LC1-13
LC1-14
LC1-15
LC1-16
LC1-17

The presence of a substituent $Rb_2$ on the lactone structure is optional. As a preferred substituent $Rb_2$, an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxy group, a cyano group, and an acid-decomposable group can be exemplified.

In the formulae, $n_2$ is an integer of 0 to 4. When $n_2$ is 2 or greater, the plurality of present substituents $Rb_2$ may be identical to or different from each other. Further, the plurality of present substituents $Rb_2$ may be bonded to each other to form a ring.

As the repeating units with the lactone structures of any of general formulae (LC1-1) to (LC1-17), there can be mentioned, for example, the repeating units of general formula (AII) below.

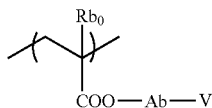
(AII)

In general formula (AII), $Rb_0$ represents a hydrogen atom, a halogen atom or an alkyl group having 1 to 4 carbon atoms.

As preferred substituents that may be introduced in the alkyl group represented by $Rb_0$, there can be mentioned a hydroxyl group and a halogen atom. As the halogen atom, there can be mentioned a fluorine atom, a chlorine atom, a bromine atom or an iodine atom.

$Rb_0$ is preferably a hydrogen atom, a methyl group, a hydroxymethyl group or a trifluoromethyl group. Among these, a hydrogen atom and a methyl group are especially preferred.

Ab represents an alkylene group, a bivalent connecting group with a monocyclic or polycyclic alicyclic hydrocarbon structure, a single bond, an ether group, an ester group, a carbonyl group, a carboxyl group or a bivalent connecting group resulting from combination of these. Ab is preferably a single bond or any of the connecting groups of the formula -$Ab_1$-$CO_2$—.

$Ab_1$ represents a linear or branched alkylene group or a mono- or polycycloalkylene group, being preferably a methylene group, an ethylene group, a cyclohexylene group, an adamantylene group or a norbornylene group.

V represents any of the groups of any of general formulae (LC1-1) to (LC1-17).

The repeating unit containing a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

As repeating units containing especially preferred lactone groups, there can be mentioned the following repeating units. Selecting the most appropriate lactone groups enhances the pattern profile and iso/dense bias. In the formulae, each of Rx and R represents H, $CH_3$, $CH_2OH$ or $CF_3$.

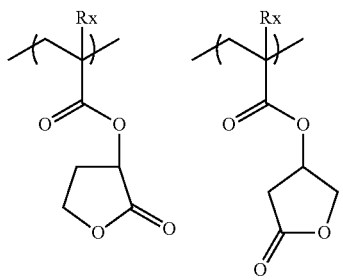

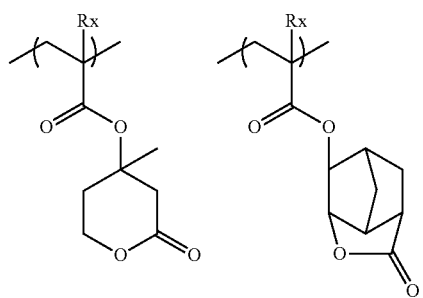

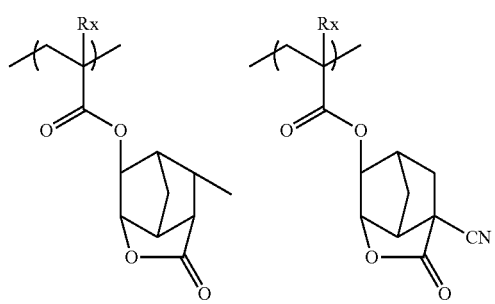

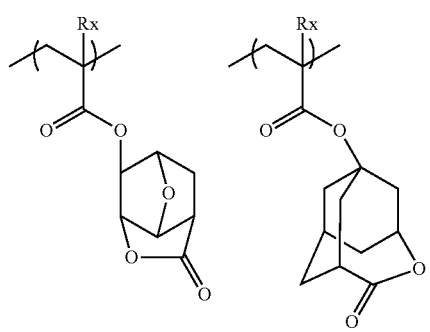

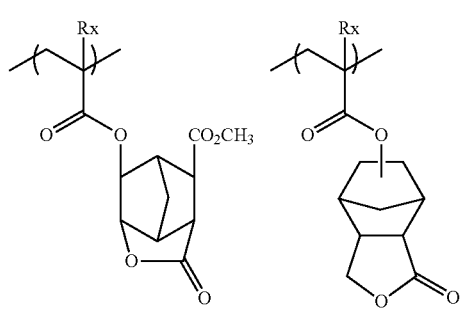

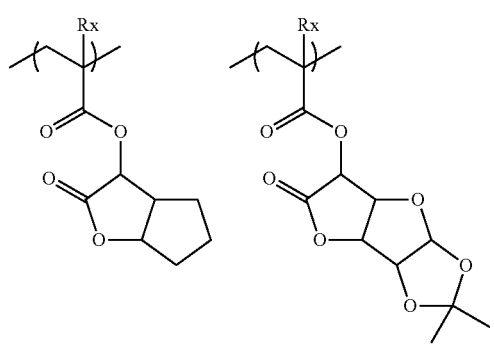

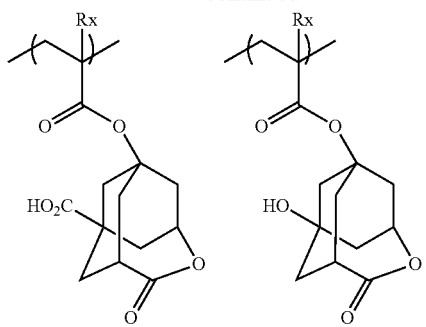
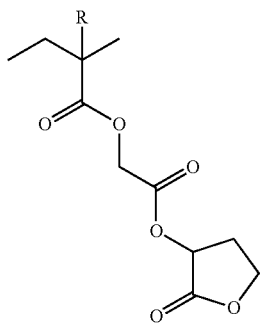
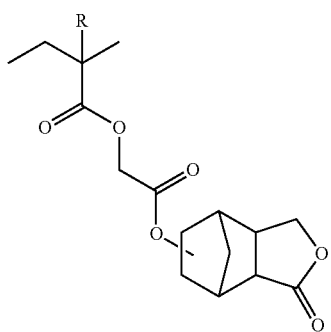
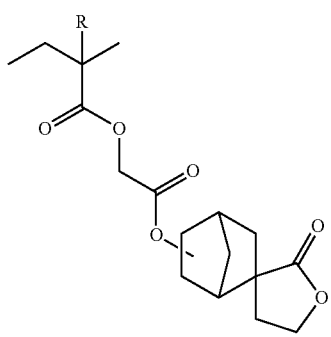
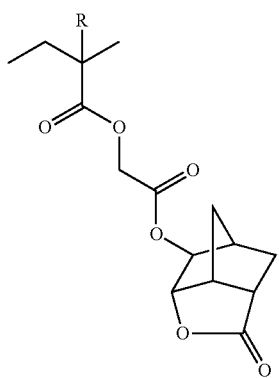
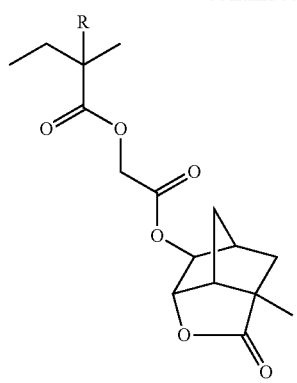
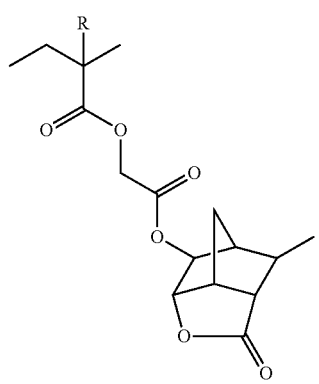
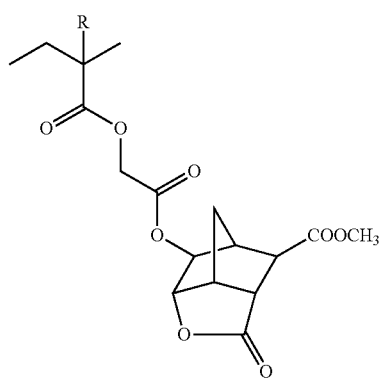
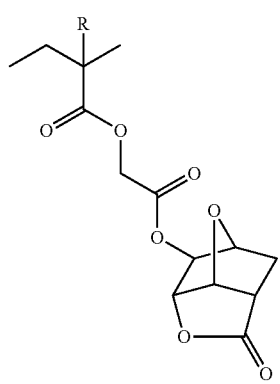

45
-continued
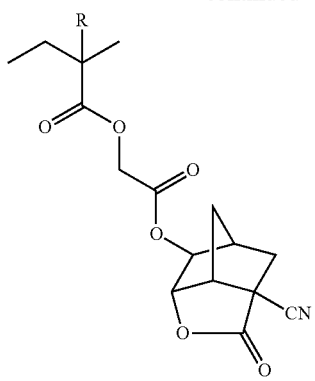
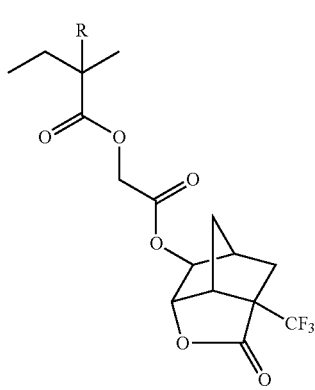
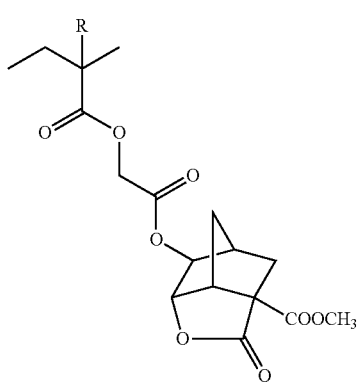
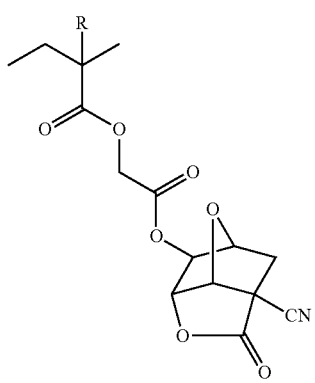
46
-continued
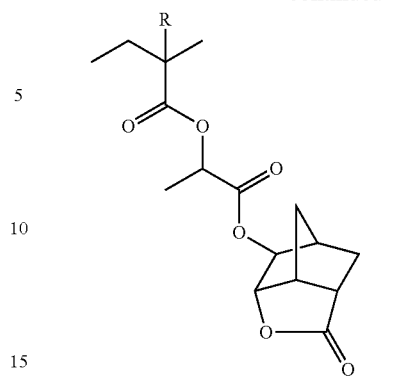
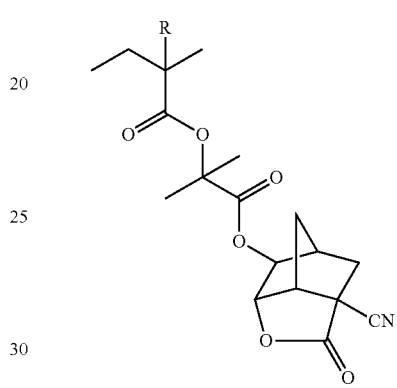
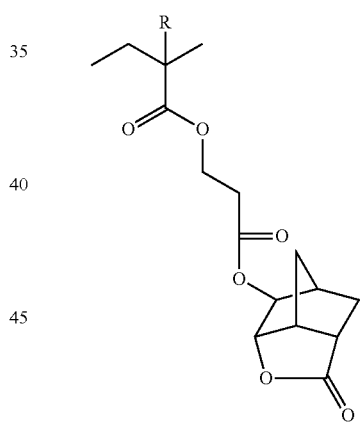
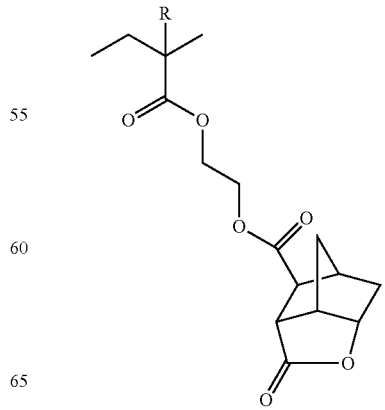

-continued

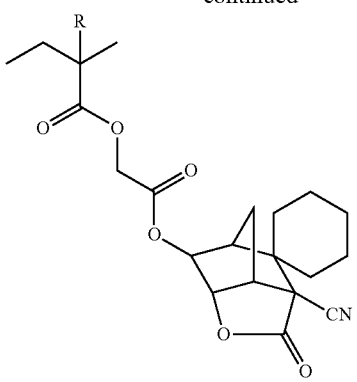

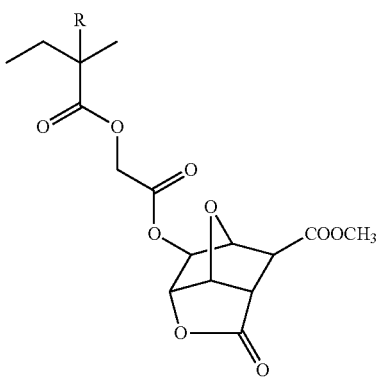

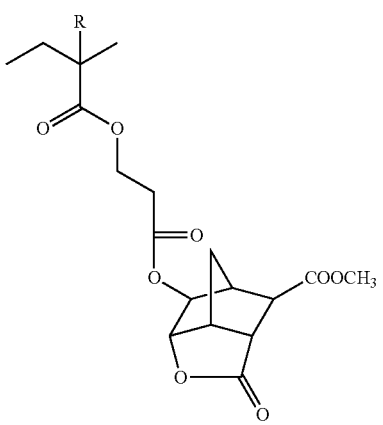

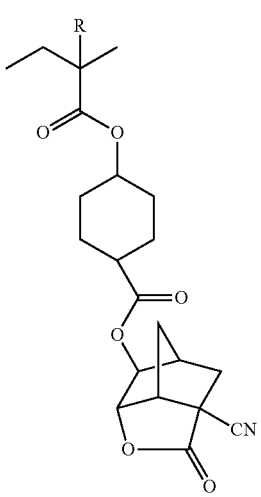

-continued

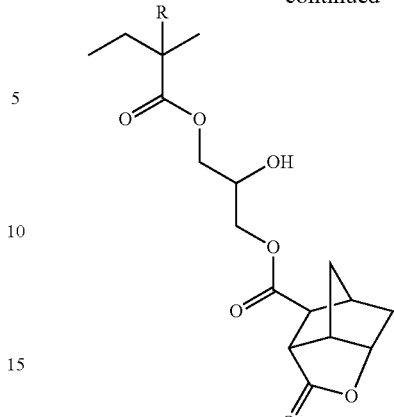

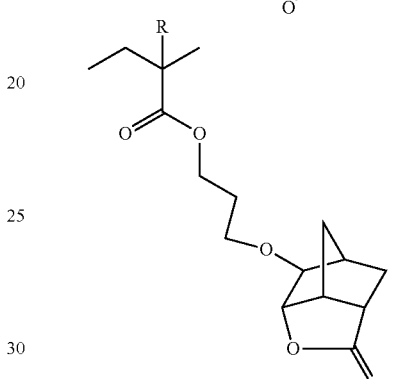

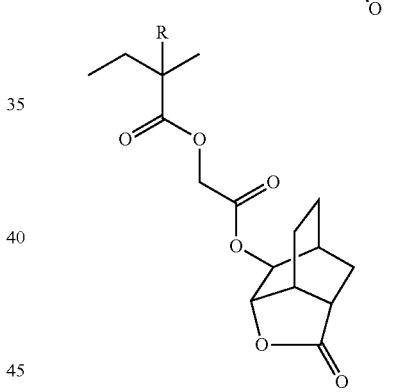

The repeating unit containing the development auxiliary group is, for example, a repeating unit comprising a development auxiliary group bonded to a principal chain of resin, such as a repeating unit of acrylic ester or methacrylic ester. Alternatively, this repeating unit may be introduced in an end of a resin by using a polymerization initiator or chain transfer agent containing a development auxiliary group in the stage of polymerization.

The content of repeating unit containing the development auxiliary group in an acid-decomposable resin, based on all the repeating units thereof, is preferably in the range of 1 to 40 mol %, more preferably 3 to 30 mol % and most preferably 5 to 15 mol %.

The acid-decomposable resin may contain a repeating unit derived from another polymerizable monomer. Usable other polymerizable monomers include, for example, a compound containing at least one addition-polymerizable unsaturated bond, selected from among (meth)acrylic esters, (meth)acrylamides, allyl compounds, vinyl ethers, vinyl esters, styrenes, crotonic esters and the like. Furthermore, the other polymerizable monomers include maleic anhydride, maleimide, acrylonitrile, methacrylonitrile and maleonitrile.

The content of these repeating units derived from other polymerizable monomers, based on all the repeating units, is generally 50 mol % or less, preferably 30 mol % or less.

The content of repeating unit containing an alkali-soluble group, such as a hydroxyl group, a carboxyl group or a sulfonate group, based on all the repeating units constituting the acid-decomposable resin, is preferably in the range of 1 to 99 mol %, more preferably 3 to 95 mol % and most preferably 5 to 90 mol %.

The content of repeating unit containing an acid-decomposable group, based on all the repeating units constituting the acid-decomposable resin, is preferably in the range of 3 to 95 mol %, more preferably 5 to 90 mol % and most preferably 10 to 85 mol %.

The weight average molecular weight of the acid-decomposable resin in terms of polystyrene molecular weight measured by GPC (solvent: THF) is preferably 50,000 or less, more preferably 1000 to 50,000 and most preferably 1000 to 25,000.

The dispersity (Mw/Mn) of the acid-decomposable resin is preferably in the range of 1.0 to 3.0, more preferably 1.05 to 2.0 and further more preferably 1.1 to 1.7.

Two or more types of acid-decomposable resins may be used in combination.

Preferred particular examples of the acid-decomposable resins will be shown below, which in no way limit the scope of the resins.

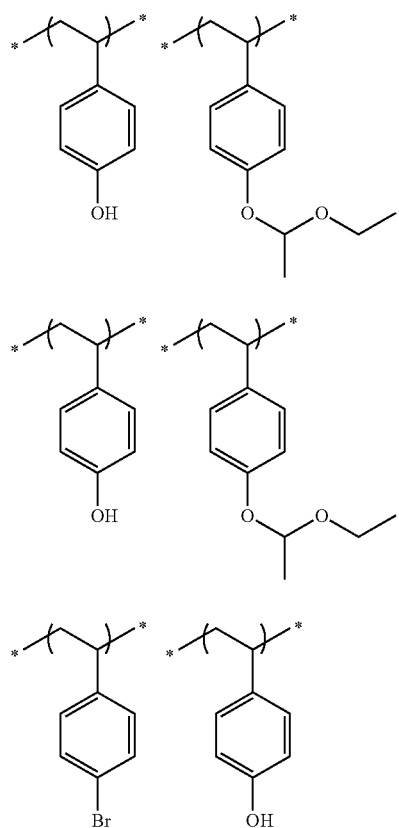

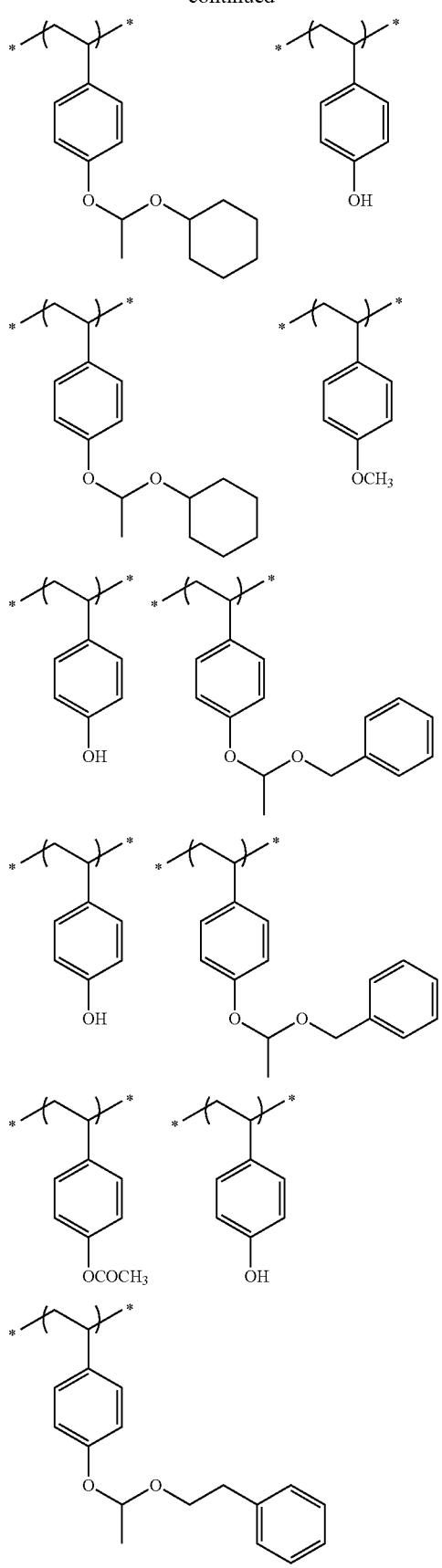

51

-continued

52

-continued

53
-continued
54
-continued
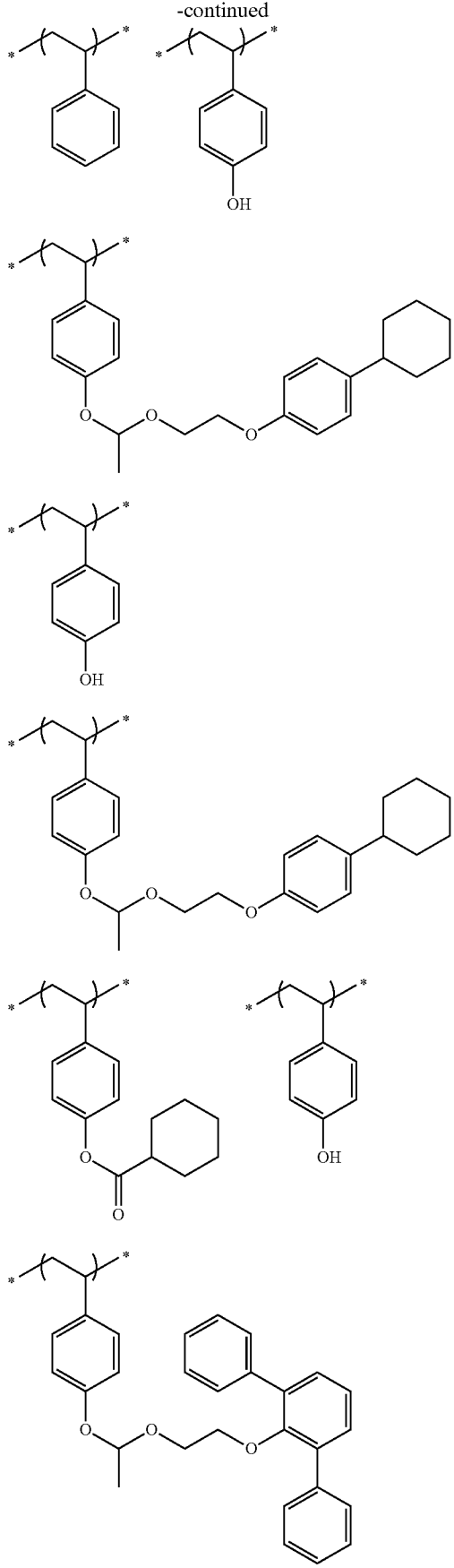
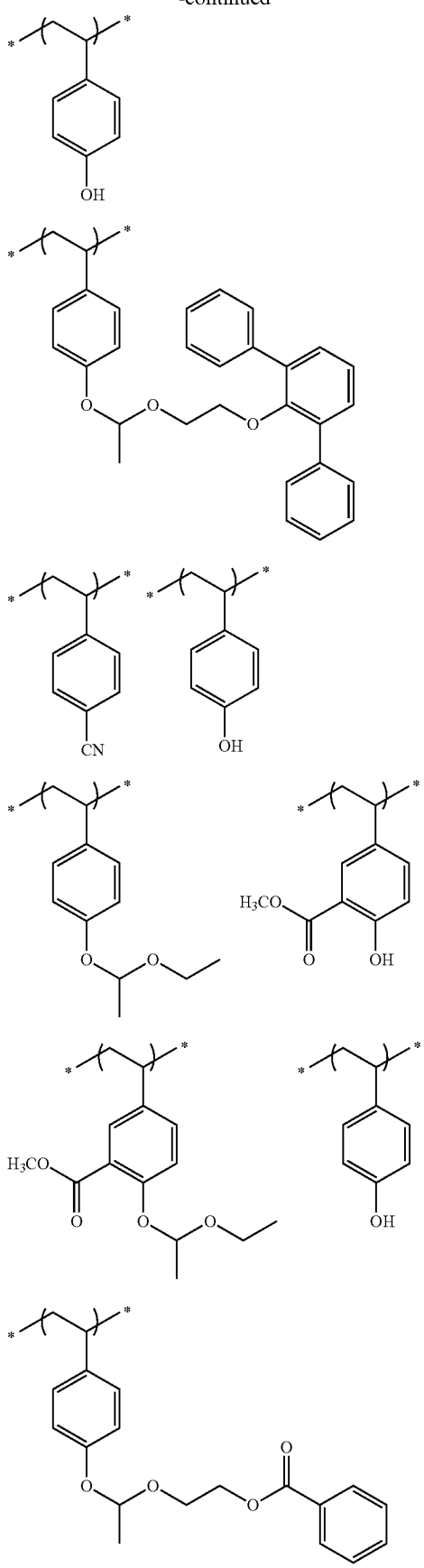

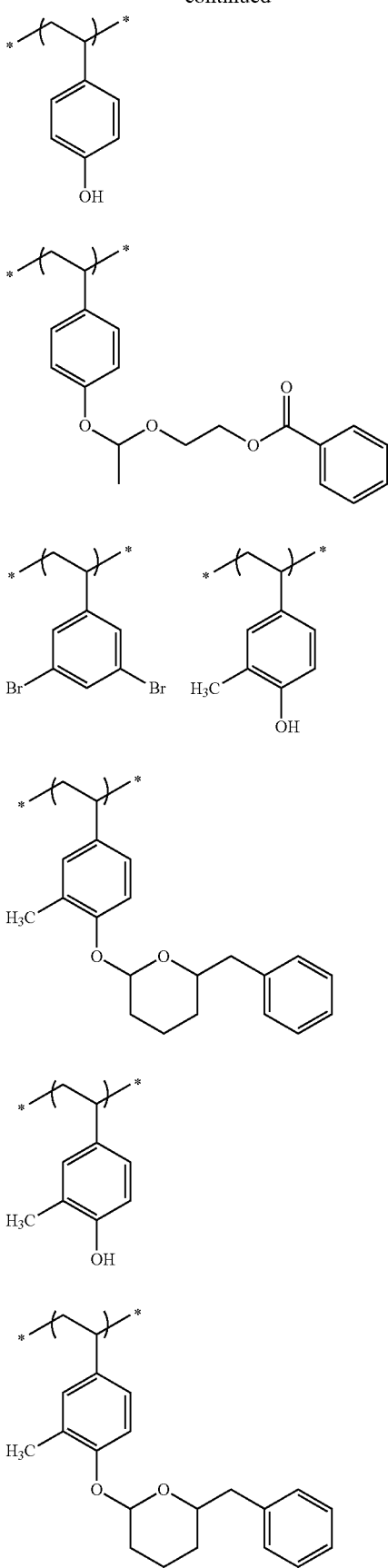
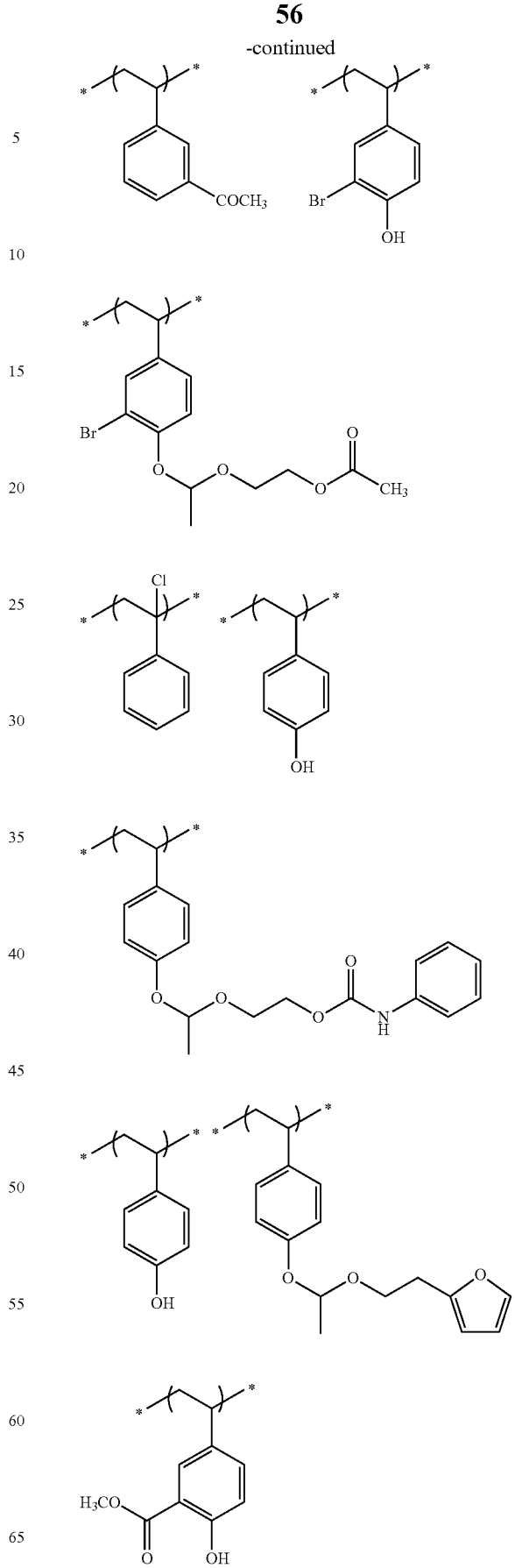

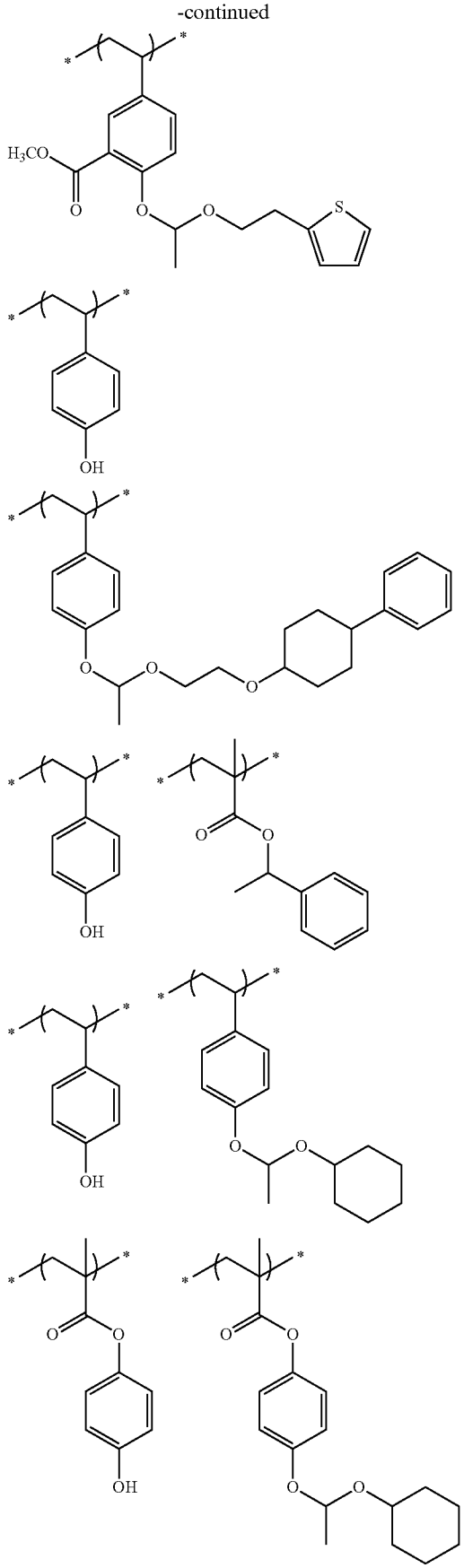

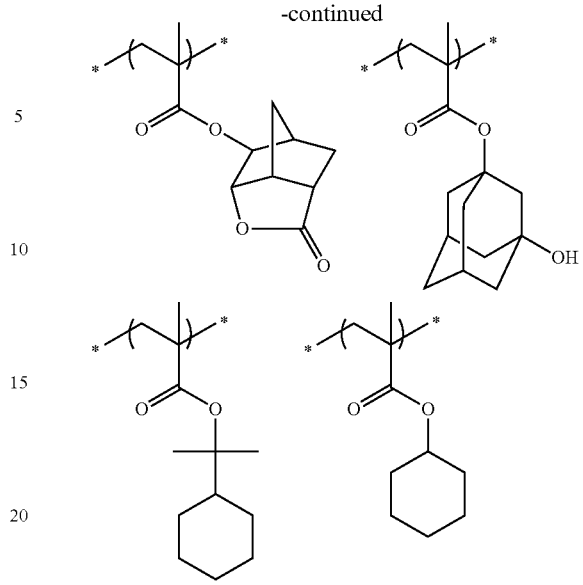

[3] Photoacid Generator

The composition according to the present invention contains a photoacid generator. The photoacid generator is a compound that generates an acid when exposed to actinic rays or radiation.

As such a photoacid generator, use can be made of, for example, a member appropriately selected from among a photoinitiator for photocationic polymerization, a photoinitiator for photoradical polymerization, a photo-achromatic agent and photo-discoloring agent for dyes, any of heretofore known compounds that when exposed to actinic rays or radiation, generate an acid, employed in microresists, etc., and mixtures thereof. As examples of the photoacid generators, there can be mentioned an onium salt, such as a sulfonium salt or an iodonium salt, and a diazodisulfone compound, such as a bis(alkylsulfonyldiazomethane). It is preferred for the acid generated by the photoacid generator to be sulfonic acid.

As the photoacid generator, there can be mentioned, for example, [A] a compound that generates an acid when exposed to actinic rays or radiation and that contains a fluorine atom (hereinafter also referred to as a fluorinated-acid generator) or [B] a compound that generates an acid when exposed to actinic rays or radiation and that does not contain any fluorine atom (hereinafter also referred to as a nonfluorinated-acid generator). These acid generators will be described below in order.

As the photoacid generator, use may be made of a combination of two or more fluorinated-acid generators. Also, use may be made of a combination of two or more nonfluorinated-acid generators. Further, use may be made of a combination of one or more fluorinated-acid generators and one or more nonfluorinated-acid generators.

[A] Fluorinated-Acid Generator

The fluorinated-acid generator is a compound that generates an acid when exposed to actinic rays or radiation and that contains a fluorine atom.

The fluorinated-acid generator is preferably an onium salt.

The cation of the onium salt is preferably a sulfonium cation or an iodonium cation.

The counter anion of the onium cation is preferably a sulfonate anion containing a fluorine atom. This counter anion is more preferably an alkyl sulfonate anion substituted with a fluorine atom or an aryl sulfonate anion substituted with a fluorine atom or a fluoroalkyl group. An alkyl sulfonate anion substituted with a fluorine atom is especially preferred.

The alkyl sulfonate anion substituted with a fluorine atom is preferably a perfluoroalkyl sulfonate anion having 1 to 8 carbon atoms, more preferably a perfluoroalkyl sulfonate anion having 2 to 6 carbon atoms.

The aryl group of the aryl sulfonate anion is preferably a phenyl group.

Substituents other than a fluorine atom and a fluoroalkyl group may be introduced in the counter anion. As particular examples of the substituents, there can be mentioned an alkyl group, a cycloalkyl group, an alkoxy group, an alkylthio group and the like. The substituents are not particularly limited.

As preferred examples of the fluorinated-acid generators, there can be mentioned the compounds of general formulae (ZI) and (ZII) below.

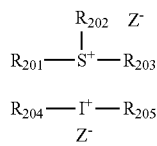

(ZI)

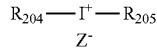

(ZII)

First, the compounds of general formula (ZI) will be described.

In the formula (ZI), each of $R_{201}$, $R_{202}$ and $R_{203}$ independently represents an organic group. $Z^-$ represents a nonnucleophilic anion containing a fluorine atom.

The number of carbon atoms of each of the organic groups represented by $R_{201}$, $R_{202}$ and $R_{203}$ is, for example, 1 to 30, preferably 1 to 20. As the organic groups, there can be mentioned an aryl group (preferably having 6 to 15 carbon atoms), a linear or branched alkyl group (preferably having 1 to 10 carbon atoms) and a cycloalkyl group (preferably having 3 to 15 carbon atoms).

Two selected from among $R_{201}$ to $R_{203}$ may be bonded via a single bond or a connecting group to each other to thereby form a ring. As the connecting group, there can be mentioned, for example, an ether bond, a thioether bond, an ester bond, an amido bond, a carbonyl group, a methylene group or an ethylene group. As the group formed by the mutual bonding of two of $R_{201}$ to $R_{203}$, there can be mentioned, for example, an alkylene group, such as a butylene group or a pentylene group.

Preferably, at least one of $R_{201}$, $R_{202}$ and $R_{203}$ is an aryl group. More preferably, these three are simultaneously aryl groups. As the aryl group, there can be mentioned, for example, a phenyl group or a naphthyl group. The aryl groups also include a heteroaryl group, such as an indole residue or a pyrrole residue.

One or more substituents may further be introduced in the aryl groups, alkyl groups and cycloalkyl groups represented by $R_{201}$, $R_{202}$ and $R_{203}$. As the substituents, there can be mentioned, for example, a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms) and the like.

Two selected from among $R_{201}$, $R_{202}$ and $R_{203}$ may be bonded via a single bond or a connecting group to each other. As the connecting group, there can be mentioned, for example, an alkylene group (preferably having 1 to 3 carbon atoms), —O—, —S—, —CO— or —SO$_2$—.

As preferred structures in which at least one of $R_{201}$, $R_{202}$ and $R_{203}$ is not an aryl group, there can be mentioned the cation structures of the compounds set forth in Paragraphs 0047 and 0048 of JP-A-2004-233661, compounds set forth in Paragraphs 0040 to 0046 of JP-A-2003-35948, compounds of formulae (I-1) to (I-70) shown as examples in US 2003/0224288 A1, compounds of formulae (IA-1) to (IA-54) and (IB-1) to (IB-24) shown as examples in US 2003/0077540 A1 and the like. When at least one of $R_{201}$, $R_{202}$ and $R_{203}$ is not an aryl group, the following instances (1) and (2) are especially preferred.

(1) At least one of $R_{201}$, $R_{202}$ and $R_{203}$ is any of the groups of the formula Ar—CO—X—, and the rest is a linear or branched alkyl group or a cycloalkyl group.

In the above formula, Ar represents an optionally substituted aryl group. In particular, Ar is any of the same aryl groups as mentioned above in connection with $R_{201}$, $R_{202}$ and $R_{203}$. Ar is preferably an optionally substituted phenyl group.

X represents an optionally substituted linear or branched alkylene group. In particular, X is preferably an alkylene group having 1 to 6 carbon atoms. An alkylene group having 1 to 3 carbon atoms is especially preferred.

The above linear or branched alkyl group or cycloalkyl group preferably has 1 to 6 carbon atoms. One or more substituents may further be introduced in these groups. It is preferred for these groups to be bonded to each other to thereby form a ring (preferably a 5- to 7-membered ring).

(2) At least one of $R_{201}$, $R_{202}$ and $R_{203}$ is an optionally substituted aryl group, and the rest is a linear or branched alkyl group or a cycloalkyl group.

As the aryl group, there can be mentioned, for example, those mentioned above in connection with $R_{201}$, $R_{202}$ and $R_{203}$. As preferred aryl groups, there can be mentioned a phenyl group and a naphthyl group.

Preferably, any of a hydroxyl group, an alkoxy group and an alkyl group is introduced as a substituent in these aryl groups. The substituent is preferably an alkoxy group having 1 to 12 carbon atoms, more preferably an alkoxy group having 1 to 6 carbon atoms.

The above linear or branched alkyl group or cycloalkyl group preferably has 1 to 6 carbon atoms. Substituents may further be introduced in these groups. It is preferred for these groups to be bonded to each other to thereby form a ring (preferably a 5- to 7-membered ring).

As mentioned above, $Z^-$ represents a nonnucleophilic anion containing a fluorine atom. As the nonnucleophilic anions, there can be mentioned, for example, those mentioned above as the counter anion of the onium cation of the fluorinated-acid generator.

As the fluorinated-acid generator, use may be made of a compound with a plurality of structures of general formula (ZI). For example, use may be made of a compound with a structure resulting from bonding of at least one of $R_{201}$ to $R_{203}$ of any one of the compounds of general formula (ZI) to at least one of $R_{201}$ to $R_{203}$ of another of the compounds of general formula (ZI).

Now, the compounds of general formula (ZII) will be described. In general formula (ZII), each of $R_{204}$ and $R_{205}$ independently represents an aryl group, an alkyl group or a cycloalkyl group. $Z^-$ represents a nonnucleophilic anion containing a fluorine atom.

The aryl groups, alkyl groups and cycloalkyl groups represented by $R_{204}$ and $R_{205}$ are, for example, the same as mentioned above in connection with $R_{201}$ to $R_{203}$ of the compounds of general formula (ZI). $Z^-$ is also as defined above in connection with the compounds of general formula (ZI).

As the fluorinated-acid generator, use may be made of a compound with a plurality of structures of general formula (ZII). For example, use may be made of a compound with a structure resulting from bonding of either $R_{204}$ or $R_{205}$ of any one of the compounds of general formula (ZII) to either $R_{204}$ or $R_{205}$ of another of the compounds of general formula (ZII).

Preferred examples of the fluorinated-acid generators will be shown below, which in no way limit the scope of the present invention.

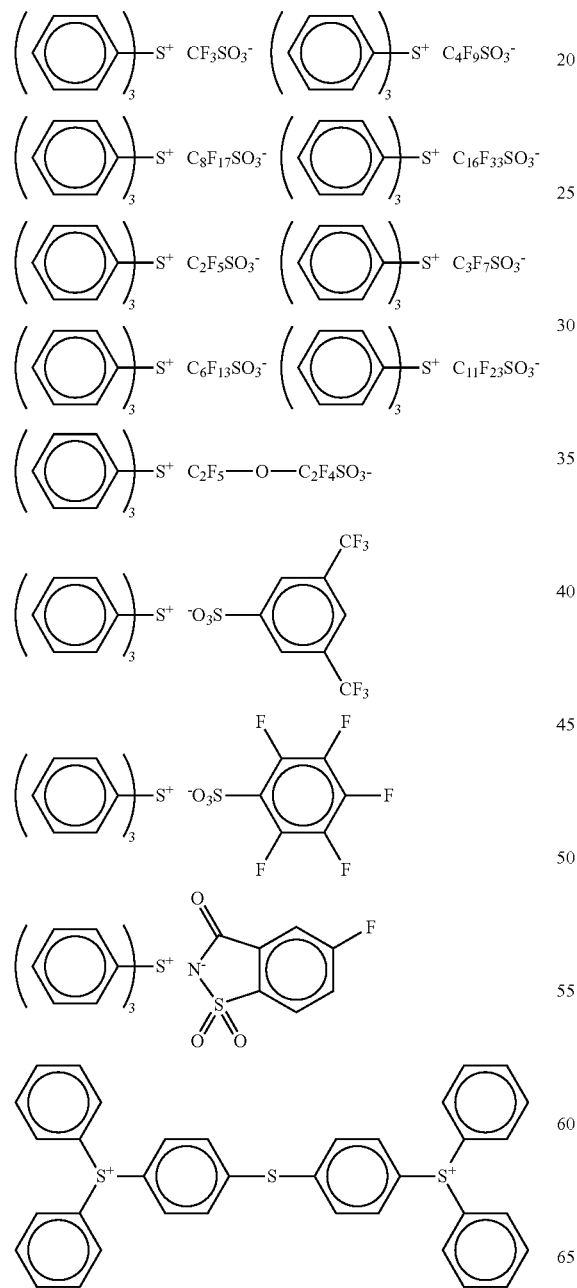

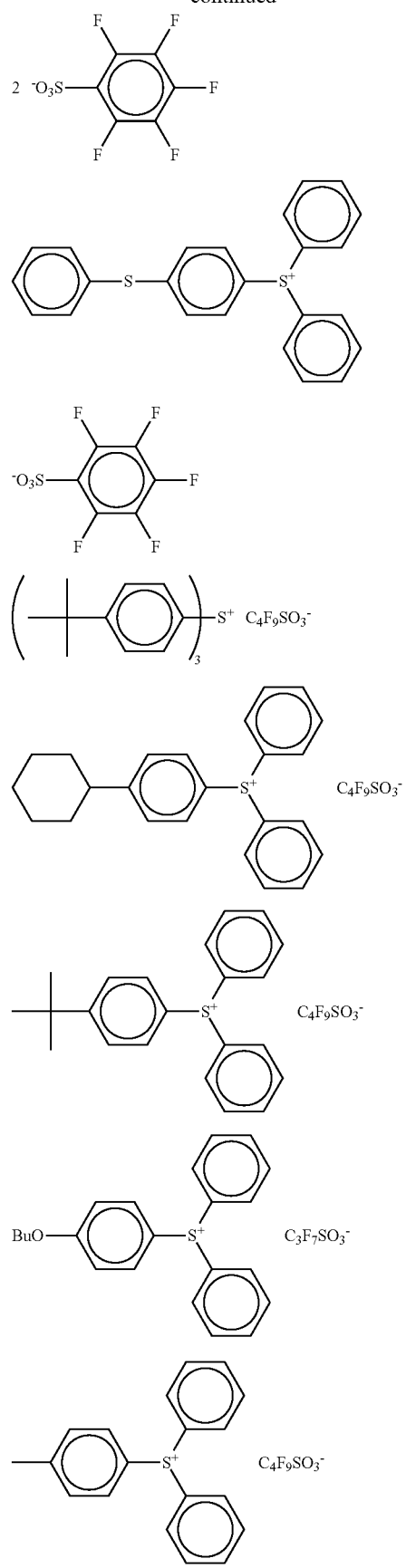

-continued
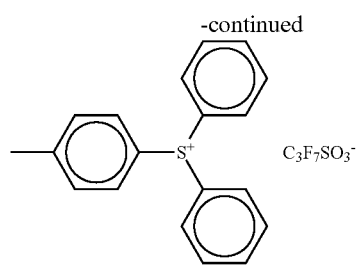
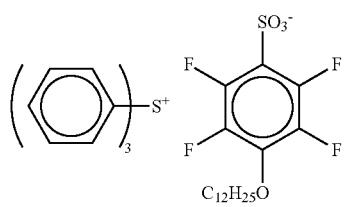
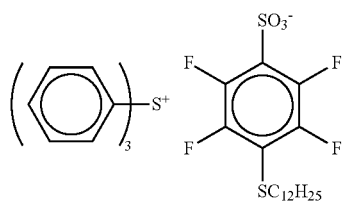
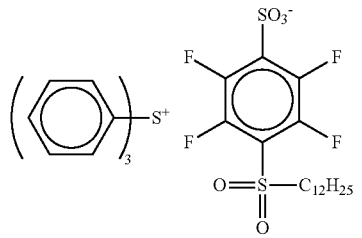
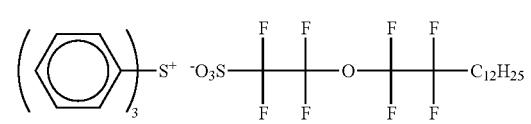
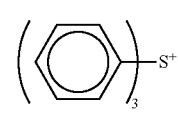
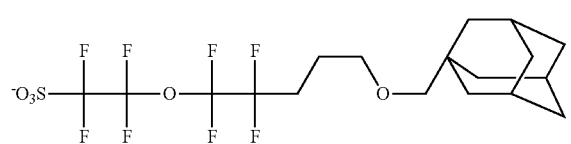
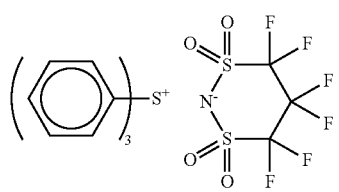
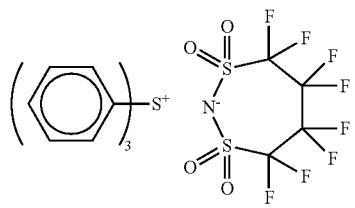
-continued
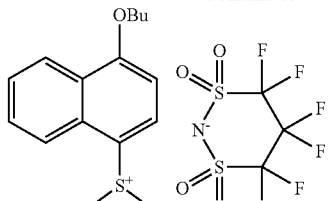
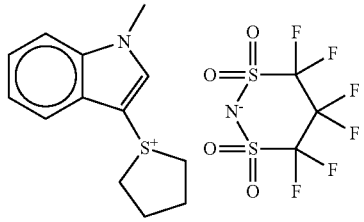
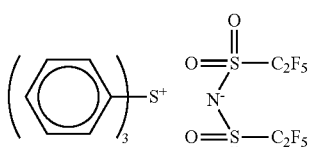
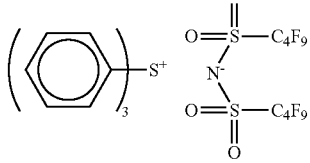
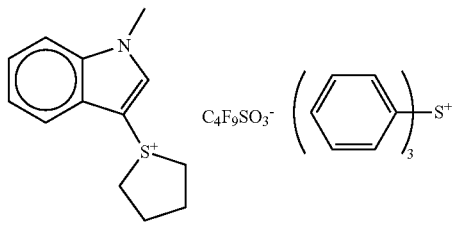
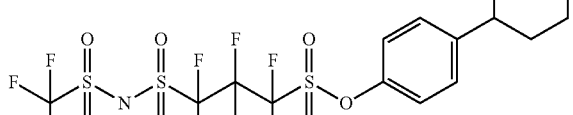
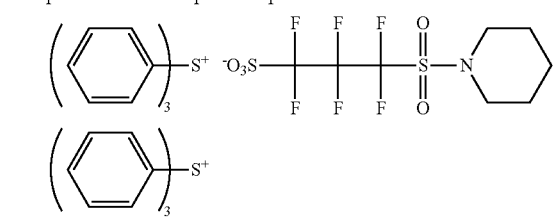
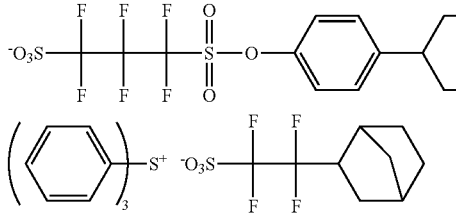

-continued
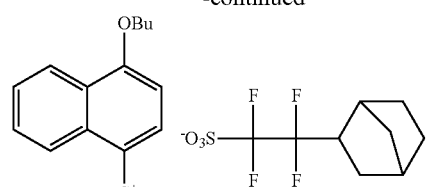
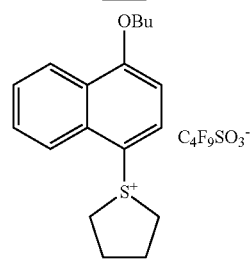
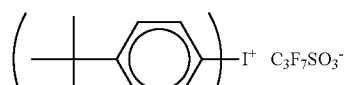
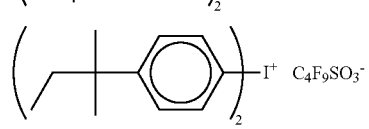
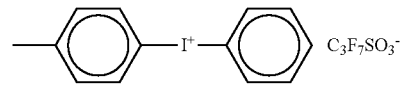
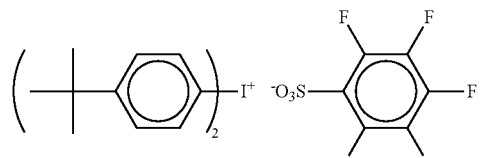
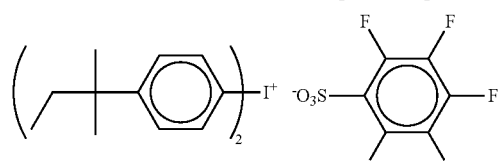
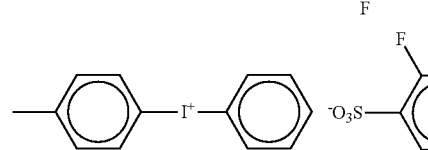
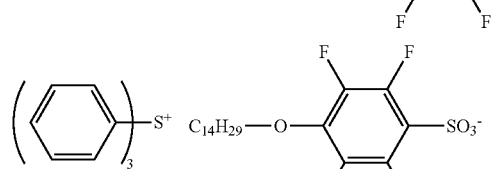
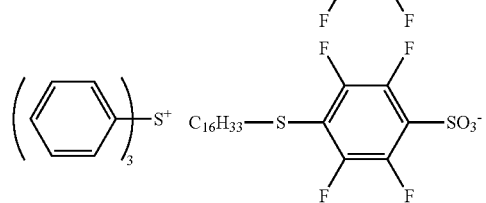
-continued
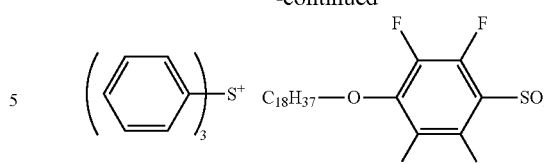
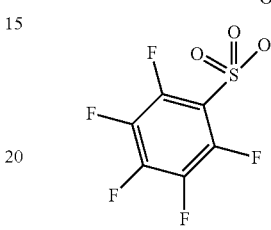
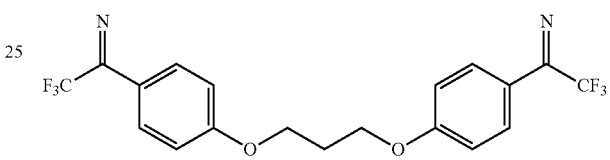
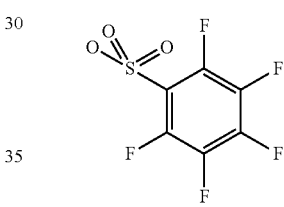
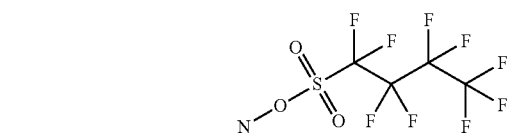
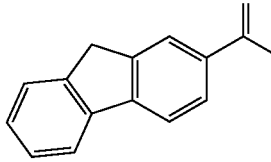
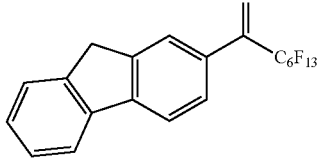
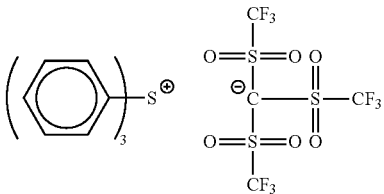

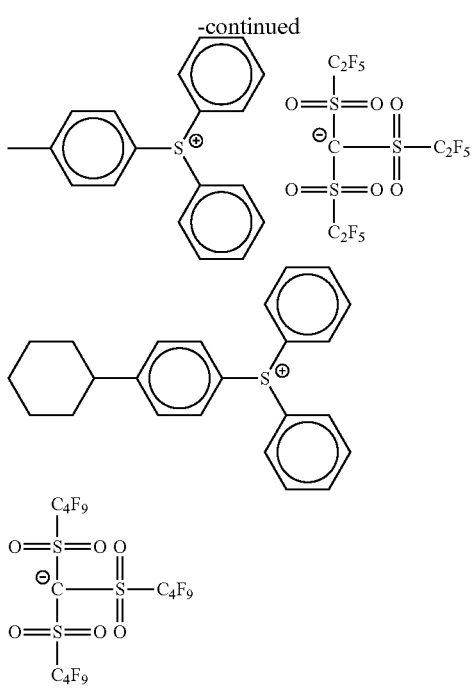

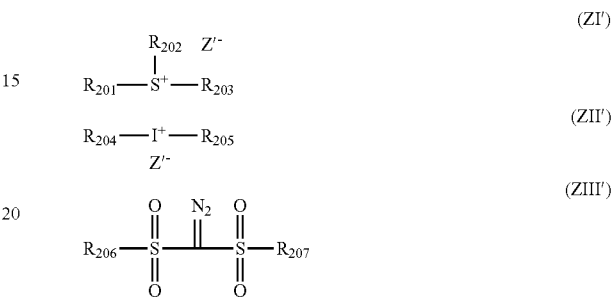

These fluorinated-acid generators may be used alone or in combination.

The content of fluorinated-acid generator based on the total solids of the composition is preferably in the range of 0.5 to 25 mass %, more preferably 1.0 to 15 mass %.

[B] Nonfluorinated-Acid Generator

The nonfluorinated-acid generator is a compound that generates an acid when exposed to actinic rays or radiation and that does not contain any fluorine atom.

The nonfluorinated-acid generator is preferably an onium salt or a diazosulfone compound.

The onium cation of the onium salt is preferably a sulfonium cation or an iodonium cation. The counter anion of the onium cation is preferably a sulfonate anion. This counter anion is more preferably an alkyl sulfonate anion or an aryl sulfonate anion.

The alkyl sulfonate anion is preferably an alkyl sulfonate anion having 1 to 30 carbon atoms, more preferably an alkyl sulfonate anion having 1 to 20 carbon atoms.

The aryl group of the aryl sulfonate anion is preferably a phenyl group.

One or more substituents (excluding groups containing a fluorine atom) may be introduced in the counter anion. As particular examples of the substituents, there can be mentioned an alkyl group, a cycloalkyl group, an alkoxy group and an alkylthio group. The substituents are not particularly limited. An alkyl group is a preferred substituent. An alkyl group having 1 to 4 carbon atoms is a more preferred substituent.

As preferred examples of the nonfluorinated-acid generators, there can be mentioned the compounds of general formulae (ZI'), (ZII') and (ZIII') below.

$$R_{201}-\underset{\underset{R_{202}}{|}}{S^+}-R_{203} \quad Z'^- \tag{ZI'}$$

$$R_{204}-I^+-R_{205} \quad Z'^- \tag{ZII'}$$

$$R_{206}-\underset{\underset{O}{\overset{O}{\|}}}{S}-\underset{\underset{}{\overset{N_2}{\|}}}{C}-\underset{\underset{O}{\overset{O}{\|}}}{S}-R_{207} \tag{ZIII'}$$

In general formulae (ZI') and (ZII'), $R_{201}$ to $R_{205}$ are as defined above in connection with general formulae (ZI) and (ZII).

$Z'^-$ represents a nonnucleophilic anion not containing any fluorine atom. As this nonnucleophilic anion, there can be mentioned, for example, any of those described above as the counter anion of the onium cation of the nonfluorinated-acid generator.

In general formula (ZIII'), each of $R_{206}$ and $R_{207}$ represents an alkyl group, a cycloalkyl group or an aryl group. One or more substituents (excluding groups containing a fluorine atom) may further be introduced in these groups.

As the alkyl group, there can be mentioned a linear or branched alkyl group having 1 to 16 (preferably 1 to 10) carbon atoms.

As the cycloalkyl group, there can be mentioned a mono- or polycycloalkyl group having 6 to 20 (preferably 6 to 10) carbon atoms.

As the aryl group, there can be mentioned one having 6 to 20 (preferably 6 to 10) carbon atoms.

Preferred examples of the nonfluorinated-acid generators will be shown below, which in no way limit the scope of the present invention.

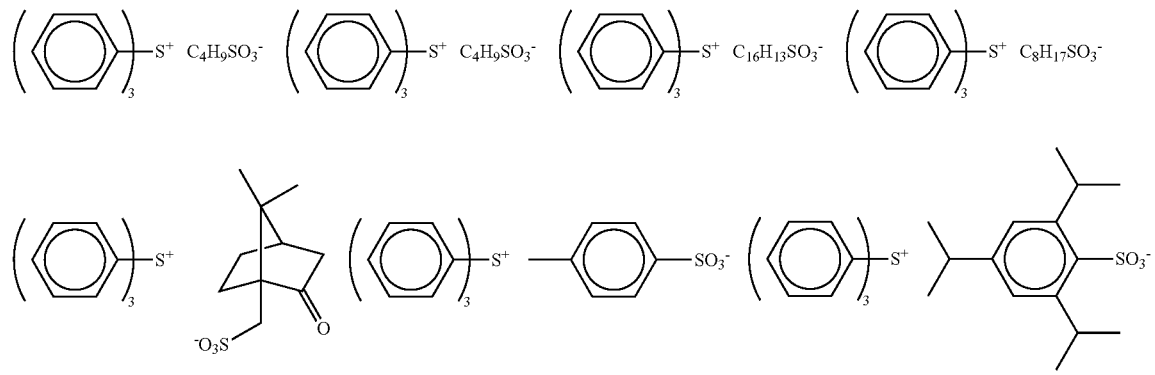

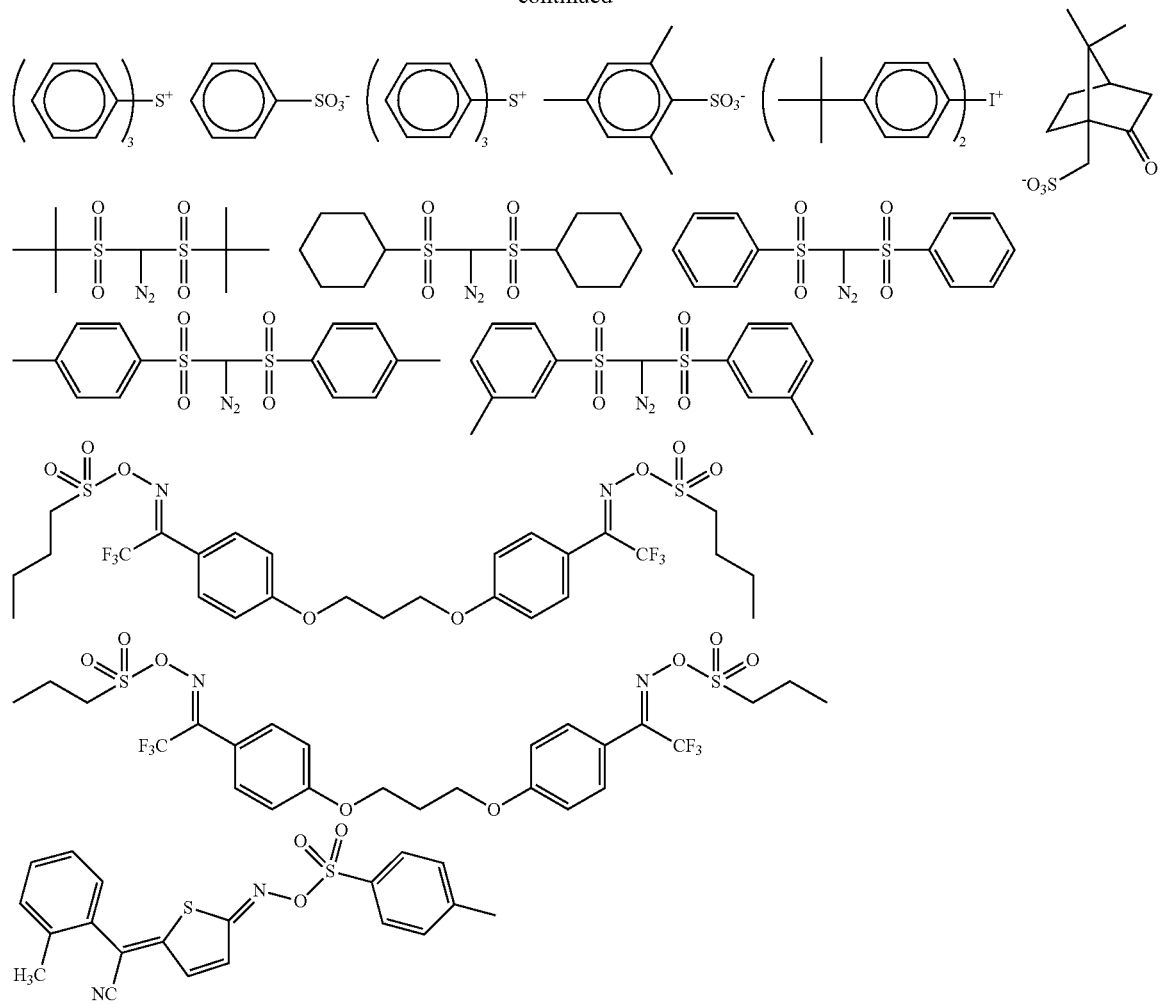

These nonfluorinated-acid generators may be used alone or in combination.

The content of nonfluorinated-acid generator based on the total solids of the composition is preferably in the range of 0.1 to 10.0 mass %, more preferably 0.5 to 5.0 mass %.

A single type of photoacid generator may be used alone, or two or more types of photoacid generators may be used in combination. When two or more types of photoacid generators are used in combination, it is preferred to combine compounds, which are capable of generating two types of organic acids being different from each other by two or more in the total number of atoms excluding a hydrogen atom, with each other. It is especially preferred to combine a fluorinated-acid generator as mentioned above with a nonfluorinated-acid generator as mentioned above. In another aspect, it is also preferred to combine a diazosulfone with a sulfonium salt. More particularly, there can be mentioned, for example, a combination of any of the photoacid generators of general formula (ZI) with any of the photoacid generators of general formula (ZIII') or a combination of any of the photoacid generators of general formula (ZI') with any of the photoacid generators of general formula (ZIII').

The content of acid generator based on the total solids of the composition is preferably in the range of 0.1 to 40 mass %, more preferably 0.5 to 30 mass %, and further preferably 1 to 20 mass %.

<Other Components>

The composition according to the present invention may further contain a surfactant, a dissolution inhibiting compound, a dye, a plasticizer, a photosensitizer, a compound capable of increasing the solubility in a developer, a compound having a functional group as a proton acceptor and a solvent.

(Surfactant)

Preferably, the composition according to the present invention further contains a surfactant. The surfactant is most preferably a fluorinated and/or siliconized surfactant.

As such a surfactant, there can be mentioned, for example, Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., or polysiloxane polymer KP-341 produced by Shin-Etsu Chemical Co., Ltd.

Surfactants other than these fluorinated and/or siliconized surfactants can also be used. In particular, the other surfactants include polyoxyethylene alkyl ethers, polyoxyethylene alkyl aryl ethers and the like.

Moreover, heretofore known surfactants can also be appropriately used. As useful surfactants, there can be mentioned, for example, those described in section [0273] et seq of US Patent Application Publication No. 2008/0248425 A1.

These surfactants may be used alone or in combination.

The amount of surfactant added is preferably in the range of 0.0001 to 2 mass %, more preferably 0.001 to 1 mass %, based on the total solids of the composition.

(Dissolution Inhibiting Compound of 3000 or Less Molecular Weight)

As the dissolution inhibiting compound of 3000 or less molecular weight (hereinafter simply called as "dissolution inhibiting compound"), an alicyclic or aliphatic compound having an acid-decomposable group, such as any of cholic acid derivatives having an acid-decomposable group described in Proceeding of SPIE, 2724, 355 (1996), and sugar derivatives such as those described in Japanese Patent No. 4025074 and 4025102, and JP-A-2005-010217 are preferably exemplified. The acid-decomposable group may be the same as described earlier.

The total amount of the dissolution inhibiting compound used based on the total solids of the composition is preferably in the range of 3 to 50 mass %, and more preferably 5 to 40 mass %.

Specific examples of the dissolution inhibiting compound will be shown below, which however in no way limit the present invention.

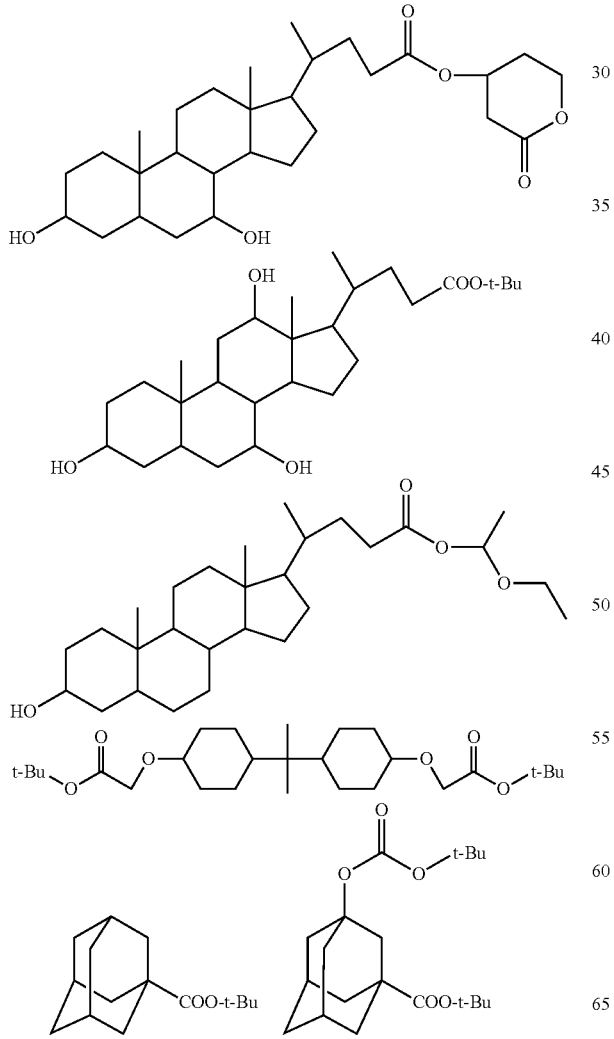

-continued

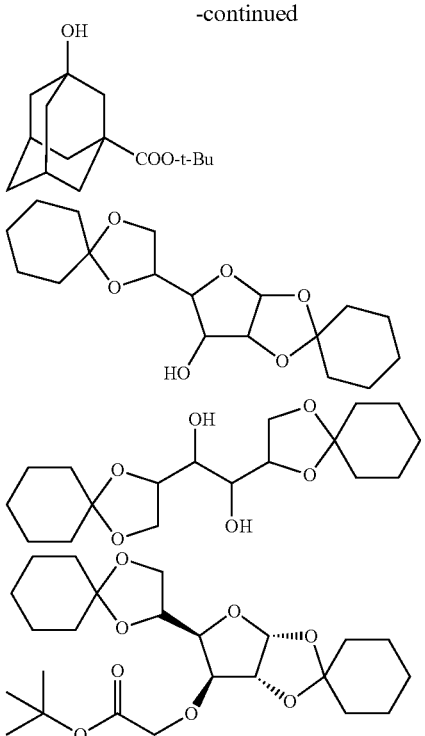

(Other Additives)

The composition according to the present invention may further contain a dye, a plasticizer, a photosensitizer, a light absorber, a compound capable of increasing the solubility in a developer (for example, a phenolic compound of 1000 or less molecular weight or a carboxylated alicyclic or aliphatic compound of 1000 or less molecular weight), etc. Still further, appropriate use can be made of compounds having a functional group as a proton acceptor described in, for example, JP-A's 2006-208781 and 2007-286574.

(Solvent)

The solvent that is usable in the preparation of the composition is not particularly limited as long as it can dissolve the components of the composition. For example, use can be made of an alkylene glycol monoalkyl ether carboxylate (propylene glycol monomethyl ether acetate or the like), an alkylene glycol monoalkyl ether (propylene glycol monomethyl ether or the like), an alkyl lactate (ethyl lactate, methyl lactate or the like), a cyclolactone (γ-butyrolactone or the like, preferably having 4 to 10 carbon atoms), a linear or cyclic ketone (2-heptanone, cyclohexanone or the like, preferably having 4 to 10 carbon atoms), an alkylene carbonate (ethylene carbonate, propylene carbonate or the like), an alkyl carboxylate (preferably an alkyl acetate such as butyl acetate), an alkyl alkoxyacetate (preferably ethyl ethoxypropionate) or the like. As other useful solvents, there can be mentioned, for example, those described in section [0244] et seq. of US 2008/0248425 A1 and the like.

Among the above solvents, an alkylene glycol monoalkyl ether carboxylate, an alkylene glycol monoalkyl ether, and ethyl lactate are especially preferred.

These solvents may be used alone or in combination. When two or more types of solvents are mixed together before use, it is preferred to mix a hydroxylated solvent with a non-hydroxylated solvent. The mass ratio of hydroxylated solvent to non-hydroxylated solvent is in the range of, for example, 1/99 to 99/1. The mass ratio is preferably 10/90 to 90/10, more preferably 20/80 to 60/40.

The hydroxylated solvent is preferably an alkylene glycol monoalkyl ether or an alkyl lactate. The non-hydroxylated solvent is preferably an alkylene glycol monoalkyl ether carboxylate.

The amount of solvent used is not particularly limited. However, it is generally so selected that the total solid concentration of the composition falls in the range of preferably 0.5 to 40 mass %, more preferably 1.0 to 30 mass %, further more preferably 2.0 to 25 mass % and most preferably 2.0 to 4.5 mass %.

<Method of Forming Pattern>

The composition according to the present invention is typically used in the following manner. In particular, the composition according to the present invention is typically applied onto a support, such as a substrate, thereby forming a film. The thickness of the film is preferably in the range of 0.02 to 10.0 μm. The method of application onto a substrate is preferably spin coating. The spin coating is performed at a rotating speed of preferably 1000 to 3000 rpm.

For example, the composition is applied onto, for example, any of substrates (e.g., silicon/silicon dioxide coating, silicon nitride and chromium-vapor-deposited quartz substrate, etc.) for use in the production of precision integrated circuit devices, etc. by appropriate application means, such as a spinner or a coater. The thus applied composition is dried, thereby forming an actinic-ray- or radiation-sensitive film (hereinafter also referred to as a photosensitive film). The application of the composition to the substrate can be preceded by the application of a heretofore known antireflection film.

The resultant photosensitive film is exposed to actinic rays or radiation, preferably baked (heated), and developed. A pattern of enhanced quality can be obtained by baking. From the viewpoint of sensitivity and stability, it is preferred for the baking temperature to be in the range of 80 to 150° C., especially 90 to 130° C.

As the actinic rays or radiation, there can be mentioned, for example, infrared light, visible light, ultraviolet light, far-ultraviolet light, X-rays or electron beams. It is preferred for the actinic rays or radiation to have, for example, a wavelength of 250 nm or shorter, especially 220 nm or shorter. As such actinic rays or radiation, there can be mentioned, for example, a KrF excimer laser (248 nm), an ArF excimer laser (193 nm), an $F_2$ excimer laser (157 nm), X-rays or electron beams. As especially preferred actinic rays or radiation, there can be mentioned an KrF excimer laser, X-rays or electron beams.

The exposure performed in the condition that the interstice between the photosensitive film and a lens is filled with a liquid (for example, pure water) whose refractive index is higher than that of air, namely, liquid-immersion exposure may be carried out in the stage of the exposure to actinic rays or radiation. This liquid-immersion exposure can enhance the resolution. At the liquid-immersion exposure, for the prevention of contact of the resist film with the immersion liquid, a film that is highly insoluble in the immersion liquid (also referred to as a "top coat") may be disposed on the resist film and between the resist film and the immersion liquid. As another means for the prevention of contact of the resist film with the immersion liquid, a hydrophobic resin (HR) may be added to the composition in advance. As the hydrophobic resin (HR), there can be mentioned, for example, resins described in Paragraphs 0172 to 0253 of US 2008/0305432 A1 or the like.

In the development step, an alkali developer is generally used.

As the alkali developer, use can be made of any of alkaline aqueous solutions containing, for example, an inorganic alkali compound such as sodium hydroxide, potassium hydroxide, sodium carbonate, sodium silicate, sodium metasilicate or aqueous ammonia; a primary amine such as ethylamine or n-propylamine; a secondary amine such as diethylamine or di-n-butylamine; a tertiary amine such as triethylamine or methyldiethylamine; an alcoholamine such as dimethylethanolamine or triethanolamine; a quaternary ammonium salt such as tetramethylammonium hydroxide or tetraethylammonium hydroxide; or a cycloamine such as pyrrole or piperidine.

Appropriate amounts of an alcohol and/or a surfactant may be added to the alkali developer.

The concentration of alkali developer is generally in the range of 0.1 to 20 mass %. The pH value of the alkali developer is generally in the range of 10.0 to 15.0.

With respect to the particulars of the process for fabricating an imprint mold using the composition according to the present invention, reference can be made to, for example, Japanese Patent No. 4109085, JP-A-2008-162101, "Fundamentals of nanoimprint and its technology development/application deployment—technology of nanoimprint substrate and its latest technology deployment" edited by Yoshihiko Hirai, published by Frontier Publishing, etc.

EXAMPLES

The present invention will be described in greater detail below by way of its examples. However, the gist of the present invention is in no way limited to these examples.

<Synthesis of Basic Compound>

The following basic compounds (C-1) to (C-12) were synthesized in the following manner. Further, the following compound (M-1) was provided as a basic compound usable in combination therewith. In addition, for control, the following comparative compounds (X-1) to (X-6) were provided.

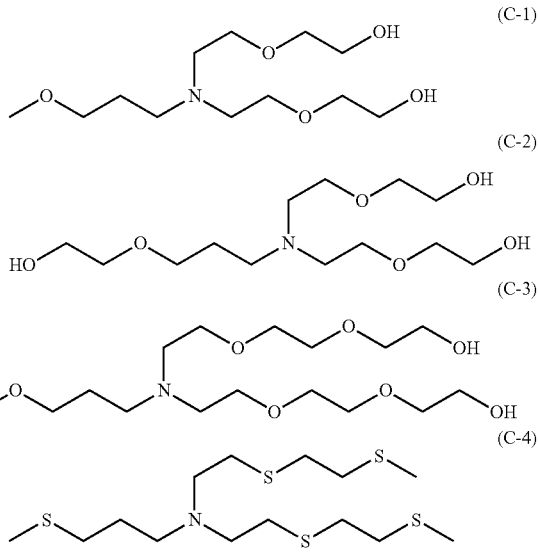

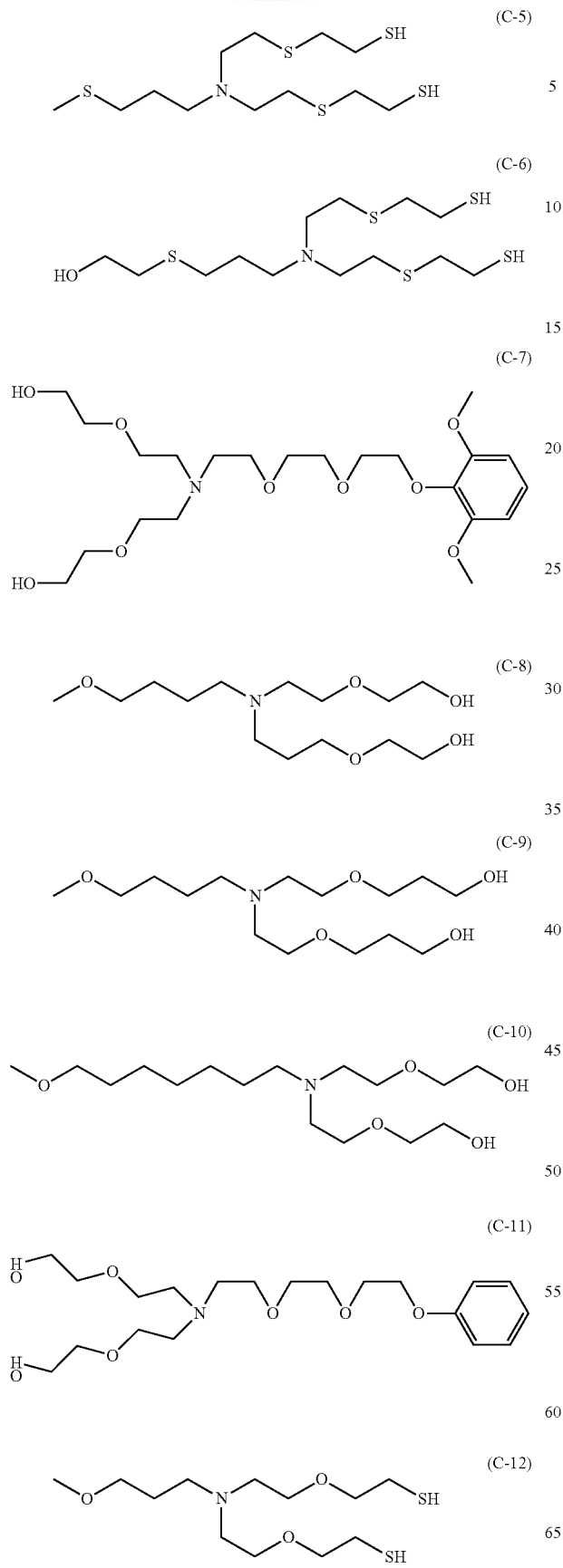
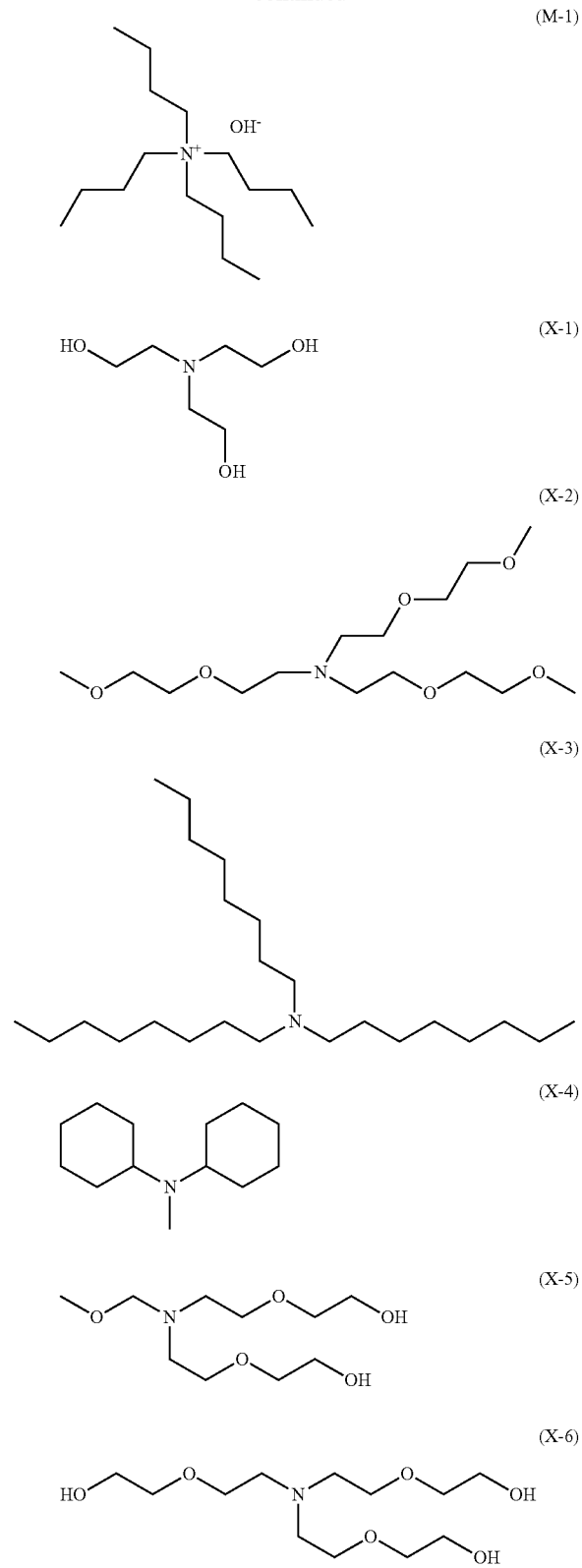
The correlations between these basic compounds (C-1) to (C-12) and various parameters of general formula (1) are as indicated in Table 1 below. In Table 1, "Me" represents a methyl group.

TABLE 1

| Basic Compound | n | t | l | m | o | p | q | r | s | $X_1$ | $X_2$ | $R_1$ | $R_2$ | $R_3$ |
|---|---|---|---|---|---|---|---|---|---|---|---|---|---|---|
| C-1 | 3 | 0 | 2 | 2 | 2 | 2 | — | 1 | 1 | O | O | H | H | Me |
| C-2 | 3 | 1 | 2 | 2 | 2 | 2 | 2 | 1 | 1 | O | O | H | H | H |
| C-3 | 3 | 0 | 2 | 2 | 2 | 2 | — | 2 | 2 | O | O | H | H | Me |
| C-4 | 3 | 0 | 2 | 2 | 2 | 2 | — | 1 | 1 | S | S | Me | Me | Me |
| C-5 | 3 | 0 | 2 | 2 | 2 | 2 | — | 1 | 1 | S | S | H | H | Me |
| C-6 | 3 | 1 | 2 | 2 | 2 | 2 | 2 | 1 | 1 | S | S, O | H | H | H |
| C-7 | 2 | 2 | 2 | 2 | 2 | 2 | 2 | 1 | 1 | O | O | H | H | 2,5-dimethoxy-phenyl group |
| C-8 | 4 | 0 | 3 | 2 | 2 | 2 | — | 1 | 1 | O | O | H | H | Me |
| C-9 | 4 | 0 | 2 | 2 | 3 | 3 | — | 1 | 1 | O | O | H | H | Me |
| C-10 | 7 | 0 | 2 | 2 | 2 | 2 | — | 1 | 1 | O | O | H | H | Me |
| C-11 | 2 | 2 | 2 | 2 | 2 | 2 | 2 | 1 | 1 | O | O | H | H | phenyl group |
| C-12 | 3 | 0 | 2 | 2 | 2 | 2 | — | 1 | 1 | O | S | H | H | Me |

Synthetic Example 1

Basic Compound (C-1)

First, 30.0 g (0.3365 mol) of 3-methoxypropylamine, 92.2 g (0.7404 mol) of ethylene glycol mono-2-chloroethyl ether and 107.1 g (1.01 mol) of sodium carbonate were added to 200 ml of toluene. Thereafter, the obtained reaction liquid was heated under reflux for 16 hours, and cooled. Precipitated salt was separated by filtration, and the toluene was distilled off in vacuum. Then, purification by silica gel chromatography was performed, thereby obtaining 38 g of basic compound (C-1) (yield: 43%).

(C-1) $^1$H-NMR (300 MHz, CDCl$_3$): δ 1.73-1.84 (m, 2H), 2.62-2.71 (m, 6H), 3.41 (t, 2H, 6.0 Hz), 3.33 (s, 3H), 3.58-3.80 (m, 12H).

Synthetic Example 2

Basic Compound (C-7)

First, 105.6 g (0.370 mol) of 2-(2-(2-(2,6-dimethoxyphenoxy)ethoxy)ethoxy)ethaneamine, 92.2 g (0.740 mol) of ethylene glycol mono-2-chloroethyl ether and 107.1 g (1.01 mol) of sodium carbonate were added to 200 ml of toluene. The mixture was heated under reflux for 16 hours, and cooled. Precipitated salt was separated by filtration, and the toluene was distilled off in vacuum. Thereafter, purification by silica gel chromatography was performed, thereby obtaining 50 g of basic compound (C-7) (yield: 29%).

Synthetic Example 3

Basic Compounds (C-2) to (C-6) and (C-8) to (C-12)

Basic compounds (C-2) to (C-6), (C-8) to (C-10) and (C-12) were synthesized in the same manner as in Synthetic Example 1 for the synthesis of basic compound (C-1). The basic compound (C-8) was synthesized from 2-(2-(4-methoxybutylamino))ethoxyethanol as a starting material. Basic compound (C-11) was synthesized in the same manner as in Synthetic Example 2 for the synthesis of basic compound (C-7).

<Synthesis of Acid-Decomposable Resin>

The following acid-decomposable resins (A-1) to (A-10) were synthesized in the manner to be described below.

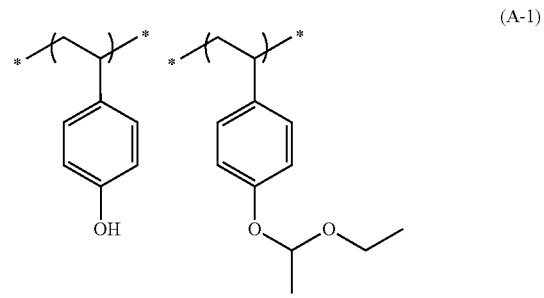

(A-1)

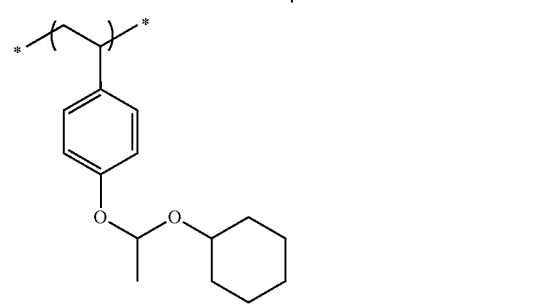

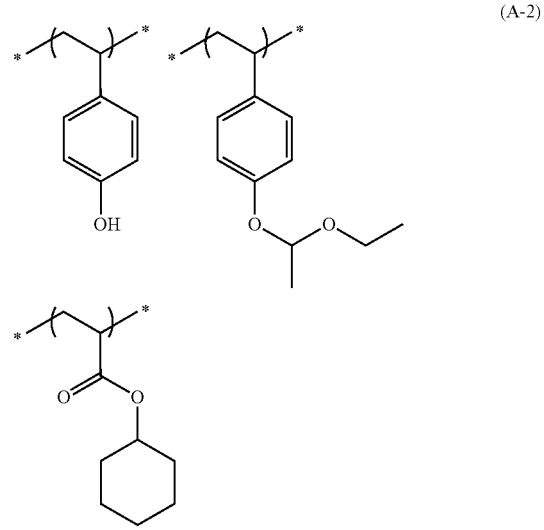

(A-2)

(A-3)
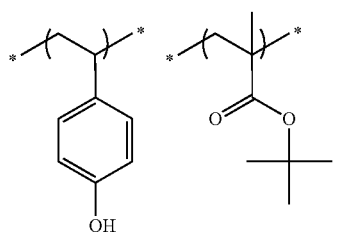
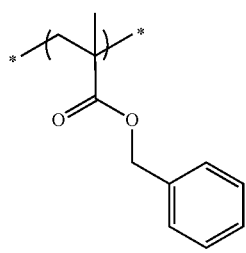
(A-4)
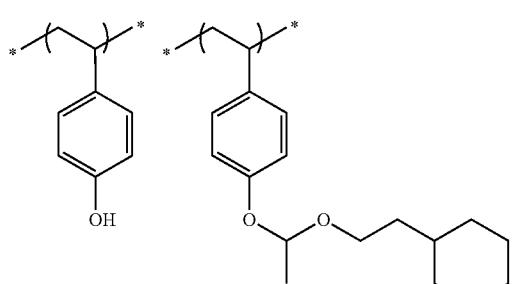
(A-5)
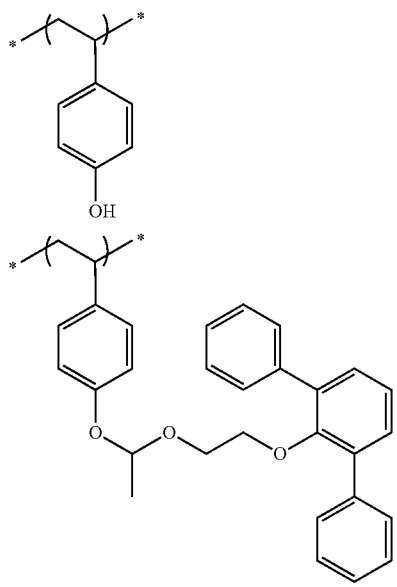
(A-6)
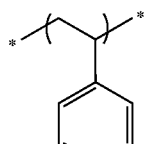
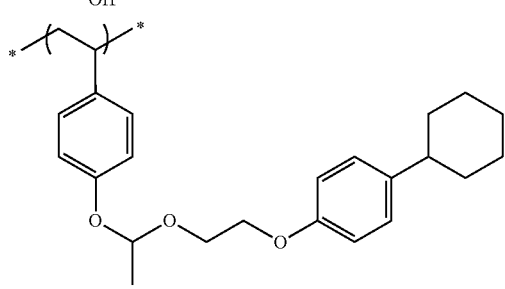
(A-7)
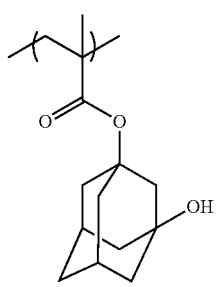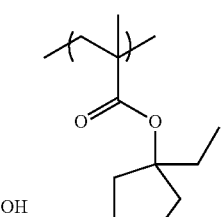
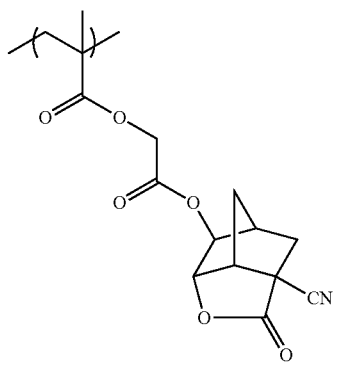
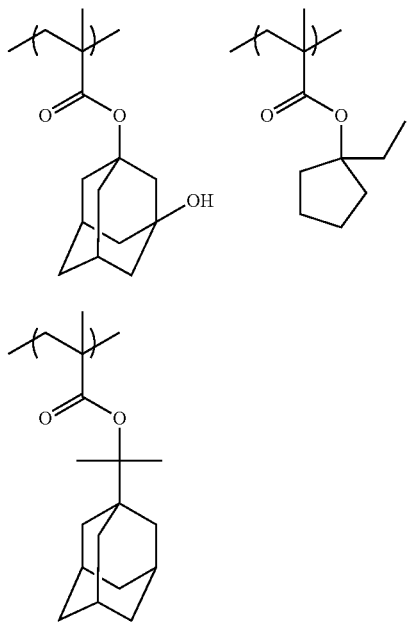

-continued (A-8)

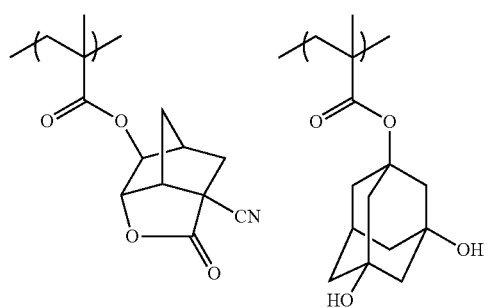

(A-9)

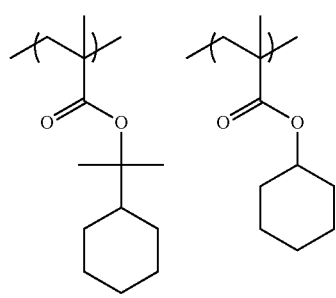

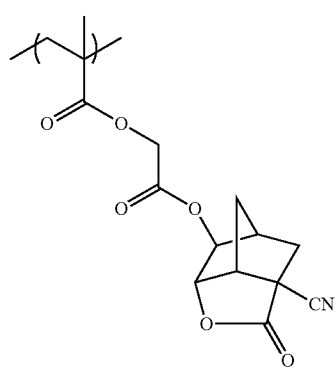

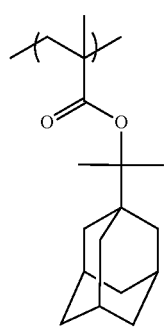

-continued (A-10)

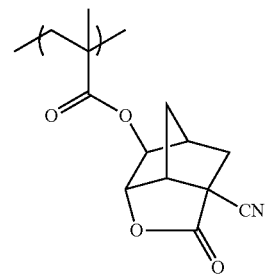

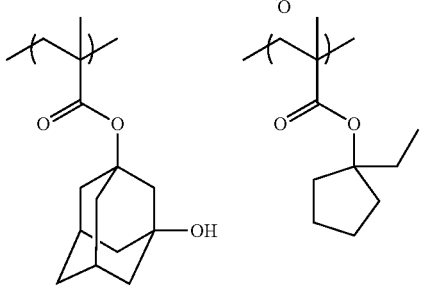

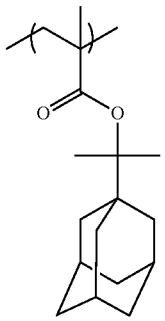

Synthetic Example 8

Resin (A-1)

First, 50 g of poly(p-hydroxystyrene) (produced by Nippon Soda Co., Ltd., molecular weight 15,000) was dissolved in 240 g of propylene glycol monomethyl ether acetate (PGMEA). The resultant solution was depressurized to 20 mmHg at 60° C., thereby distilling off about 40 g of PGMEA together with water remaining in the system. Subsequently, the mixture was cooled to 20° C., and 6.1 g of ethyl vinyl ether, 4.0 g of cyclohexyl vinyl ether and 0.02 g of p-toluenesulfonic acid were added thereto. The mixture was agitated at room temperature for an hour. Thereafter, 0.02 g of triethylamine was added, thereby neutralizing the mixture. Subsequently, using 240 g of ethyl acetate and 140 g of water, extraction was performed three times. Thus, resin (A-1) was obtained.

With respect to this resin (A-1), the molar ratio of individual repeating units was determined using $^1$H-NMR and $^{13}$C-NMR. Further, the weight average molecular weight (Mw) in terms of polystyrene molecular weight and the molecular weight dispersity (Mw/Mn) were determined using GPC (solvent: THF). The results are given in Table 2 below.

In Table 2, the column "component ratio" indicates the molar ratio of individual repeating units (corresponding to those shown in order from the left). The column "Mw" indicates the weight average molecular weight in terms of polystyrene molecular weight determined using GPC (solvent: THF). The column "MWD" indicates the molecular weight dispersity (Mw/Mn).

TABLE 2

| Resin | Component ratio | Mw | MWD |
|---|---|---|---|
| A-1 | 68/28/4 | 18,900 | 1.15 |
| A-2 | 70/20/10 | 17,500 | 1.50 |
| A-3 | 60/30/10 | 14,000 | 1.50 |
| A-4 | 70/30 | 11,000 | 1.16 |
| A-5 | 80/20 | 17,000 | 1.20 |
| A-6 | 75/25 | 17,500 | 1.17 |
| A-7 | 45/10/32.5/12.5 | 9,200 | 1.55 |
| A-8 | 40/10/40/10 | 9,500 | 1.45 |
| A-9 | 40/10/40/10 | 9,300 | 1.50 |
| A-10 | 20/20/10/35/15 | 9,200 | 1.47 |

Synthetic Example 9

Resins (A-4), (A-5) and (A-6)

Resins (A-4), (A-5) and (A-6) were synthesized in the same manner as in the synthesis of resin (A-1). These resins were evaluated in the same manner as in Synthetic Example 8. The results are given in Table 2 above.

Synthetic Example 10

Resin (A-2)

First, 176.3 g (1.0 mol) of p-tert-butoxystyrene and 16.2 g (0.105 mol) of cyclohexyl acrylate were dissolved in 250 ml of isopropanol. In a nitrogen stream, 2,2'-azobisisobutyronitrile was added to the solution, and agitated at 75° C. for six hours. The reaction liquid was cooled, and poured in 5000 ml of an aqueous solution of methanol, thereby precipitating a reaction product. The precipitated solid was collected by filtration, washed with methanol, and dried in vacuum. Thus, 172.5 g of poly(p-tert-butoxystyrene/cyclohexyl acrylate) was obtained as a white powdery crystal.

This copolymer was analyzed using $^1$H-NMR and $^{13}$C-NMR. As a result, it was found that the component ratio between p-tert-butoxystyrene units and cyclohexyl acrylate units of the copolymer was 90:10. Further, with respect to the copolymer, the weight average molecular weight (Mw) in terms of polystyrene molecular weight and the molecular weight dispersity (Mw/Mn) were determined using GPC (solvent: THF). As a result, it was found that the Mw was 20,600 and the Mw/Mn was 1.55.

Next, 130.5 g of poly(p-tert-butoxystyrene/cyclohexyl acrylate) was suspended in isopropanol. Subsequently, 30 ml of concentrated hydrochloric acid was added to the suspension, and agitated at 70 to 80° C. for four hours. The reaction liquid was cooled, and poured in 1500 ml of water, thereby precipitating a reaction product. The precipitated solid was collected by filtration, washed with water, and dried in vacuum. Thus, 85.5 g of poly(p-hydroxystyrene/cyclohexyl acrylate) was obtained as a white powdery crystal.

This copolymer was analyzed using $^1$H-NMR and $^{13}$C-NMR. As a result, it was found that the component ratio between p-hydroxystyrene units and cyclohexyl acrylate units of the copolymer was 90:10. Further, with respect to the copolymer, the weight average molecular weight (Mw) in terms of polystyrene molecular weight and the molecular weight dispersity (Mw/Mn) were determined using GPC (solvent: THF). As a result, it was found that the Mw was 14,800 and the Mw/Mn was 1.50.

Subsequently, 24.7 g of poly(p-hydroxystyrene/cyclohexyl acrylate) and 4.5 g of ethyl vinyl ether were dissolved in ethyl acetate. A catalytic amount of pyridinium p-toluenesulfonate was added to the solution, and agitated at room temperature for five hours. Thereafter, the reaction liquid was poured in 3000 ml of water, thereby precipitating a reaction product. The precipitated solid was collected by filtration, washed with water, and dried in vacuum. Thus, 26.1 g of resin (A-2) was obtained as a white powdery crystal.

The obtained resin (A-2) was evaluated in the same manner as in Synthetic Example 8. The results are given in Table 2 above.

Synthetic Example 11

Resin (A-3)

A 2-liter flask was charged with 600 g of ethylene glycol monoethyl ether acetate and flushed with nitrogen at a flow rate of 100 ml/min for an hour. Separately, 105.4 g (0.65 mol) of 4-acetoxystyrene, 35.6 g (0.25 mol) of t-butyl methacrylate, 17.6 g (0.10 mol) of benzyl methacrylate and 2.30 g (0.01 mol) of polymerization initiator (dimethyl 2,2'-azobis (2-methylpropionate): V601 produced by Wako Pure Chemical Industries, Ltd.) were dissolved in 200 g of ethylene glycol monoethyl ether acetate. The thus obtained monomer mixture solution was flushed with nitrogen in the same manner as above.

The 2-liter flask charged with 600 g of ethylene glycol monoethyl ether acetate was heated until the internal temperature of the flask became 80° C. Then, 2.30 g (0.01 mol) of polymerization initiator V-601 was added thereto and agitated for five minutes. Subsequently, the above monomer mixture solution was dropped into this solution over a period of six hours. After the completion of the dropping, the mixture was further heated and agitated for two hours. Thereafter, the reaction liquid was cooled to room temperature. After the cooling, the reaction liquid was dropped into three liters of hexane, thereby precipitating a polymer. The polymer solid was collected by filtration and dissolved in 500 g of acetone. This solution was dropped once more into three liters of hexane, and the thus obtained solid was collected by filtration and dried in vacuum. Thus, 151 g of poly(4-acetoxystyrene/t-butyl methacrylate/benzyl methacrylate) was obtained.

Next, 40.00 g of poly(4-acetoxystyrene/t-butyl methacrylate/benzyl methacrylate) was dissolved in 200 ml of THF. Thereafter, 5 ml of 2.38 mass % aqueous tetramethylammonium hydroxide solution was added to the solution, and agitated at room temperature for an hour. Subsequently, distilled water was added to the mixture, thereby precipitating a polymer. The precipitate was washed with distilled water, and dried in vacuum. The obtained polymer was dissolved in 100 ml of ethyl acetate, and hexane was added thereto, thereby once more precipitating a polymer. The polymer was dried in vacuum, thereby obtaining 35.5 g of resin (A-3).

The obtained resin (A-3) was evaluated in the same manner as in Synthetic Example 8. The results are given in Table 2 above.

Synthetic Example 12

Resin (A-7)

In a nitrogen stream, 78.1 g of cyclohexanone was placed in a three-necked flask, and heated at 80° C. Monomers of Table 2 above and a polymerization initiator were added thereto. Specifically, 18.3 g of monomer (1), 3.8 g of monomer (2), 5.5 g of monomer (3), 11.8 g of monomer (4) and 2.418 g of polymerization initiator (dimethyl 2,2'-azobis(2-methylpropionate): V601 produced by Wako Pure Chemical Industries, Ltd.) were dissolved in 145.0 g of cyclohexanone, and the solution was dropped into the heated cyclohexanone over a period of six hours. After the completion of the dropping, reaction was continued at 80° C. for two hours. The reaction liquid was allowed to cool, and dropped into a liquid mixture of heptane and ethyl acetate (1290 g and 551 g) over a period of 20 minutes, thereby precipitating a solid. The precipitated solid was collected by filtration, washed and dried. Thus, 35 g of resin (A-7) was obtained.

The obtained resin (A-7) was evaluated in the same manner as in Synthetic Example 8. The results are given in Table 2 above.

<Photoacid Generator>

As photoacid generators, use was made of the following compounds (B-1) to (B-6) and mixtures thereof.

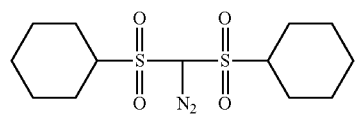 (B-1)

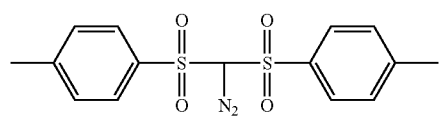 (B-2)

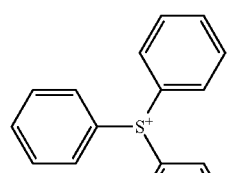 (B-3)

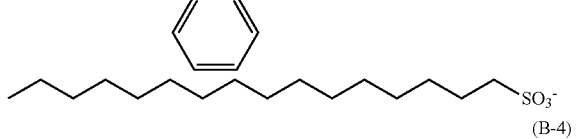 (B-4)

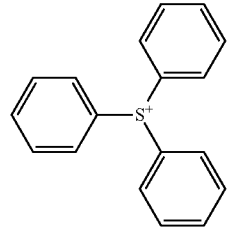
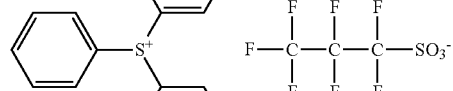

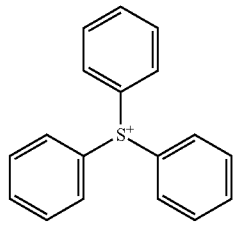 (B-5)

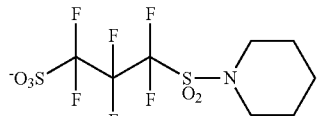 (B-6)

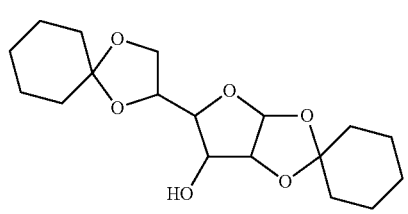 (B-6)

<Surfactant>

The following surfactants were used.

(W-1): Megafac F176 (produced by Dainippon Ink & Chemicals, Inc.) and (W-2): PF6320 (produced by OMNOVA SOLUTIONS, INC.).

<Solvent>

As solvents, use was made of PGMEA (propylene glycol monomethyl ether acetate), PGME (propylene glycol monomethyl ether), ethyl lactate and mixtures thereof.

<Dissolution Inhibiting Compound>

As dissolution inhibiting compounds, use was made of the following compounds (Y-1) to (Y-3).

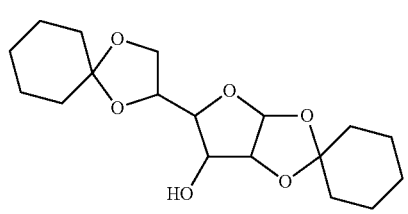 (Y-1)

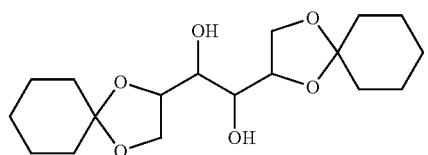 (Y-2)

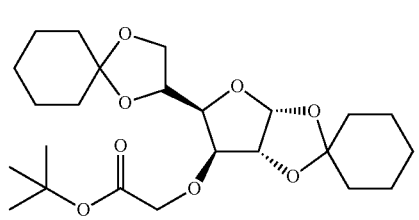 (Y-3)

Example A

KrF (Preparation of Resist Solution)

Components of Table 3 below were dissolved in solvents of the same table, thereby obtaining solutions of 14.5 mass % solid content. These solutions were passed through a polytetrafluoroethylene filter of 0.1 μm pore size, thereby obtaining positive resist solutions.

TABLE 3

| Ex. | Resin (mass %) | Acid generator (mass %) | Basic compound (mass %) | Surfactant (mass %) | Dissolution inhibiting compound (mass %) | Solvent (mol %) PGMEA | PGME | Ethyl lactate |
|---|---|---|---|---|---|---|---|---|
| 1 | A-2 (95.5) | B-1/B-2 (3.0/1.0) | C-1 (0.4) | W-2 (0.1) | — | 60 | 0 | 40 |
| 2 | A-2 (95.5) | B-1/B-3 (3.0/1.0) | C-2 (0.4) | W-2 (0.1) | — | 60 | 40 | 0 |
| 3 | A-1 (95.5) | B-1/B-2 (1.0/3.0) | C-1 (0.4) | W-2 (0.1) | — | 60 | 40 | 0 |
| 4 | A-6 (95.5) | B-1/B-2 (3.0/1.0) | C-3 (0.4) | W-2 (0.1) | — | 60 | 40 | 0 |
| 5 | A-5 (95.5) | B-1/B-3 (1.0/3.0) | C-1 (0.4) | W-2 (0.1) | — | 60 | 40 | 0 |
| 6 | A-3 (95.0) | B-1/B-4 (1.0/3.0) | C-1/C-13 (0.3/0.1) | W-2 (0.1) | Y-1 (0.5) | 60 | 40 | 0 |
| 7 | A-3 (95.0) | B-1/B-5 (3.0/1.0) | C-9 (0.4) | W-2 (0.1) | Y-2 (0.5) | 60 | 40 | 0 |
| 8 | A-3 (95.0) | B-6 (4.0) | C-11 (0.4) | W-2 (0.1) | Y-3 (0.5) | 60 | 0 | 40 |
| 9 | A-4 (95.5) | B-1/B-4 (1.0/3.0) | C-8 (0.4) | W-2 (0.1) | — | 60 | 0 | 40 |
| 10 | A-5 (95.5) | B-1/B-4 (3.0/1.0) | C-10 (0.4) | W-2 (0.1) | — | 60 | 0 | 40 |
| 11 | A-5 (95.5) | B-1/B-4 (3.0/1.0) | C-12 (0.4) | W-2 (0.1) | — | 60 | 0 | 40 |
| 12 | A-8 (95.5) | B-1/B-4 (3.0/1.0) | C-2 (0.4) | W-2 (0.1) | — | 60 | 40 | 0 |
| 13 | A-1 (95.5) | B-1/B-2 (1.0/3.0) | C-6 (0.4) | W-2 (0.1) | — | 60 | 40 | 0 |
| 14 | A-2 (95.5) | B-1/B-2 (3.0/1.0) | C-4 (0.4) | W-2 (0.1) | — | 60 | 0 | 40 |
| Comp. 1 | A-2 (95.5) | B-1/B-2 (1.0/3.0) | X-1 (0.4) | W-1 (0.1) | — | 60 | 0 | 40 |
| Comp. 2 | A-2 (95.5) | B-1/B-2 (1.0/3.0) | X-2 (0.4) | W-2 (0.1) | — | 60 | 0 | 40 |
| Comp. 3 | A-2 (95.5) | B-1/B-2 (1.0/3.0) | X-3 (0.4) | W-2 (0.1) | — | 60 | 0 | 40 |
| Comp. 4 | A-2 (95.5) | B-1/B-3 (1.0/3.0) | X-4 (0.4) | W-1 (0.1) | — | 60 | 40 | 0 |
| Comp. 5 | A-2 (95.5) | B-1/B-3 (1.0/3.0) | X-5 (0.4) | W-1 (0.1) | — | 60 | 40 | 0 |
| Comp. 6 | A-2 (95.5) | B-1/B-3 (1.0/3.0) | X-6 (0.4) | W-1 (0.1) | — | 60 | 40 | 0 |

(Evaluation of Resist)

Each of the above positive resist solutions was applied by means of a spin coater onto a silicon substrate having undergone a hexamethyldisilazane treatment, and baked at 90° C. for 90 seconds, thereby obtaining a resist film of 0.60 μm average thickness.

Each of the obtained resist films was patternwise exposed by means of a KrF excimer laser scanner (manufactured by ASML, PAS5500/850C, wavelength=248 nm, NA=0.60, Sigma=0.70). A binary mask was used as a rectile.

The exposed resist film was baked at 110° C. for 60 seconds. The baked film was dipped in a 2.38 mass % aqueous tetramethylammonium hydroxide (TMAH) solution for 60 seconds. After this development operation, the film was rinsed with pure water for 30 seconds and dried, thereby obtaining a line pattern.

[Sensitivity (Eopt)]

Each of the obtained patterns was observed by means of a scanning electron microscope (model S-8840 manufactured by Hitachi, Ltd.). The sensitivity (Eopt) was defined as the exposure amount in which a line of 180 nm width was resolved through a mask of 170 nm line size and line:space=1: 1.2.

[Dependence on Exposure Amount; Exposure Latitude (EL)]

The relationship between exposure amount and line width exhibited when the exposure amount was varied was determined in the same manner as above. On the basis of the same, the exposure amounts that caused the line width to become ±10% of the target 180 nm (namely, 162 nm and 198 nm) were determined. Then, the exposure latitude (EL) defined by the following formula was calculated. The greater the value of EL, the less the dependence on exposure amount and the higher the resolution.

[EL(%)]=[(exposure amount for 162 nm line width)−(exposure amount for 198 nm line width)]/Eopt.

[Roughness Characteristic: Line Width Roughness (LWR)]

The above line of 180 nm width was observed by means of a scanning electron microscope (model S-8840, manufactured by Hitachi, Ltd.). The distance between actual edge and a reference line on which edges were to be present was measured at 50 points of equal intervals within 20 µm in the longitudinal direction of the line. The standard deviation of measured distances was determined, and 3σ was computed therefrom. This 3σ was denoted as "LWR." The smaller the value of LWR, the more favorable the roughness characteristic.

[Focus Latitude (Depth of Focus DOF)]

The exposure amount was fixed at the above Eopt, and the relationship between focus shift and line width was investigated. On the basis of the same, the focus maximum value and minimum value that could cause the line width to fall within the range of ±10% of the target 180 nm (namely, the range of from 162 nm to 198 nm) were determined. The difference between the maximum value and the minimum value was calculated and denoted as "focus latitude (depth of focus DOF)."

[Pattern Configuration]

With respect to the above line of 180 nm width, the surface and cross section were observed by means of a scanning electron microscope (model S-8840, manufactured by Hitachi, Ltd.). The pattern configuration was evaluated on the following criteria.

5: the shape of the cross section was rectangular, no standing wave effect was observed, and there was no white portion of pattern edge;

4: the shape of the cross section was substantially rectangular, no standing wave effect was observed, and the width of white portion of pattern edge was up to 10 nm;

3: the shape of the cross section was substantially rectangular, a standing wave effect was partially observed, and the width of white portion of pattern edge was up to 10 nm;

2: the shape of the cross section was tapering, a standing wave effect was observed, and the width of white portion of pattern edge was 10 nm to less than 30 nm; and 1: the shape of the cross section was tapering, a standing wave effect was observed, and the width of white portion of pattern edge was 30 nm or greater.

[Iso/Dense Bias Characteristic; I-D Bias]

The exposure amount was fixed at the above Eopt, and exposure was carried out through a mask of 170 nm line size and line:space=1:10. The line width of obtained line pattern was measured, and the absolute value of the difference between the line width and 180 nm was calculated. The calculated value was denoted as "I-D Bias." The smaller the value of I-D Bias, the more favorable the iso/dense bias characteristic.

The obtained evaluation results are given in Table 4 below.

TABLE 4

| Ex. | Eopt (mJ/cm$^2$) | EL (%) | LWR (nm) | DOF (µm) | Pattern configuration | I-D Bias (nm) |
|---|---|---|---|---|---|---|
| 1 | 15 | 21 | 5 | 0.8 | 5 | 15 |
| 2 | 16 | 22 | 6 | 0.7 | 5 | 16 |
| 3 | 16 | 21 | 5 | 0.8 | 5 | 17 |
| 4 | 15 | 21 | 6 | 0.7 | 5 | 25 |
| 5 | 17 | 20 | 6 | 0.7 | 5 | 18 |
| 6 | 16 | 21 | 5 | 0.8 | 5 | 17 |
| 7 | 16 | 20 | 6 | 0.7 | 5 | 18 |
| 8 | 17 | 20 | 7 | 0.7 | 5 | 17 |
| 9 | 18 | 19 | 7 | 0.7 | 5 | 20 |
| 10 | 19 | 18 | 7 | 0.7 | 4 | 22 |
| 11 | 20 | 17 | 8 | 0.65 | 4 | 23 |
| 12 | 21 | 16 | 8 | 0.6 | 4 | 25 |
| 13 | 21 | 16 | 8 | 0.6 | 4 | 24 |
| 14 | 22 | 16 | 9 | 0.55 | 4 | 26 |

TABLE 4-continued

| Ex. | Eopt (mJ/cm$^2$) | EL (%) | LWR (nm) | DOF (µm) | Pattern configuration | I-D Bias (nm) |
|---|---|---|---|---|---|---|
| Comp. 1 | 26 | 14 | 9 | 0.5 | 3 | 31 |
| Comp. 2 | 27 | 14 | 9 | 0.5 | 3 | 30 |
| Comp. 3 | 28 | 13 | 12 | 0.3 | 2 | 32 |
| Comp. 4 | 30 | 11 | 15 | 0.1 | 1 | 40 |
| Comp. 5 | 18 | 15 | 7 | 0.6 | 5 | 40 |
| Comp. 6 | 28 | 13 | 7 | 0.5 | 4 | 40 |

As apparent from Table 4, the compositions of the Examples excelled in the sensitivity, dependence on exposure amount, roughness characteristic, focus latitude, pattern configuration and iso/dense bias characteristic.

Example B

EB (Preparation of Resist Solution)

Components of Table 3 above were dissolved in solvents of the same table, thereby obtaining solutions of 4.0 mass % solid content. The solutions were passed through a polytetrafluoroethylene filter of 0.1 µm pore size, thereby obtaining positive resist solutions.

(Evaluation of Resist)

Each of the above positive resist solutions was applied by means of a spin coater onto a silicon substrate having undergone a hexamethyldisilazane treatment, and baked at 100° C. for 90 seconds, thereby obtaining a resist film of 0.10 µm average thickness.

Each of the resist films was irradiated with electron beams by means of an electron beam lithography system (HL750 manufactured by Hitachi, Ltd., acceleration voltage 50 KeV). The irradiated film was baked at 110° C. for 60 seconds. The baked film was developed by dipping the same in a 2.38 mass % aqueous TMAH solution for 60 seconds. After the development, the film was rinsed with pure water for 30 seconds and dried. Thus, a line pattern was formed.

[Sensitivity (Eopt)]

Each of the obtained patterns was observed by means of a scanning electron microscope (model S-9260 manufactured by Hitachi, Ltd.). The sensitivity (Eopt) was defined as the exposure amount in which a line of 150 nm width (line:space=1:1) was resolved.

[Resolving Power]

At the resolution of a pattern of line:space=1:1 while fixing the exposure amount at the above Eopt, the minimum of resolvable line width was determined by means of a scanning electron microscope (model S-9260 manufactured by Hitachi, Ltd.). This minimum value was denoted as "resolving power."

[Roughness Characteristic; LWR]

The above line of 150 nm width was observed by means of a scanning electron microscope (model S-9260, manufactured by Hitachi, Ltd.). The distance between actual edge and a reference line on which edges were to be present was measured at 50 points of equal intervals within 2 µm in the longitudinal direction of the line. The standard deviation of measured distances was determined, and 3σ was computed therefrom. This 3σ was denoted as "LWR."

[I-D Bias]

Each of the obtained patterns was observed by means of a scanning electron microscope (model S-9260 manufactured by Hitachi, Ltd.). The exposure amount in which a line of 150 nm width (line:space=1:10) was resolved was denoted as "Eopt'." The difference between the above sensitivity Eopt and this Eopt' (Eopt–Eopt') was denoted as "I-D Bias." The smaller the value of I-D Bias, the more favorable the iso/dense bias characteristic.

The obtained evaluation results are given in Table 5 below.

TABLE 5

| Ex. | Sensitivity (μC/cm$^2$) | Resolving Power (nm) | LWR (nm) | I-D Bias (μC/cm$^2$) |
|---|---|---|---|---|
| 1 | 5 | 30 | 3 | 2 |
| 2 | 7 | 30 | 3 | 3 |
| 3 | 8 | 35 | 3 | 4 |
| 4 | 10 | 35 | 3 | 5 |
| 5 | 5 | 30 | 4 | 3 |
| 6 | 7 | 35 | 3 | 3 |
| 7 | 13 | 30 | 3 | 6 |
| 8 | 10 | 35 | 3 | 5 |
| 9 | 15 | 35 | 3 | 7 |
| 10 | 17 | 35 | 4 | 8 |
| 11 | 20 | 35 | 4 | 10 |
| 12 | 22 | 40 | 5 | 11 |
| 13 | 23 | 40 | 5 | 12 |
| 14 | 25 | 45 | 6 | 13 |
| Comp. 1 | 50 | 100 | 10 | 25 |
| Comp. 2 | 50 | 105 | 9 | 25 |
| Comp. 3 | 40 | 90 | 10 | 20 |
| Comp. 4 | 51 | 110 | 9 | 25 |
| Comp. 5 | 15 | 35 | 4 | 15 |
| Comp. 6 | 20 | 40 | 4 | 15 |

As apparent from Table 5, the compositions of the Examples excelled in the sensitivity, resolving power, roughness characteristic and iso/dense bias characteristic.

Example C

EUV (Preparation of Resist Solution)
Components of Table 3 above were dissolved in solvents of the same table, thereby obtaining solutions of 5.0 mass % solid content. The solutions were passed through a polytetrafluoroethylene filter of 0.1 μm pore size, thereby obtaining positive resist solutions.

(Evaluation of Resist)
Each of the above positive resist solutions was applied onto a silicon substrate having undergone a hexamethyldisilazane treatment by means of a spin coater, and baked at 100° C. for 90 seconds, thereby obtaining a resist film of 0.10 μm average thickness.

Each of the resist films was exposed to EUV light by means of an EUV exposure apparatus (EUVES, manufactured by Lithotrack Japan, wavelength: 13 nm). The exposed resist film was baked at 110° C. for 60 seconds. The baked film was developed by dipping the same in a 2.38 mass % aqueous TMAH solution for 60 seconds.

[Sensitivity and Resolving Power]
The exposure to EUV light was carried out while changing the exposure amount 0.5 by 0.5 mJ/cm$^2$ within the range of from 0 to 20.0 mJ/cm$^2$. The rate of dissolution of the resist film into the developer was measured with respect to each of the exposure amounts. Thus, a dissolution rate curve showing the relationship between exposure amount and dissolution rate was obtained. The "sensitivity" was defined as the exposure amount in which the dissolution rate was saturated on the dissolution rate curve. The γ-value was determined from the gradient of the straight line portion of the dissolution rate curve. The larger the γ-value, the more favorable the dissolution contrast.

The obtained evaluation results are given in Table 6 below.

TABLE 6

| Ex. | Sensitivity (mJ/cm$^2$) | γ |
|---|---|---|
| 1 | 3.2 | 7.0 |
| 2 | 3.0 | 7.1 |
| 3 | 3.3 | 6.8 |
| 4 | 3.5 | 7.2 |
| 5 | 3.5 | 7.1 |
| 6 | 3.4 | 7.0 |
| 7 | 3.8 | 7.0 |
| 8 | 3.7 | 6.9 |
| 9 | 4.0 | 6.5 |
| 10 | 4.2 | 6.3 |
| 11 | 4.2 | 6.0 |
| 12 | 4.5 | 5.9 |
| 13 | 4.4 | 5.8 |
| 14 | 5.0 | 5.7 |
| Comp. 1 | 11.0 | 3.0 |
| Comp. 2 | 12.0 | 3.0 |
| Comp. 3 | 13.0 | 3.2 |
| Comp. 4 | 10.5 | 4.2 |
| Comp. 5 | 4.5 | 6.5 |
| Comp. 6 | 7.0 | 5.5 |

As apparent from Table 6, the compositions of the Examples excelled in the sensitivity and resolving power.

Example D

ArF (Preparation of Resist Solution)
Components of Table 7 below were dissolved in solvents of the same table, thereby obtaining solutions of 5.0 mass % solid content. The solutions were passed through a polytetrafluoroethylene filter of 0.03 μm pore size, thereby obtaining positive resist solutions.

TABLE 7

| | | Acid | Basic | | Solvent (mol %) | | |
|---|---|---|---|---|---|---|---|
| Ex. | Resin (mass %) | generator (mass %) | compound (mass %) | Surfactant (mass %) | PGMEA | PGME | Ethyl lactate |
| 15 | A-7 (95.5) | B-4 (4.0) | C-1 (0.4) | W-2 (0.1) | 60 | 0 | 40 |
| 16 | A-8 (95.5) | B-1/B-4 (3.0/1.0) | C-2 (0.4) | W-2 (0.1) | 60 | 40 | 0 |
| 17 | A-9 (95.5) | B-4 (4.0) | C-3 (0.4) | W-2 (0.1) | 60 | 40 | 0 |
| 18 | A-10 (95.5) | B-5 (4.0) | C-7 (0.4) | W-2 (0.1) | 60 | 40 | 0 |
| 19 | A-9 (95.5) | B-6 (4.0) | C-9 (0.4) | W-2 (0.1) | 60 | 40 | 0 |

TABLE 7-continued

| Ex. | Resin (mass %) | Acid generator (mass %) | Basic compound (mass %) | Surfactant (mass %) | Solvent (mol %) | | |
|---|---|---|---|---|---|---|---|
| | | | | | PGMEA | PGME | Ethyl lactate |
| 20 | A-10 (95.5) | B-1/B-4 (1.0/3.0) | C-11 (0.4) | W-2 (0.1) | 60 | 40 | 0 |
| 21 | A-7 (95.5) | B-4 (4.0) | C-1/C-13 (0.3/0.1) | W-2 (0.1) | 60 | 0 | 40 |
| 22 | A-8 (95.5) | B-1/B-4 (3.0/1.0) | C-8 (0.4) | W-2 (0.1) | 60 | 40 | 0 |
| 23 | A-9 (95.5) | B-4 (4.0) | C-10 (0.4) | W-2 (0.1) | 60 | 40 | 0 |
| 24 | A-10 (95.5) | B-5 (4.0) | C-12 (0.4) | W-2 (0.1) | 60 | 40 | 0 |
| 25 | A-9 (95.5) | B-6 (4.0) | C-5 (0.4) | W-2 (0.1) | 60 | 40 | 0 |
| 26 | A-10 (95.5) | B-1/B-4 (1.0/3.0) | C-6 (0.4) | W-2 (0.1) | 60 | 40 | 0 |
| 27 | A-9 (95.5) | B-6 (4.0) | C-4 (0.4) | W-2 (0.1) | 60 | 40 | 0 |
| Comp. 7 | A-7 (95.5) | B-4 (4.0) | X-1 (0.4) | W-2 (0.1) | 60 | 0 | 40 |
| Comp. 8 | A-7 (95.5) | B-4 (4.0) | X-2 (0.4) | W-2 (0.1) | 60 | 0 | 40 |
| Comp. 9 | A-10 (95.5) | B-5 (4.0) | X-3 (0.4) | W-2 (0.1) | 60 | 0 | 40 |
| Comp. 10 | A-7 (95.5) | B-5 (4.0) | X-4 (0.4) | W-1 (0.1) | 60 | 40 | 0 |
| Comp. 11 | A-7 (95.5) | B-5 (4.0) | X-5 (0.4) | W-1 (0.1) | 60 | 40 | 0 |
| Comp. 12 | A-7 (95.5) | B-5 (4.0) | X-6 (0.4) | W-1 (0.1) | 60 | 40 | 0 |

(Evaluation of Resist)

A coating agent for organic antireflection film ARC29A (produced by Nissan Chemical Industries, Ltd.) was applied onto a silicon wafer and baked at 205° C. for 60 seconds. Thus, a 78 nm-thick antireflection film was formed.

Each of the prepared positive resist compositions was applied onto the antireflection film, and baked at 130° C. for 60 seconds. Thus, a resist film of 0.12 μm average thickness was obtained.

Each of the resultant resist films was patternwise exposed by means of an ArF excimer laser scanner (manufactured by ASML, PAS5500/1100, NA=0.75). A 6% half-tone mask of line size=75 nm and line:space=1:1 was used as a rectile.

Each of the exposed resist films was baked at 90° C. for 60 seconds. The baked film was developed by dipping the same in a 2.38 mass % aqueous TMAH solution for 30 seconds. After the development, the film was rinsed with pure water and spin dried, thereby obtaining a resist pattern.

[Sensitivity (Eopt)]

Each of the obtained patterns was observed by means of a scanning electron microscope (model S-9260 manufactured by Hitachi, Ltd.). The sensitivity (Eopt) was defined as the exposure amount in which a line of 75 nm width was resolved through a mask of 75 nm line size and line:space=1:1.

[Dependence on Exposure Amount; Exposure Latitude (EL)]

The relationship between exposure amount and line width exhibited when the exposure amount was varied was determined in the same manner as above. On the basis of the same, the exposure amounts that caused the line width to become ±10% of the target 75 nm (namely, 67.5 nm and 82.5 nm) were determined. Then, the exposure latitude (EL) defined by the following formula was calculated.

[EL(%)]=[(exposure amount for 67.5 nm line width)−(exposure amount for 82.5 nm line width)]/Eopt.

[Roughness Characteristic; LWR]

The above line of 75 nm width was observed by means of a scanning electron microscope (model S-9260, manufactured by Hitachi, Ltd.). The distance between actual edge and a reference line on which edges were to be present was measured at 50 points of equal intervals within 2 μm in the longitudinal direction of the line. The standard deviation of measured distances was determined, and 3σ was computed therefrom. This 3σ was denoted as "LWR."

[Iso/Dense Bias Characteristic; I-D Bias]

The exposure amount was fixed at the above Eopt, and exposure was carried out through a mask of 75 nm line size and line:space=1:10. The line width of obtained line pattern was measured, and the absolute value of the difference between the line width and 75 nm was calculated. The calculated value was denoted as "I-D Bias." The smaller the value of I-D Bias, the more favorable the iso/dense bias characteristic.

The obtained evaluation results are given in Table 8 below

TABLE 8

| Ex. | Eopt (mJ/cm$^2$) | EL (%) | LWR (nm) | I-D Bias (nm) |
|---|---|---|---|---|
| 15 | 25 | 15 | 3 | 20 |
| 16 | 23 | 14 | 3 | 18 |
| 17 | 24 | 14 | 4 | 19 |
| 18 | 25 | 14 | 3 | 21 |
| 19 | 23 | 15 | 4 | 17 |
| 20 | 25 | 15 | 4 | 19 |
| 21 | 24 | 16 | 3 | 21 |
| 22 | 26 | 13 | 4 | 23 |
| 23 | 28 | 13 | 5 | 25 |
| 24 | 29 | 12 | 5 | 28 |
| 25 | 30 | 11 | 6 | 30 |
| 26 | 30 | 11 | 6 | 32 |
| 27 | 32 | 11 | 7 | 35 |

TABLE 8-continued

| Ex. | Eopt (mJ/cm²) | EL (%) | LWR (nm) | I-D Bias (nm) |
|---|---|---|---|---|
| Comp. 7 | 40 | 7 | 9 | 45 |
| Comp. 8 | 41 | 6 | 9 | 40 |
| Comp. 9 | 39 | 9 | 10 | 50 |
| Comp. 10 | 37 | 6 | 9 | 45 |
| Comp. 11 | 25 | 15 | 4 | 50 |
| Comp. 12 | 27 | 13 | 3 | 55 |

As apparent from Table 8, the compositions of the Examples excelled in the sensitivity, resolving power, roughness characteristic and iso/dense bias characteristic.

Example E

ArF Liquid Immersion

Preparation of Resist Solution

Example 28

A positive resist solution was prepared in the same manner as in Example 15 except that 0.10 g of the following polymer was further added.

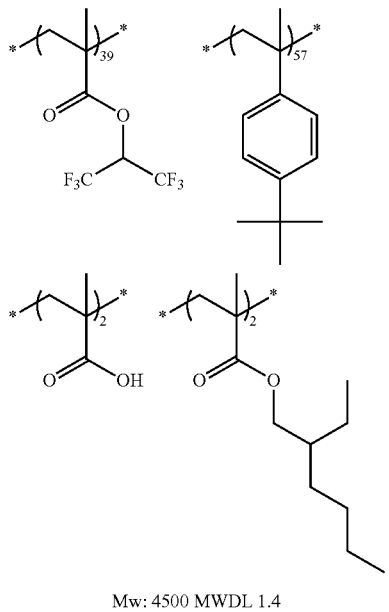

Mw: 4500 MWDL 1.4

Example 29

A positive resist solution was prepared in the same manner as in Example 15 except that 0.10 g of the following polymer was further added.

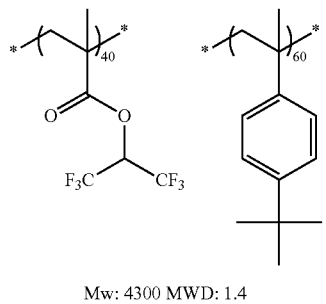

Mw: 4300 MWD: 1.4

(Evaluation of Resist)

Resist films were formed in the same manner as in Example D except that the resist solutions of Examples 28 and 29 were used.

Each of the resist films was patternwise exposed by means of an ArF excimer laser liquid immersion stepper (XT1700i manufactured by ASML, NA=1.20). Pure was used as the immersion liquid. Thereafter, line patterns were formed in the same manner as in Example D. Further, the sensitivity, exposure latitude and LWR were measured in the same manner as in Example D.

Consequently, it was ascertained that in both of Examples 28 and 29, the same excellent results as in Example 15 were attained. Namely, it has become apparent that the compositions of these Examples can be appropriately used in the pattern formation through ArF liquid immersion exposure.

What is claimed is:
1. An actinic-ray- or radiation-sensitive resin composition comprising:
a resin that is decomposed when acted on by an acid to thereby increase its solubility in an alkali developer,
a compound that generates an acid when exposed to actinic rays or radiation, and
any of basic compound of general formula (1) below,

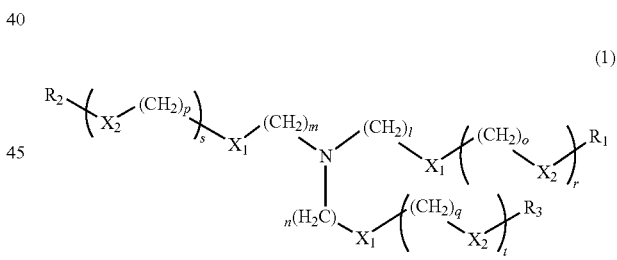

(1)

in which
each of l, m, o, p and q independently is an integer of 1 or greater,
n is an integer of 3 or greater,
each of r and s independently is an integer of 1 or greater,
t is an integer of 0 or greater,
each of —$X_1$— and —$X_2$— independently represents —O—, —S— or —CO—,
each of $R_1$ and $R_2$ independently represents a hydrogen atom, an alkyl group, an aryl group or an aralkyl group, and
$R_3$ represents a hydrogen atom, an alkyl group, an aryl group or an aralkyl group and t is 1 or greater; and represents an alkyl group, an aryl group or an aralkyl group when t is 0.
2. The composition according to claim 1, wherein $R_1$ and $R_2$ are hydrogen atoms.

3. The composition according to claim 2, wherein —X$_1$— is —O—.

4. The composition according to claim 3, wherein —X$_2$— is —O—.

5. The composition according to claim 1, wherein the acid generated by the compound is sulfonic acid.

6. The composition according to claim 5, wherein the compound that generates the acid is at least one of a diazosulfone compound and a sulfonium salt.

7. The composition according to claim 1, wherein the resin contains a repeating unit containing hydroxystyrene.

8. A resist film formed by the composition according to claim 1.

9. A method of forming a pattern, comprising:
forming the composition according to claim 1 into a film, exposing the film, and
developing the exposed film.

10. An actinic-ray- or radiation-sensitive resin composition comprising:
a resin that is decomposed when acted on by an acid to thereby increase its solubility in an alkali developer,
a compound that generates an acid when exposed to actinic rays or radiation, and
any of basic compounds of general formula (1) below,

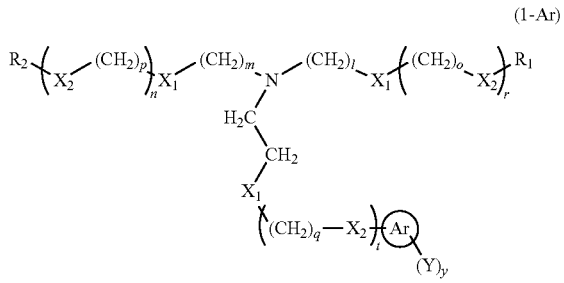

(1-Ar)

in which,
each of l, m, o, p and q independently is an integer of 1 or greater,
n is 2,
each of r and s independently is an integer of 1 or greater,
t is an integer of 0 or greater,
each of —X$_1$— and —X$_2$— independently represents —O—, —S— or —CO—,
each of R$_1$ and R$_2$ independently represents a hydrogen atom, an alkyl group, an aryl group or an aralkyl group,
Ar represents an aryl group or an aralkyl group,
Y represents a monovalent substituent, provided that when y is 2 or greater, two or more Ys may be identical to or different from each other, and provided that at least two of these two or more Ys may be bonded to each other to thereby form a ring, and
y is an integer of 0 to 5.

11. The composition according to claim 10, wherein R$_1$ and R$_2$ are hydrogen atoms.

12. A resist film formed by the composition according to claim 10.

13. A method of forming a pattern, comprising:
forming the composition according to claim 10 into a film, exposing the film, and
developing the exposed film.

14. The composition according to claim 1, wherein t is 0.

15. The composition according to claim 1, wherein t is 0 and R$_3$ is an alkyl group.

16. The composition according to claim 1, wherein the basic compound of general formula (1) is a compound selected from the following compounds C-1, C-3, C-8, C-9 and C-10:

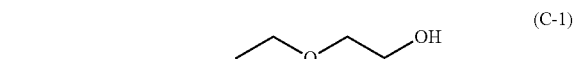

(C-1)

(C-3)

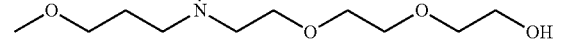

(C-8)

(C-9)

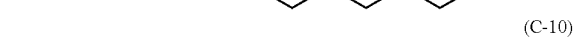

(C-10)

17. The composition according to claim 1, wherein the content of basic compounds of general formula (1) based on the total solids of the composition is 0.1 to 4.0 mass %.

18. The composition according to claim 1, wherein the resin contains a repeating unit containing hydroxystyrene and further comprises a repeating unit represented by general formula (1A):

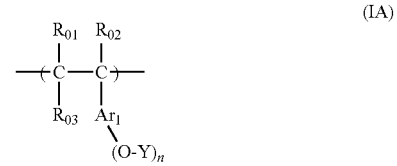

(IA)

in the formula, each of R$_{01}$ and R$_{02}$ independently represents a hydrogen atom, an alkyl group, a cycloalkyl group, a halogen atom, a cyano group or an alkoxycarbonyl group;
R$_{03}$ either represents a hydrogen atom, an alkyl group, a cycloalkyl group, a halogen atom, a cyano group or an alkoxycarbonyl group, or is bonded to Ar$_1$ to thereby form a ring structure, wherein A$_1$ represents an aromatic ring group;
each of n Y's independently represents a hydrogen atom or a group that is cleaved by the action of an acid, provided that at least one of Y's is a group that is cleaved by the action of an acid; and
n is an integer of 1 to 4.

* * * * *